US010074651B2

United States Patent
Watanabe et al.

(10) Patent No.: US 10,074,651 B2
(45) Date of Patent: Sep. 11, 2018

(54) SEMICONDUCTOR DEVICE HAVING TRANSISTORS FORMED BY DOUBLE PATTERNING AND MANUFACTURING METHOD THEREFOR

(71) Applicant: Renesas Electronics Corporation, Kawasaki-shi, Kanagawa (JP)

(72) Inventors: Tetsuya Watanabe, Kanagawa (JP); Nobuhiro Tsuda, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/808,006

(22) Filed: Jul. 24, 2015

(65) Prior Publication Data

US 2016/0043080 A1 Feb. 11, 2016

(30) Foreign Application Priority Data

Aug. 8, 2014 (JP) .................................. 2014-162684

(51) Int. Cl.
*H01L 27/088* (2006.01)
*H01L 27/02* (2006.01)
*H01L 21/8234* (2006.01)

(52) U.S. Cl.
CPC .. *H01L 27/0886* (2013.01); *H01L 21/823437* (2013.01); *H01L 27/0207* (2013.01); *H01L 27/088* (2013.01); *H01L 21/823431* (2013.01)

(58) Field of Classification Search
None
See application file for complete search history.

(56) References Cited

U.S. PATENT DOCUMENTS

| | | | |
|---|---|---|---|
| 8,397,182 B2 | 3/2013 | Nagahara | |
| 8,525,552 B2 | 9/2013 | Ando et al. | |
| 2008/0283925 A1* | 11/2008 | Berthold | H01L 27/1211 257/368 |
| 2009/0061362 A1 | 3/2009 | Taoka et al. | |
| 2009/0298205 A1* | 12/2009 | Nagahara | G03F 1/36 438/14 |

(Continued)

FOREIGN PATENT DOCUMENTS

| | | |
|---|---|---|
| JP | 2009-294308 A | 12/2009 |
| JP | 2012-074755 A | 4/2012 |
| JP | 201330602 A | 2/2013 |

OTHER PUBLICATIONS http://www.mentorg.co.jp/news_and_views/ic/2012/spring.html, 2012.

(Continued)

*Primary Examiner* — Daniel Whalen
(74) *Attorney, Agent, or Firm* — Sughrue Mion, PLLC

(57) ABSTRACT

A semiconductor device is provided which suppresses variations in transistor characteristics such as a source-drain diffusion capacitance. A first transistor TRA is formed in a first element forming area EFA as a divided transistor. A second transistor TRB is formed in a second element forming area EFB as another divided transistor. The first element forming area EFA and the second element forming area EFB are set to the same size. The first element forming area EFA and the second element forming area EFB are arranged deviated from each other in an X direction by a length SPL corresponding to the minimum pitch PT of a gate wiring GH.

13 Claims, 67 Drawing Sheets

(56) References Cited

U.S. PATENT DOCUMENTS

2013/0027083 A1* 1/2013 Ando .................. H01L 27/0207
326/102

OTHER PUBLICATIONS http://www.mentorg.co.jp/news_and_views/ic/2012/spring2.html 2012.
<http://eetimes.jp/ee/articles/1111/29/news021.html>, Nov. 28, 2011, EE Times Japan.
Communication dated Apr. 3, 2018, from Japanese Patent Office in counterpart application No. 2014-162684.

* cited by examiner

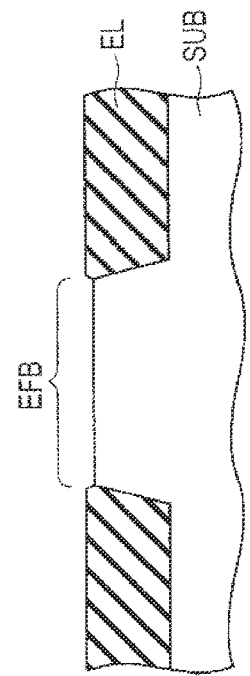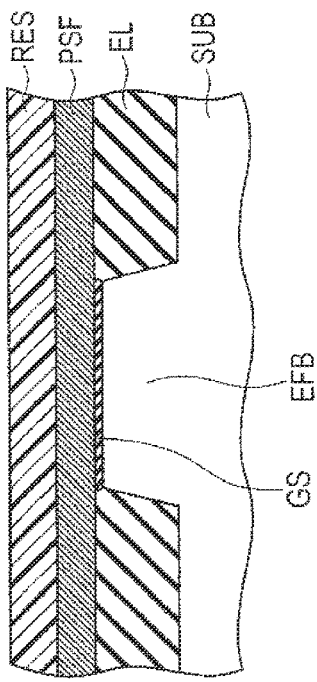
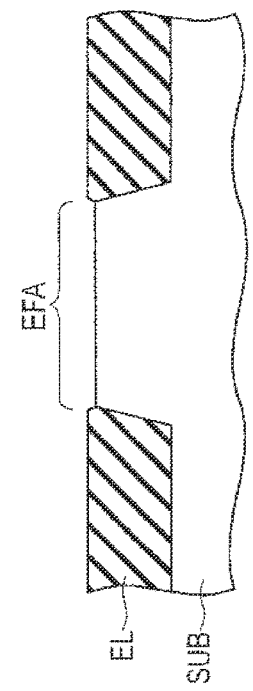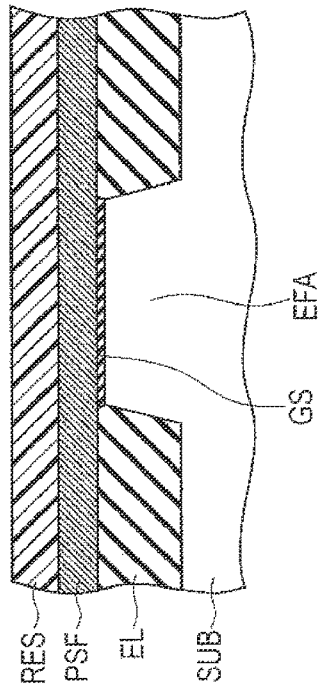

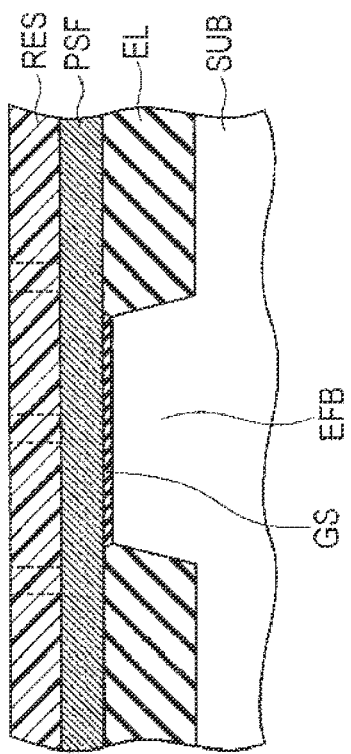
FIG. 7A
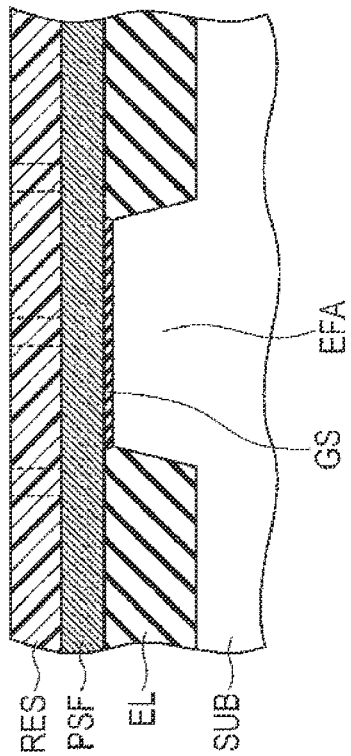
FIG. 7B

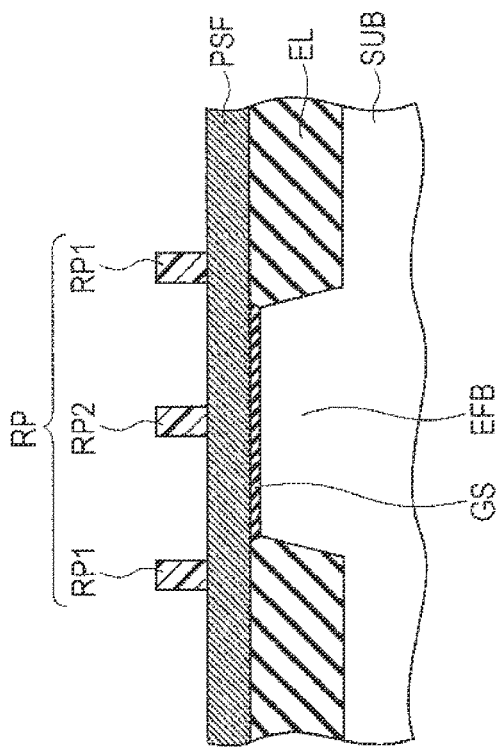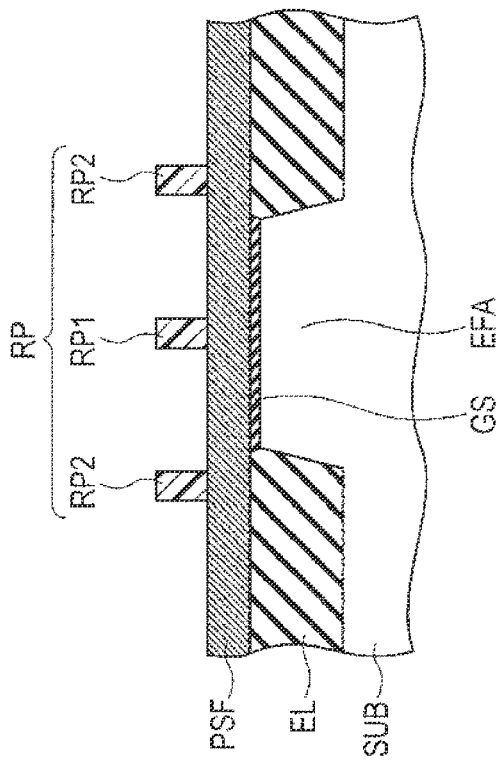

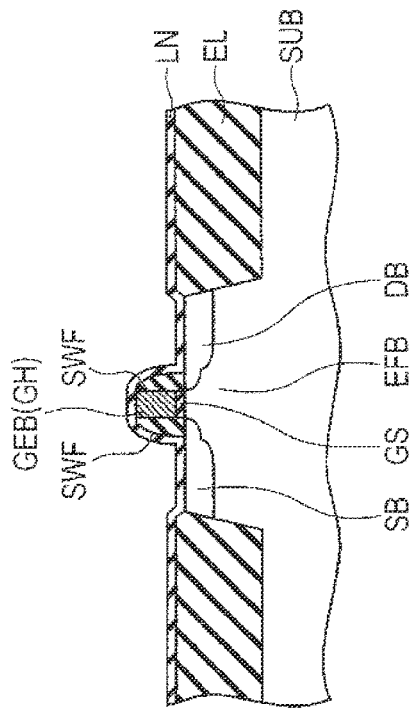
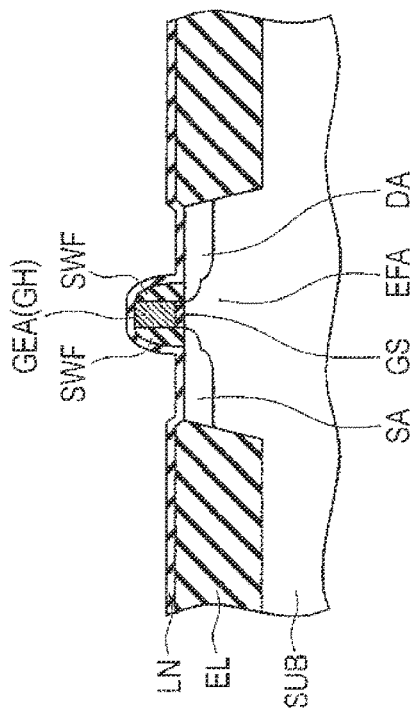

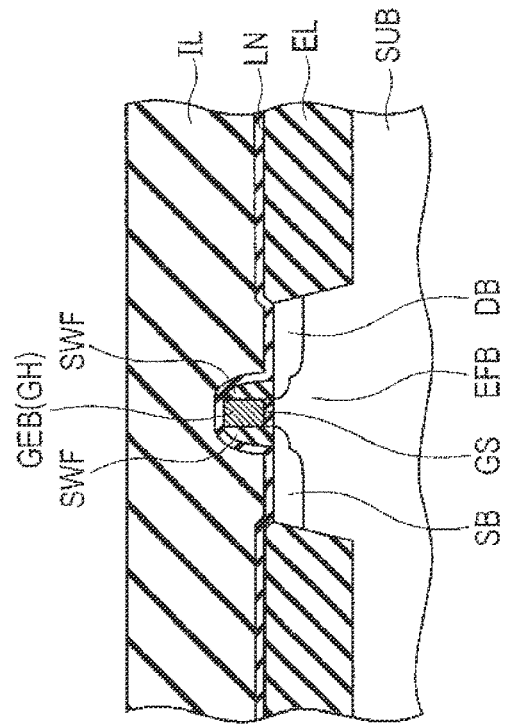
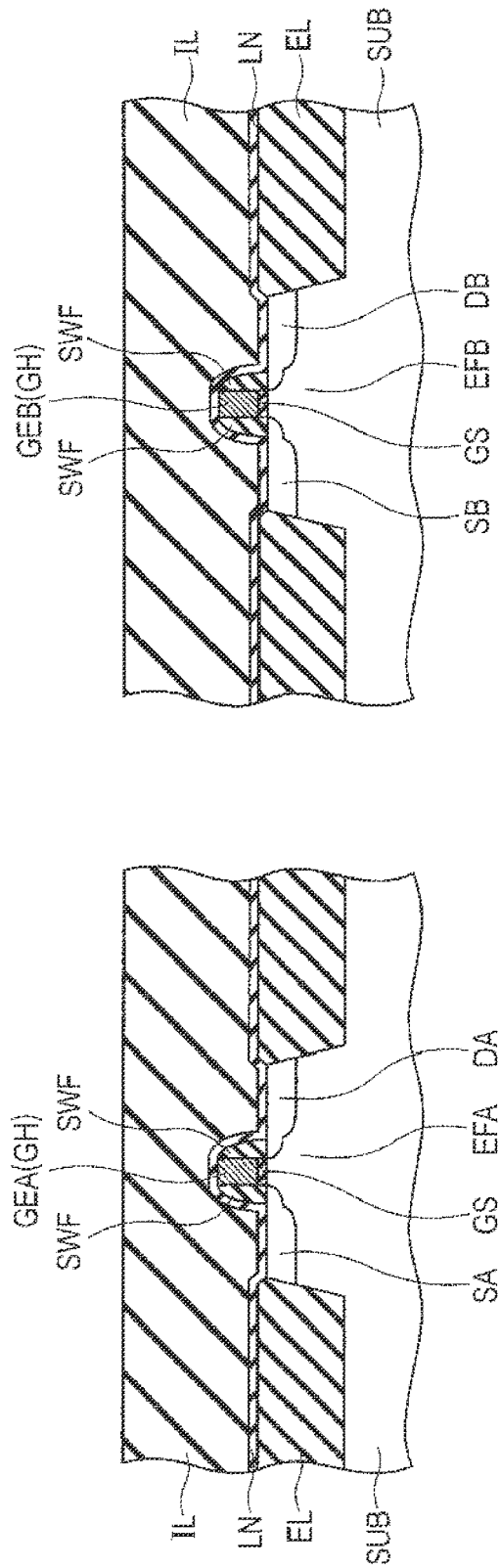

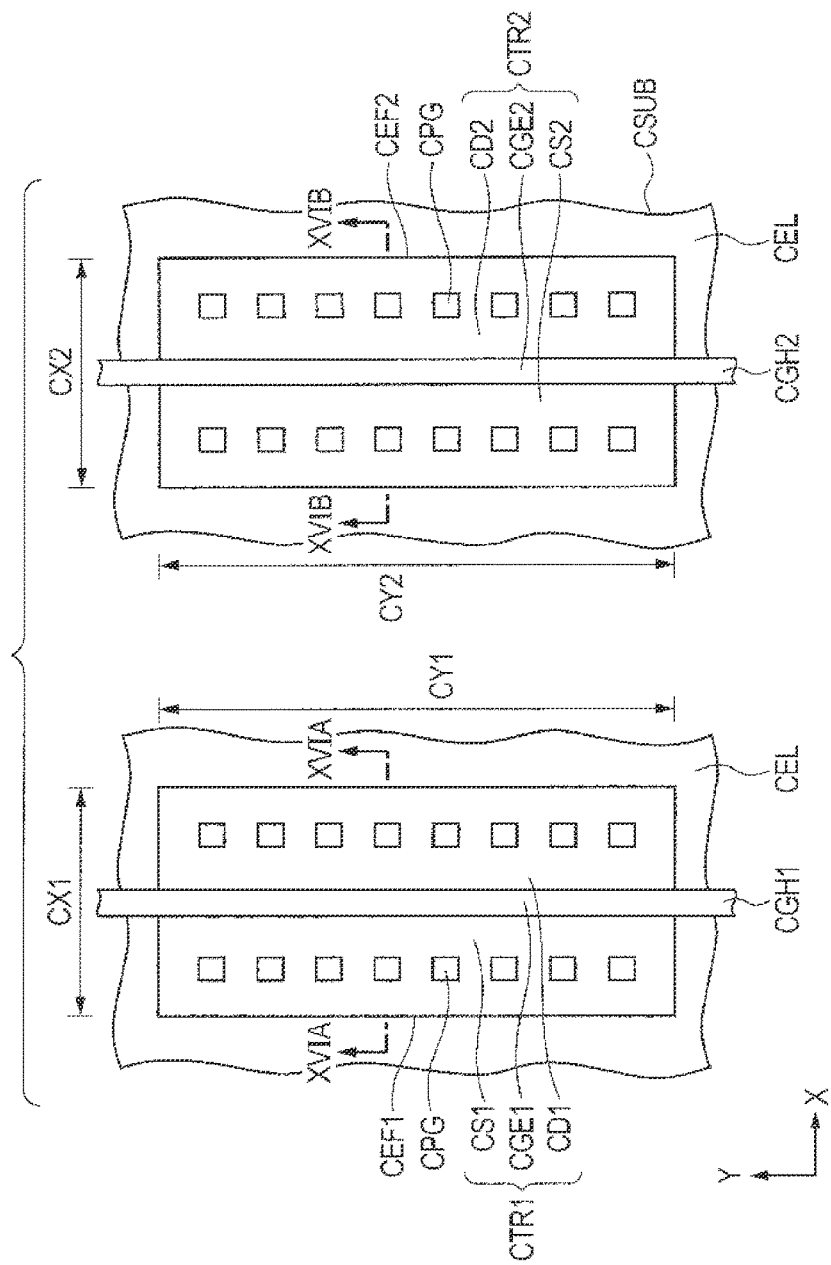

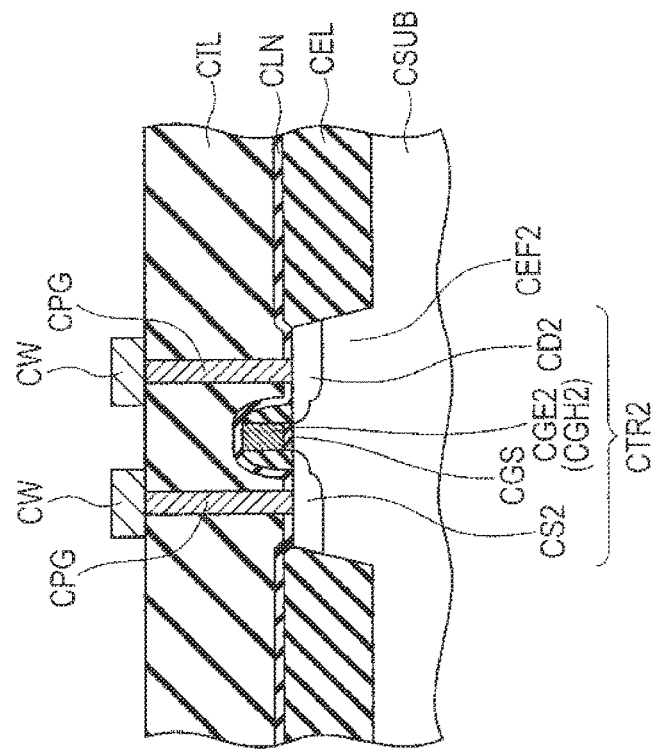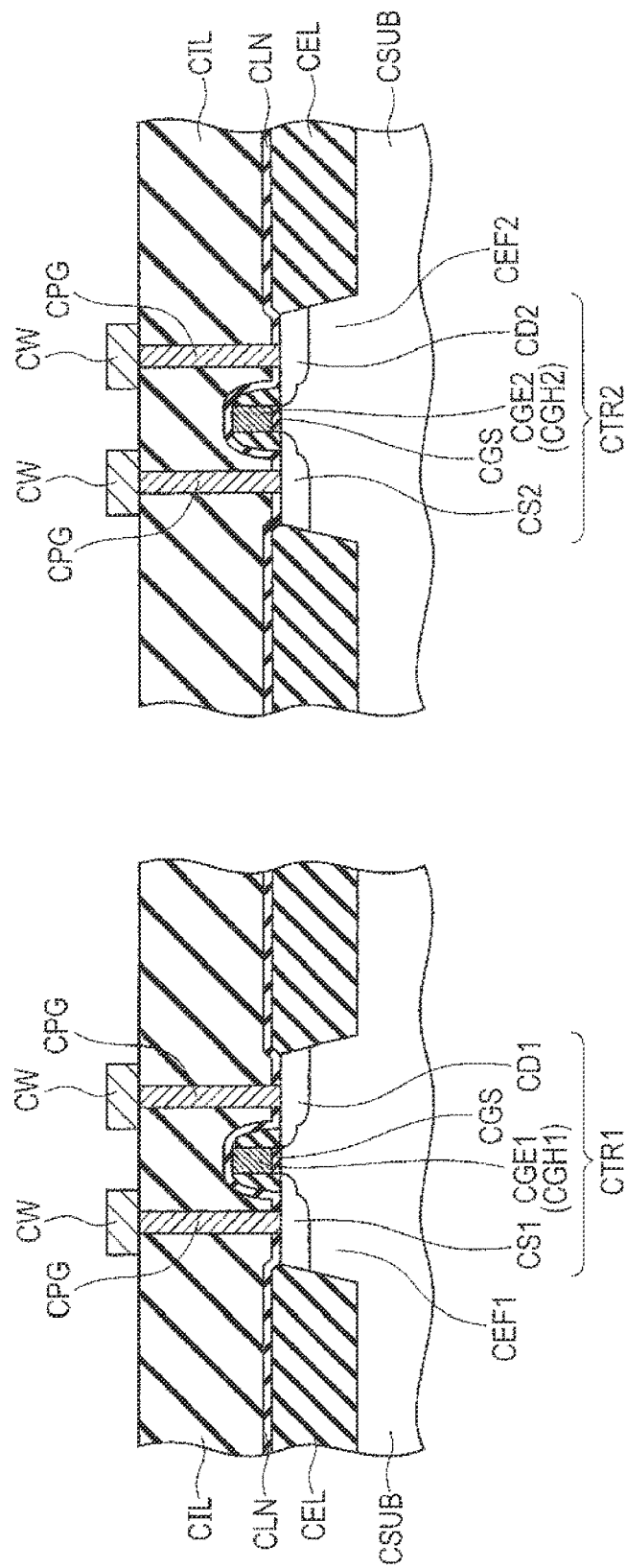

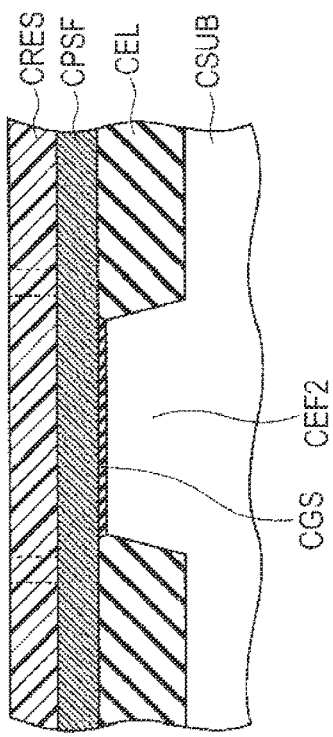
FIG. 17A
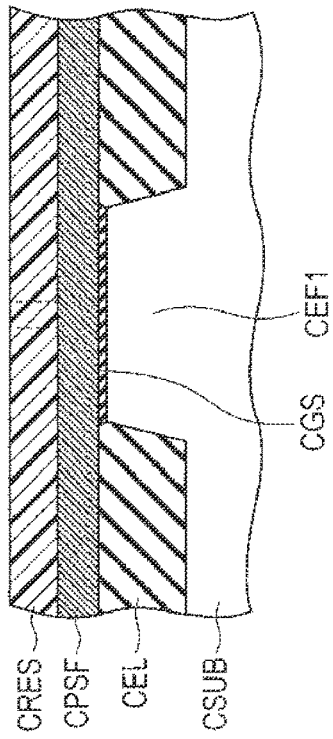
FIG. 17B

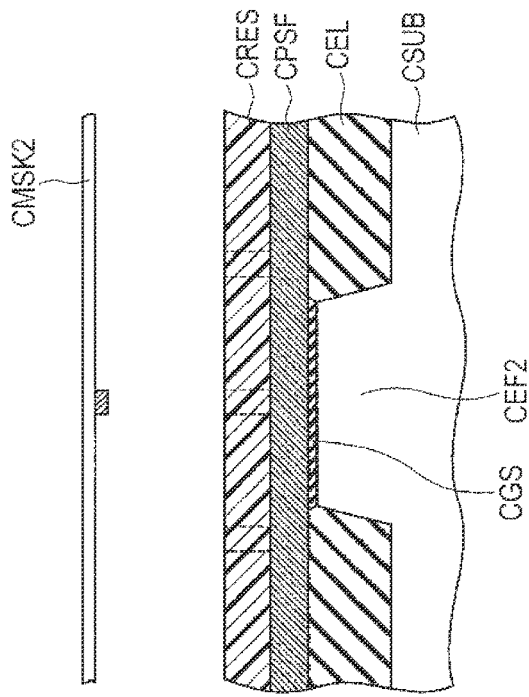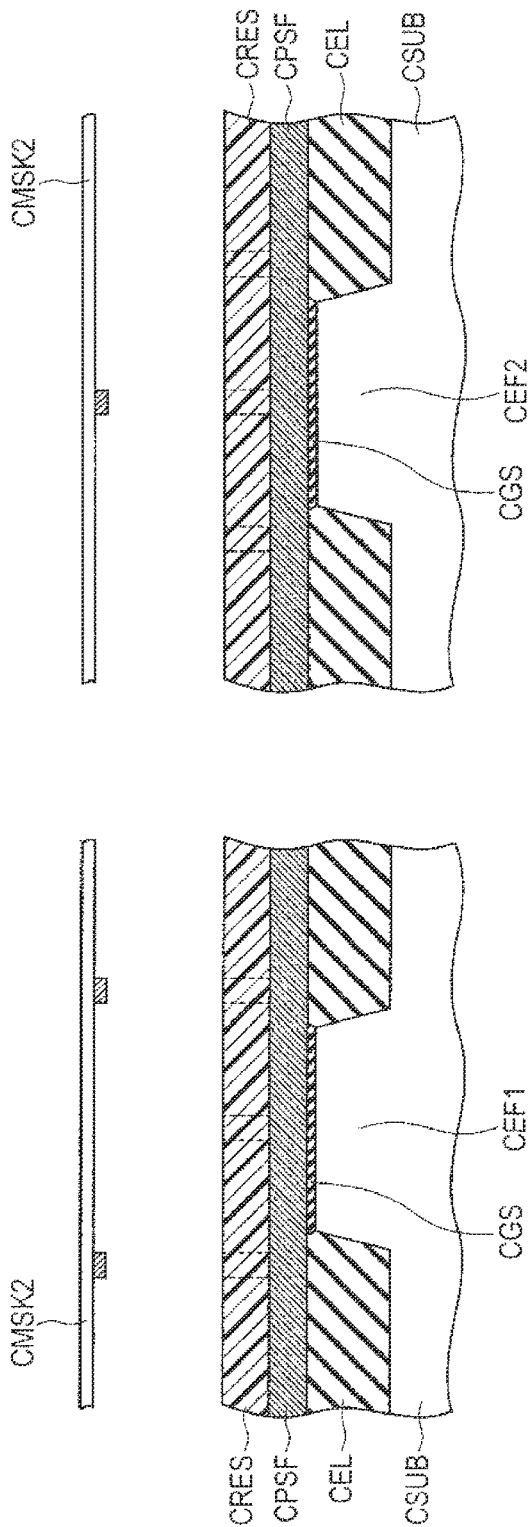

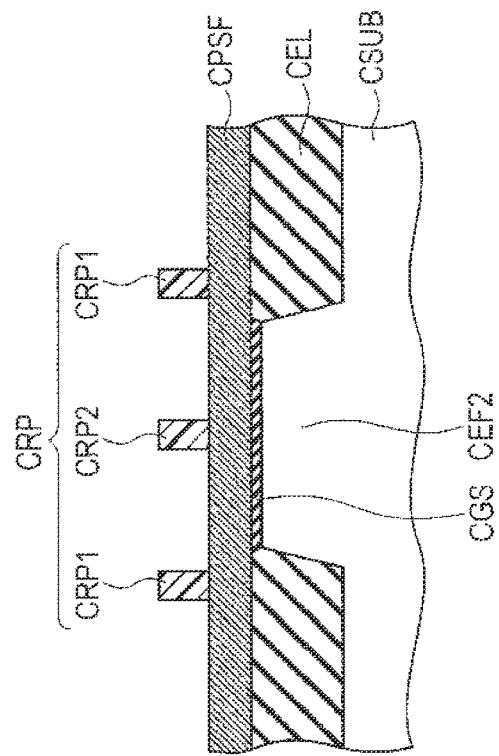
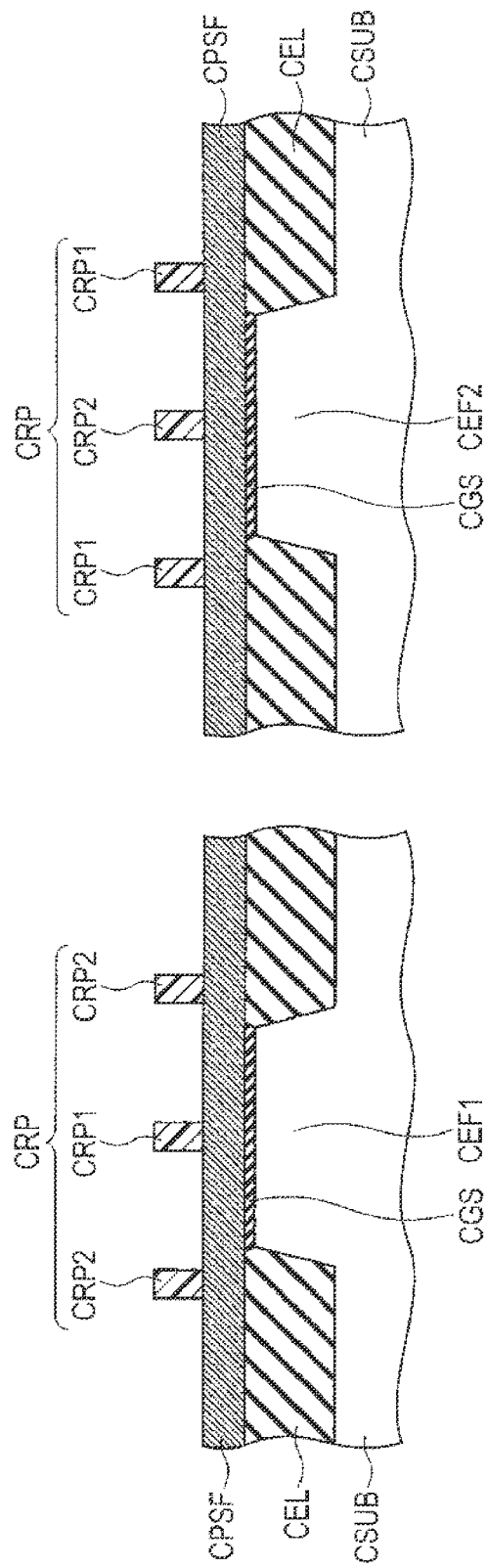

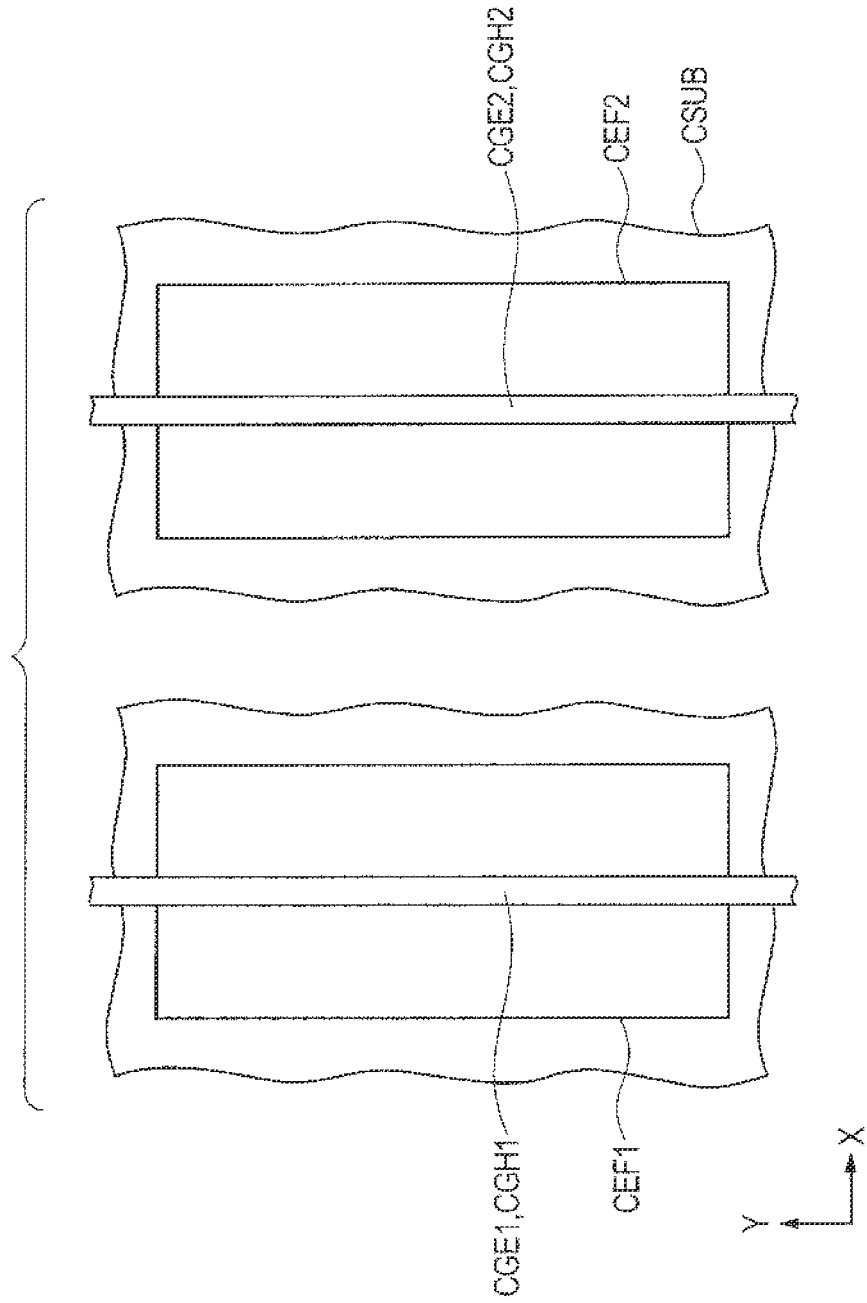

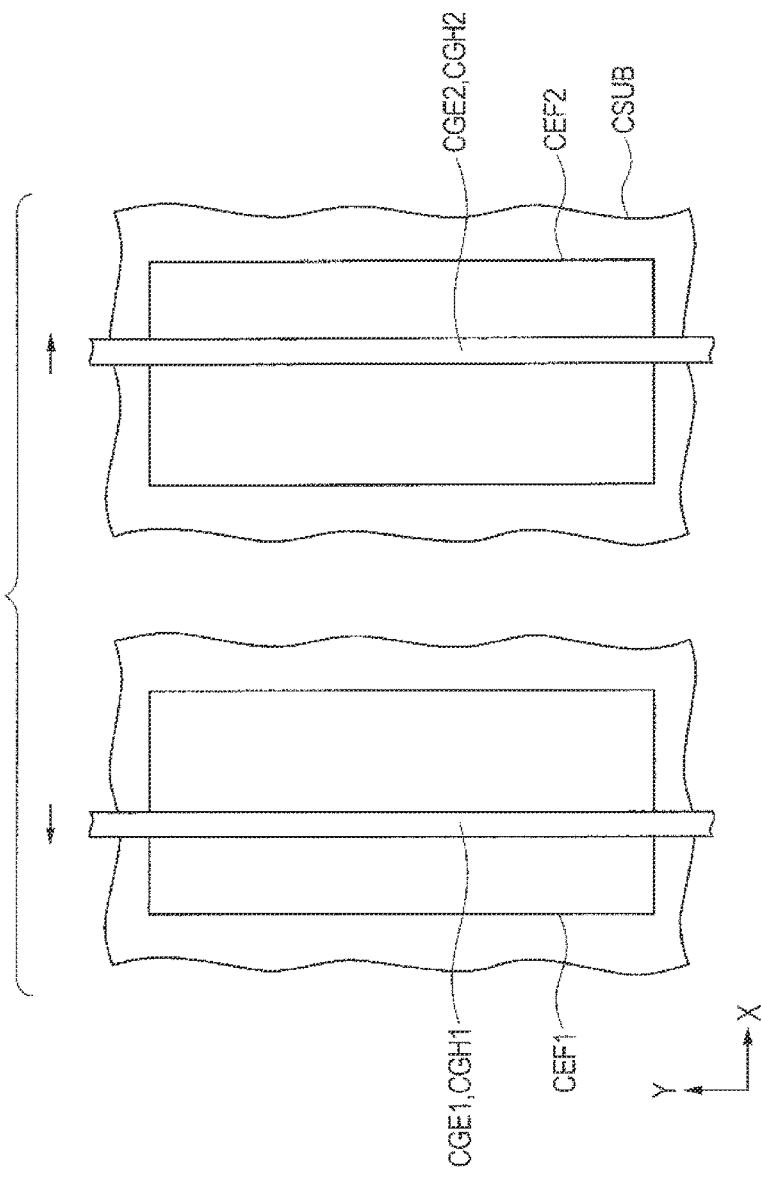

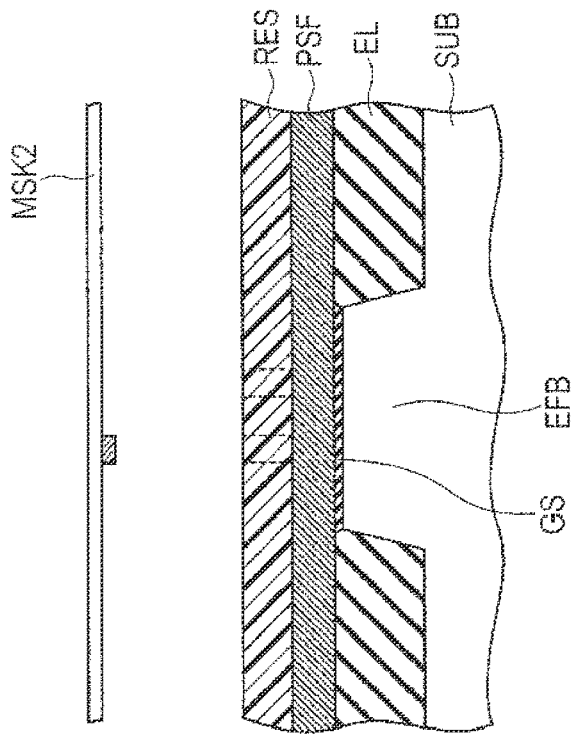
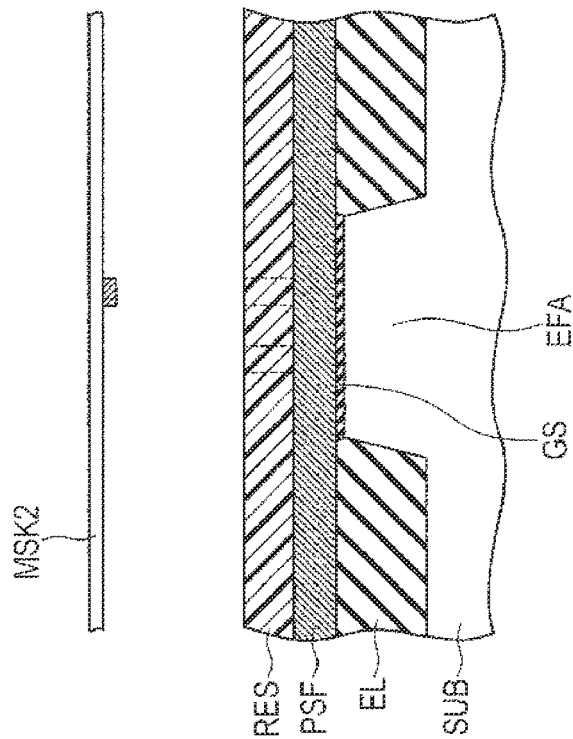

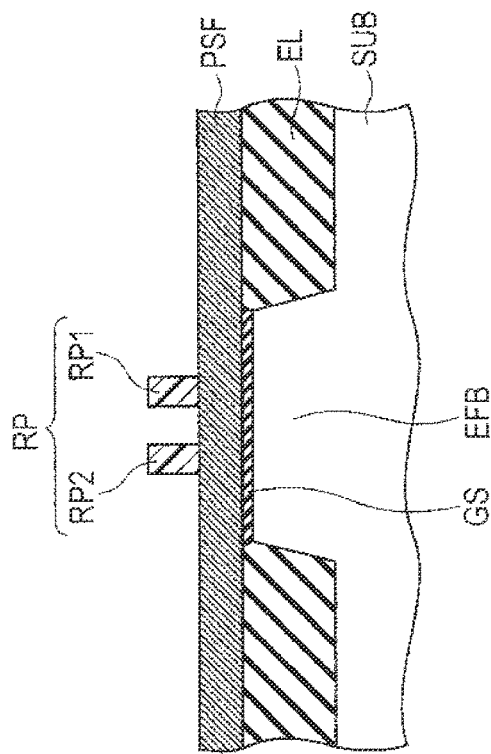

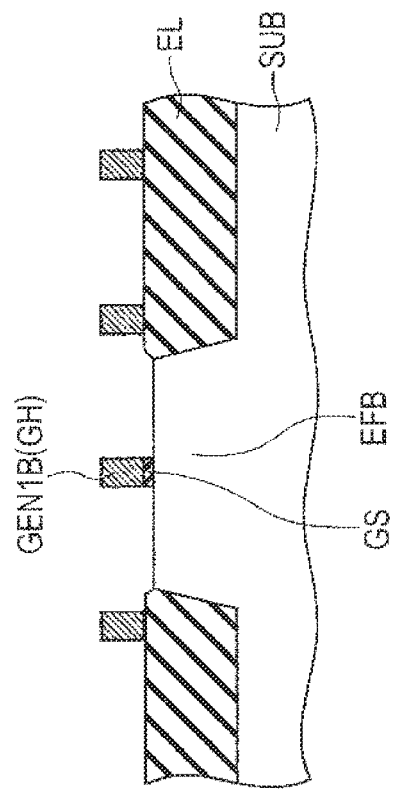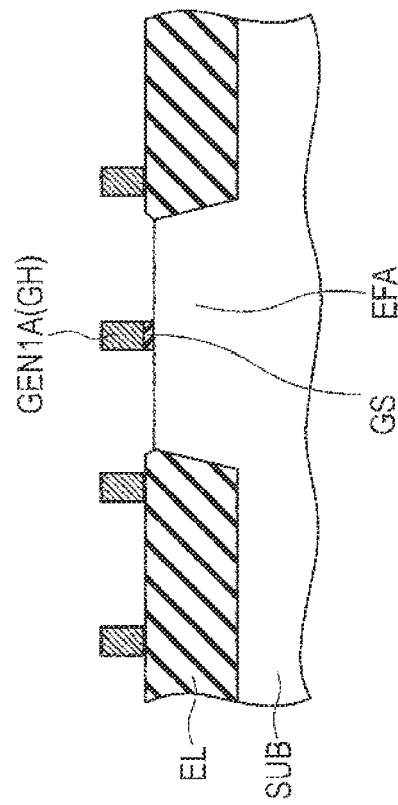

SEMICONDUCTOR DEVICE HAVING TRANSISTORS FORMED BY DOUBLE PATTERNING AND MANUFACTURING METHOD THEREFOR

CROSS-REFERENCE TO RELATED APPLICATIONS

The disclosure of Japanese Patent Application No. 2014-162684 filed on Aug. 8, 2014 including the specification, drawings and abstract is incorporated herein by reference in its entirety.

BACKGROUND

The present invention relates to a semiconductor device and a manufacturing method therefor, and is particularly suitably available to a semiconductor device having transistors manufactured using double patterning.

In a semiconductor device equipped with a logic circuit, an analog circuit and the like each of which uses transistors, patterns of the logic circuit, the analog circuit and the like have been required in microminiaturization with the miniaturization of an electronic apparatus. A problem arises in that when one pattern and another pattern adjacent to each other approach each other due to the microminiaturization, one pattern and another pattern cannot be formed separated from each other over a semiconductor substrate by one mask.

In order to solve such a problem, there is known a method called double patterning. According to this method, one pattern is first photoengraved (exposed) in a photoresist by one mask, and another pattern is photoengraved (exposed) therein by another mask. Next, the photoresist is developed to form a resist pattern. Then, etching processing is performed on a predetermined film using the resist pattern to form a predetermined pattern including a pattern corresponding to one pattern and a pattern corresponding to another pattern.

As examples each having disclosed such double patterning, there are known a Patent Document 1 and a Patent Document 2. Further, as Non-Patent Documents, there are known a Non-Patent Document 1, a Non-Patent Document 2, and a Non-Patent Document 3.

RELATED ART DOCUMENTS

Patent Documents

[Patent Document 1] Japanese Unexamined Patent Publication Laid-Open No. 2009-294308
[Patent Document 2] Japanese Unexamined Patent Publication Laid-Open No. 2012-74755

Non-Patent Documents

[Non-Patent Document 1]
http://www.mentorg.co.jp/news_and views/ic/2012/spring.html
[Non-Patent Document 2]
http://www.mentorg.co.jp/news_and views/ic/2012/spring2.html
[Non-Patent Document 3]
http://eetimes.jp/ee/articles/1111/29/news021.html

SUMMARY

When transistors of the same size exist in at least two locations as a semiconductor device, a pattern corresponding to one gate electrode (wiring) of one transistor is photoengraved (exposed) in a photoresist by one mask, and a pattern corresponding to another gate electrode (wiring) of another transistor is photoengraved (exposed) therein by another mask.

When, at this time, a deviation in alignment occurs in photoengraving by one mask, one gate electrode may be formed (patterned) deviated from a desired position. Further, when a deviation in alignment occurs in photoengraving by another mask, another gate electrode may be formed (patterned) deviated from a desired position. Therefore, there was a case where transistor characteristics such as respective source-drain diffusion capacitances of one transistor and another transistor would be deviated from a desired transistor characteristic.

Other problems and novel features will be apparent from the description of the present specification and the accompanying drawings.

According to one aspect of the present invention, a semiconductor device includes an element forming area including a first element forming area and a second element forming area respectively defined in the surface of a semiconductor substrate, and a transistor formed in the element forming area, which includes a first transistor formed in the first element forming area and a second transistor formed in the second element forming area. The size of the first element forming area and the size of the second element forming area are respectively set to the same size. The first element forming area and the second element forming area are arranged deviated from each other with a distance corresponding to the minimum pitch in a second direction orthogonal to a first direction.

According to another aspect of the present invention, a method for manufacturing a semiconductor device particularly includes the following steps. An element forming area including a first element forming area and a second element forming area is defined in the surface of a semiconductor substrate. The step of forming a transistor in the element forming area is provided which includes a step of forming a first transistor in the first element forming area, and forming a second transistor in the second element forming area. The transistor forming step has a gate electrode forming step including a step of forming based on a minimum pitch by double patterning, a first gate electrode arranged in the first element forming area and extending along a first direction, and a second gate electrode arranged in the second element forming area and extending along the first direction. The step of defining the first element forming area and the second element forming area has a step of setting the size of the first element forming area and the size of the second element forming area to the same size and defining the first element forming area and the second element forming area so as to be deviated from each other with a distance corresponding to the minimum pitch in a second direction orthogonal to the first direction.

According to the semiconductor device according to the above one aspect, variations in transistor characteristics can be suppressed.

According to the method for manufacturing the semiconductor device, according to another aspect, variations in transistor characteristics can be suppressed.

BRIEF DESCRIPTION OF THE DRAWINGS

FIGS. 2A and 2B are diagrams showing a sectional structure of the semiconductor device in the same embodiment, in which FIG. 2A is a sectional diagram taken along sectional line IIa-IIa shown in FIG. 1, and FIG. 2B is a sectional diagram taken along sectional line IIb-IIb shown in FIG. 1;

FIGS. 4A and 4B are sectional diagrams in the process shown in FIG. 3, in which FIG. 4A is a sectional diagram taken along sectional line IVa-IVa shown in FIG. 3, and FIG. 4B is a sectional diagram taken along sectional line IVb-IVb shown in FIG. 3;

FIGS. 5A and 5B are sectional diagrams showing a process carried out after the process shown in FIG. 3 and FIGS. 4A and 4B in the same embodiment, in which FIG. 5A is a sectional diagram taken along sectional line corresponding to the sectional line IVa-IVa shown in FIG. 3, and FIG. 5B is a sectional diagram taken along sectional line corresponding to the sectional line IVb-IVb shown in FIG. 3;

FIGS. 6A and 6B are sectional diagrams showing a process carried out after the process shown in FIGS. 5A and 5B in the same embodiment, in which FIG. 6A is a sectional diagram taken along sectional line corresponding to the sectional line IVa-IVa shown in FIG. 3, and FIG. 6B is a sectional diagram taken along sectional line corresponding to the sectional line IVb-IVb shown in FIG. 3;

FIGS. 7A and 7B are sectional diagrams showing a process carried out after the process shown in FIGS. 6A and 6B in the same embodiment, in which FIG. 7A is a sectional diagram taken along sectional line corresponding to the sectional line IVa-IVa shown in FIG. 3, and FIG. 7B is a sectional diagram taken along sectional line corresponding to the sectional line IVb-IVb shown in FIG. 3;

FIGS. 8A and 8B are sectional diagrams showing a process carried out after the process shown in FIG. 7 and 7B in the same embodiment, in which FIG. 8A is a sectional diagram taken along sectional line corresponding to the sectional line IVa-IVa shown in FIG. 3, and FIG. 8B is a sectional diagram taken along sectional line corresponding to the sectional line IVb-IVb shown in FIG. 3;

FIGS. 10A and 10B are sectional diagrams in the process shown in FIG. 9 in the same embodiment, in which FIG. 10A is a sectional diagram taken along sectional line Xa-Xa shown in FIG. 9, and FIG. 10B is a sectional diagram taken along sectional line Xb-Xb shown in FIG. 9;

FIGS. 11A and 11B are sectional diagrams showing a process carried out after the process shown in FIGS. 9 and 10A and 10B in the same embodiment, in which FIG. 11A is a sectional diagram taken along sectional line corresponding to the sectional line Xa-Xa shown in FIG. 9, and FIG. 11B is a sectional diagram taken along sectional line corresponding to the sectional line Xb-Xb shown in FIG. 9;

FIGS. 12A and 12B are sectional diagrams showing a process carried out after the process shown in FIGS. 11A and 11B in the same embodiment, in which FIG. 12A is a sectional diagram taken along sectional line corresponding to the sectional line Xa-Xa shown in FIG. 9, and FIG. 12B is a sectional diagram taken along sectional line corresponding to the sectional line Xb-Xb shown in FIG. 9;

FIGS. 13A and 13B are sectional diagrams showing a process carried out after the process shown in FIGS. 12A and 12B in the same embodiment, in which FIG. 13A is a sectional diagram taken along sectional line corresponding to the sectional line Xa-Xa shown in FIG. 9, and FIG. 13B is a sectional diagram taken along sectional line corresponding to the sectional line Xb-Xb shown in FIG. 9;

FIGS. 14A and 14B are sectional diagrams showing a process carried out after the process shown in FIGS. 13A and 13B in the same embodiment, in which FIG. 14A is a sectional diagram taken along sectional line corresponding to the sectional line Xa-Xa shown in FIG. 9, and FIG. 14B is a sectional diagram taken along sectional line corresponding to the sectional line Xb-Xb shown in FIG. 9;

FIG. 15 is a plan diagram showing a semiconductor device according to a comparative example;

FIGS. 16A and 16B are diagrams showing a sectional structure of the semiconductor device according to the comparative example, in which FIG. 16A is a sectional diagram taken along sectional line XVIa-XVIa shown in FIG. 15, and FIG. 16B is a sectional diagram taken along sectional line XVIb-XVIb shown in FIG. 15;

FIGS. 17A and 17B are sectional diagrams showing one process of a manufacturing method of the semiconductor device according to the comparative example, in which FIG. 17A is a sectional diagram taken along sectional line corresponding to the sectional line XVIa-XVIa shown in FIG. 15, and FIG. 17B is a sectional diagram taken along sectional line corresponding to the sectional line XVIb-XVIb shown in FIG. 15;

FIGS. 18A and 18B are sectional diagrams showing a process carried out after the process shown in FIGS. 17A and 17B, in which FIG. 18A is a sectional diagram taken along sectional line corresponding to the sectional line XVIa-XVIa shown in FIG. 15, and FIG. 18B is a sectional diagram taken along sectional line corresponding to the sectional line XVIb-XVIb shown in FIG. 15;

FIGS. 19A and 19B are sectional diagrams showing a process carried out after the process shown in FIGS. 18A and 18B, in which FIG. 19A is a sectional diagram taken along sectional line corresponding to the sectional line XVIa-XVIa shown in FIG. 15, and FIG. 19B is a sectional diagram taken along sectional line corresponding to the sectional line XVIb-XVIb shown in FIG. 15;

FIG. 20 is a plan diagram showing a process carried out after the process shown in FIGS. 19A and 19B;

FIG. 21 is a plan diagram showing one example of an alignment relationship between gate electrodes where alignment deviations occur in the process shown in FIGS. 17A and 17B and the process shown in FIGS. 18A and 18B;

FIGS. 29A and 29B are diagrams showing a sectional structure of the semiconductor device in the same embodiment, in which FIG. 29A is a sectional diagram taken along sectional line XXIXa-XXIXa shown in FIG. 28, and FIG. 29B is a sectional diagram taken along sectional line XXIXb-XXIXb shown in FIG. 28;

FIGS. 30A and 30B are sectional diagrams showing one process of a manufacturing method of the semiconductor device in the same embodiment, in which FIG. 30A is a sectional diagram taken along sectional line corresponding to the sectional line XXIXa-XXIXa shown in FIG. 28, and FIG. 30B is a sectional diagram taken along sectional line corresponding to the sectional line XXIXb-XXIXb shown in FIG. 28;

FIGS. 31A and 31B are sectional diagrams showing a process carried out after the process shown in FIGS. 30A and 30B in the same embodiment, in which FIG. 31A is a sectional diagram taken along sectional line corresponding to the sectional line XXIXa-XXIXa shown in FIG. 28, and FIG. 31B is a sectional diagram taken along sectional line corresponding to the sectional line XXIXb-XXIXb shown in FIG. 28;

FIGS. 32A and 32B are sectional diagrams showing a process carried out after the process shown in FIGS. 31A and 31B in the same embodiment, in which FIG. 32A is a sectional diagram taken along sectional line corresponding to the sectional line XXIXa-XXIXa shown in FIG. 28, and FIG. 32B is a sectional diagram taken along sectional line corresponding to the sectional line XXIXb-XXIXb shown in FIG. 28;

FIGS. 34A and 34B are sectional diagrams in the process shown in FIG. 33 in the same embodiment, in which FIG. 34A is a sectional diagram taken along sectional line XXXIVa-XXXIVa shown in FIG. 33, and FIG. 34B is a sectional diagram taken along sectional line XXXIVb-XXXIVb shown in FIG. 33;

FIGS. 47A and 47B are diagrams showing a sectional structure of the semiconductor device according to the first example in the same embodiment, in which FIG. 47A is a sectional diagram taken along sectional line XLVIIa-XLVIIa shown in FIG. 46, and FIG. 47B is a sectional diagram taken along sectional line XLVIIb-XLVIIb shown in FIG. 46;

FIGS. 48A and 48B are sectional diagrams showing one process of a manufacturing method of the semiconductor device in the same embodiment, in which FIG. 48A is a sectional diagram taken along sectional line corresponding to the sectional line XLVIIa-XLVIIa shown in FIG. 46, and FIG. 48B is a sectional diagram taken along sectional line corresponding to the sectional line XLVIIb-XLVIIb shown in FIG. 46;

FIGS. 49A and 49B are sectional diagrams showing a process carried out after the process shown in FIGS. 48A and 48B in the same embodiment, in which FIG. 49A is a sectional diagram taken along sectional line corresponding to the sectional line XLVIIa-XLVIIa shown in FIG. 46, and FIG. 49B is a sectional diagram taken along sectional line corresponding to the sectional line XLVIIb-XLVIIb shown in FIG. 46;

FIGS. 50A and 50B are sectional diagrams showing a process carried out after the process shown in FIGS. 49A and 49B in the same embodiment, in which FIG. 50A is a sectional diagram taken along sectional line corresponding to the sectional line XLVIIa-XLVIIa shown in FIG. 46, and FIG. 50B is a sectional diagram taken along sectional line corresponding to the sectional line XLVIIb-XLVIIb shown in FIG. 46;

FIGS. 52A and 52B are sectional diagrams in the process shown in FIG. 51 in the same embodiment, in which FIG. 52A is a sectional diagram taken along sectional line LIIa-LIIa shown in FIG. 51, and FIG. 52B is a sectional diagram taken along sectional line LIIb-LIIb shown in FIG. 51;

FIGS. 55A and 55B are diagrams showing a sectional structure of the semiconductor device according to the second example in the same embodiment, in which FIG. 55A is a sectional diagram taken along sectional line LVa-LVa shown in FIG. 54, and FIG. 55B is a sectional diagram taken along sectional line LVb-LVb shown in FIG. 54;

DETAILED DESCRIPTION

First Embodiment

A description will be made here about a semiconductor device in which one transistor is equally divided into one transistor and another transistor in a gate width direction of a gate electrode (wiring).

Figure 1:
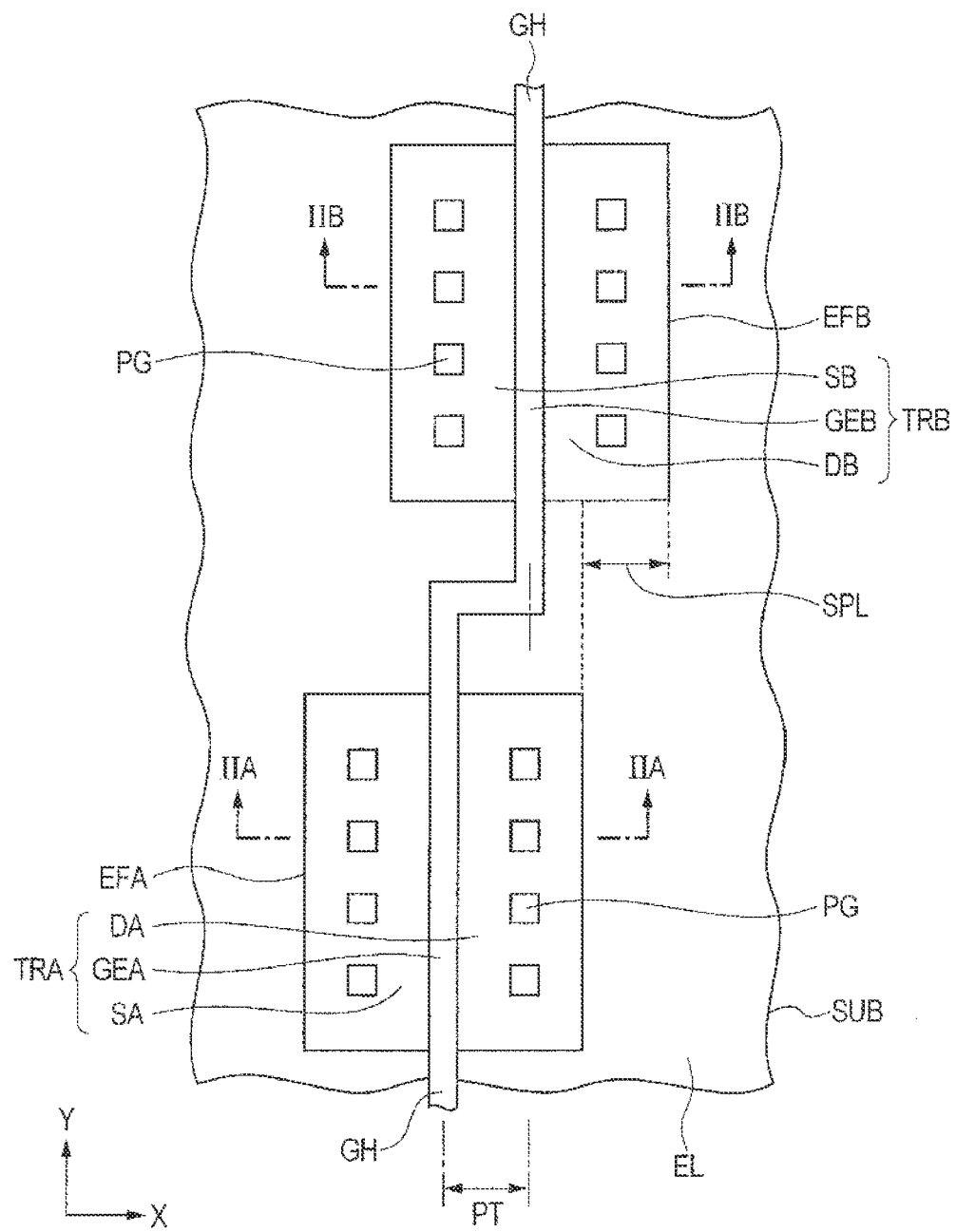
FIG. 1 is a plan diagram showing a semiconductor device according to a first embodiment.
Figure 2A:
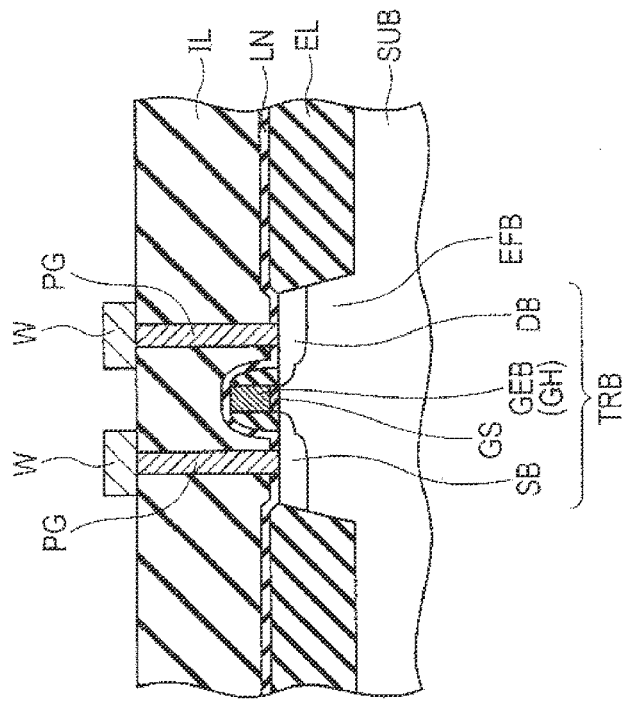
Figure 2B:
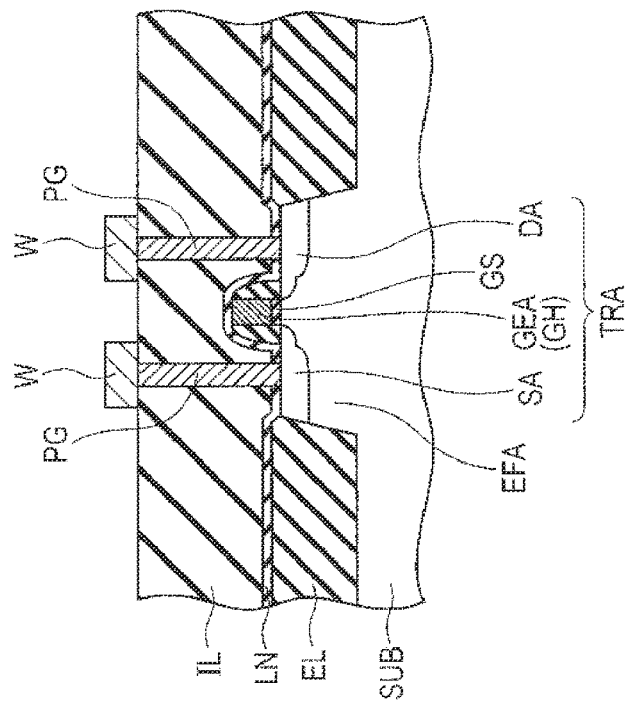

As shown in FIGS. 1 and 2, a first element forming area EFA and a second element forming area EFB are defined in the surface of a semiconductor substrate SUB by an element isolation insulating film EL. A first transistor TRA is formed in the first element forming area EFA as a divided transistor. A second transistor TRB is formed in the second element forming area FEB as another divided transistor.

The first transistor TRA has a gate electrode GEA, a source area SA, and a drain area DA. The gate electrode GEA is formed so as to cross the first element forming area EFA. The source area SA is formed in part of the first element forming area EFA positioned on the (negative) side of an X direction with respect to the gate electrode GEA. The drain area DA is formed in part of the first element forming area EFA positioned on the (positive) side of the X direction with respect to the gate electrode GEA.

The second transistor TRB has a gate electrode GEB, a source area SB, and a drain area DB. The gate electrode GEB is formed so as to cross the second element forming area EFB. The source area SB is formed in part of the second element forming area EFB positioned on the (negative) side of the X direction with respect to the gate electrode GEB. The drain area DB is formed in part of the second element forming area EFB positioned on the (positive) side of the X direction with respect to the gate electrode GEB. The gate electrode GEA and the gate electrode GEB are coupled to each other and respectively form part of a gate wiring GH.

A stress liner film LN and an interlayer oxide film IL are formed so as to cover the first transistor TRA and the second transistor TRB. Plugs PG are formed so as to penetrate the interlayer oxide film IL or the like. A plurality of wirings W are formed in the surface of the interlayer oxide film. The source area SA and the source area SB are electrically coupled to each other through the plugs PG and one wiring W. The drain area DA and the drain area DB are electrically coupled to each other through the plugs PG and other wiring W.

In the above-described semiconductor device, as will be described later, the first element forming area EFA and the second element forming area EFB are set to the same size (length in the X direction (gate length direction) and length in a Y direction (gate width direction)). Further, the first element forming area EFA and the second element forming area EFB are arranged deviated from each other by a length SPL corresponding to the minimum pitch PT (design rule) of the gate wiring GH in the X direction orthogonal to the Y direction in which the gate wiring extends. Further, the gate electrode GEA and the gate electrode GEB are formed by double patterning. The gate electrode GEA is formed based on a pattern of one mask, and the gate electrode GEB is formed based on a pattern of another mask.

Figure 3:
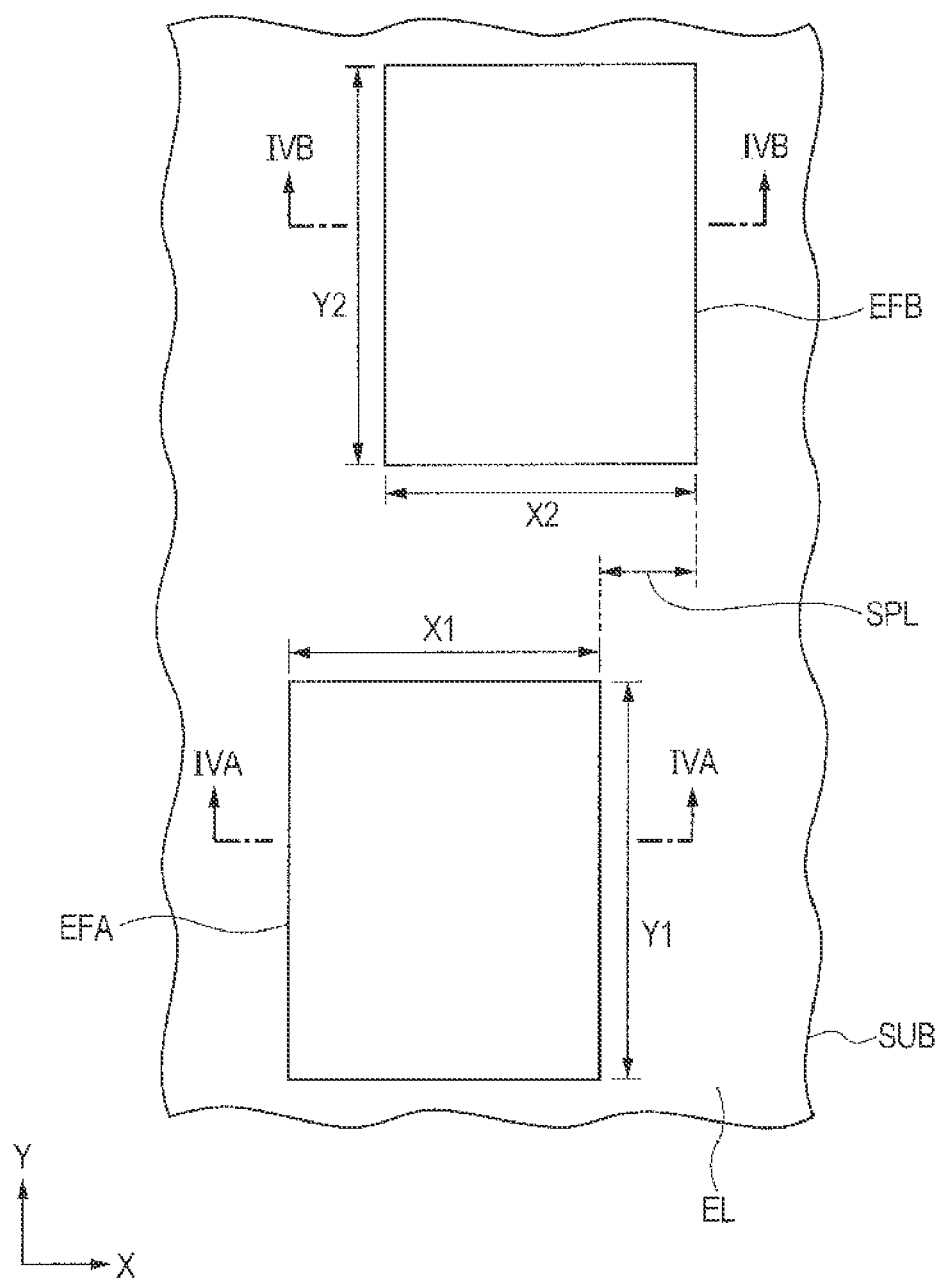
FIG. 3 is a plan diagram showing one process of a manufacturing method of the semiconductor device in the same embodiment.

A description will next be made about one example of a manufacturing method of the semiconductor device described above. First, as shown in FIGS. 3 and 4, an element isolation insulating film EL is formed in the surface of a semiconductor substrate SUB to thereby define a first element forming area EFA and a second element forming area FEB. A length X1 in an X direction of the first element forming area EFA and a length X2 in the X direction of the second element forming area EFB are set to the same length. A length Y1 in a Y direction of the first element forming area EFA and a length Y2 in the Y direction of the second element forming area EFB are set to the same length. Further, the first element forming area EFA and the second element forming area EFB are arranged deviated from each other in the X direction by a length SPL corresponding to the minimum pitch PT of a gate wiring.

Next, as shown in FIG. 5, a gate oxide film GS is formed in each of the first element forming area EFA and the second element forming area EFB by subjecting thermal oxidation processing or the like thereto. A polysilicon film PSF having a predetermined thickness is formed by, for example, a CVD (Chemical Vapor Deposition) method so as to cover the gate oxide film GS. Next, a photoresist RES is applied over the surface of the polysilicon film PSF.

Figure 6A:
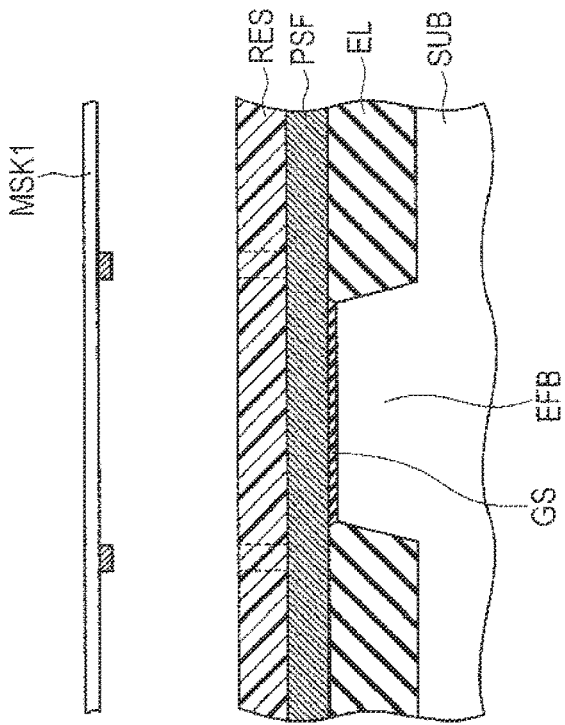
Figure 6B:
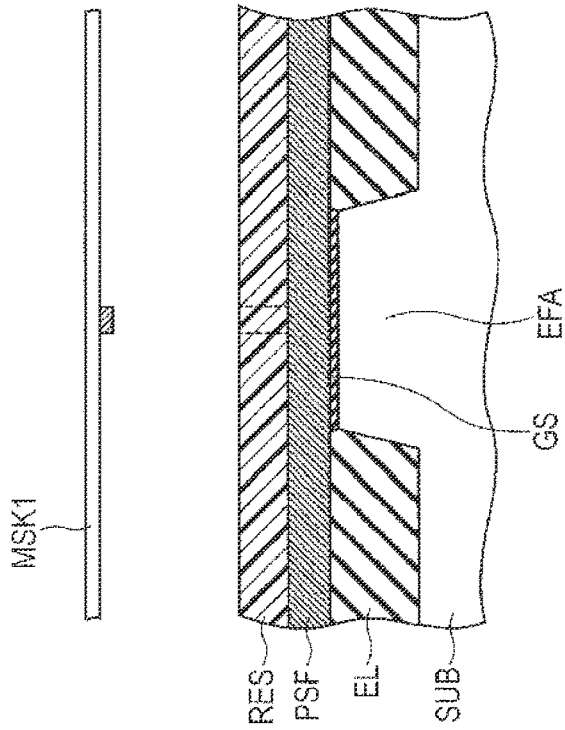

Next, gate wirings (gate electrodes) are formed by double patterning. First, as shown in FIG. 6, the photoresist RES is exposed using a first mask MSK1. At this time, patterns (light shielding films) corresponding to predetermined plural gate electrodes (gate wirings) are formed in the first mask MSK1. A pattern corresponding to the gate electrode GEA is included herein. The pattern is photoengraved in the photoresist RES which covers the first element forming area EFA.

Next, as shown in FIG. 7, the photoresist RES is exposed using a second mask MSK2. At this time, patterns (light shielding films) corresponding to other predetermined plural gate electrodes (gate wirings) are formed in the second mask MSK2. A pattern corresponding to the gate electrode GEB is included herein. The pattern is photoengraved in the photoresist RES which covers the second element forming area EFB.

Next, as shown in FIG. 8, a resist pattern RP including a resist pattern RP1 and a resist pattern RP2 is formed by performing development processing on the photoresist RES. The resist pattern RP1 is a resist pattern photoengraved by the first mask MSK1. The resist pattern RP2 is a resist pattern photoengraved by the second mask MSK2. Next, etching processing is performed on the polysilicon film PSF with the resist pattern RP as an etching mask to thereby form a gate wiring GH (refer to FIG. 9).

Figure 9:
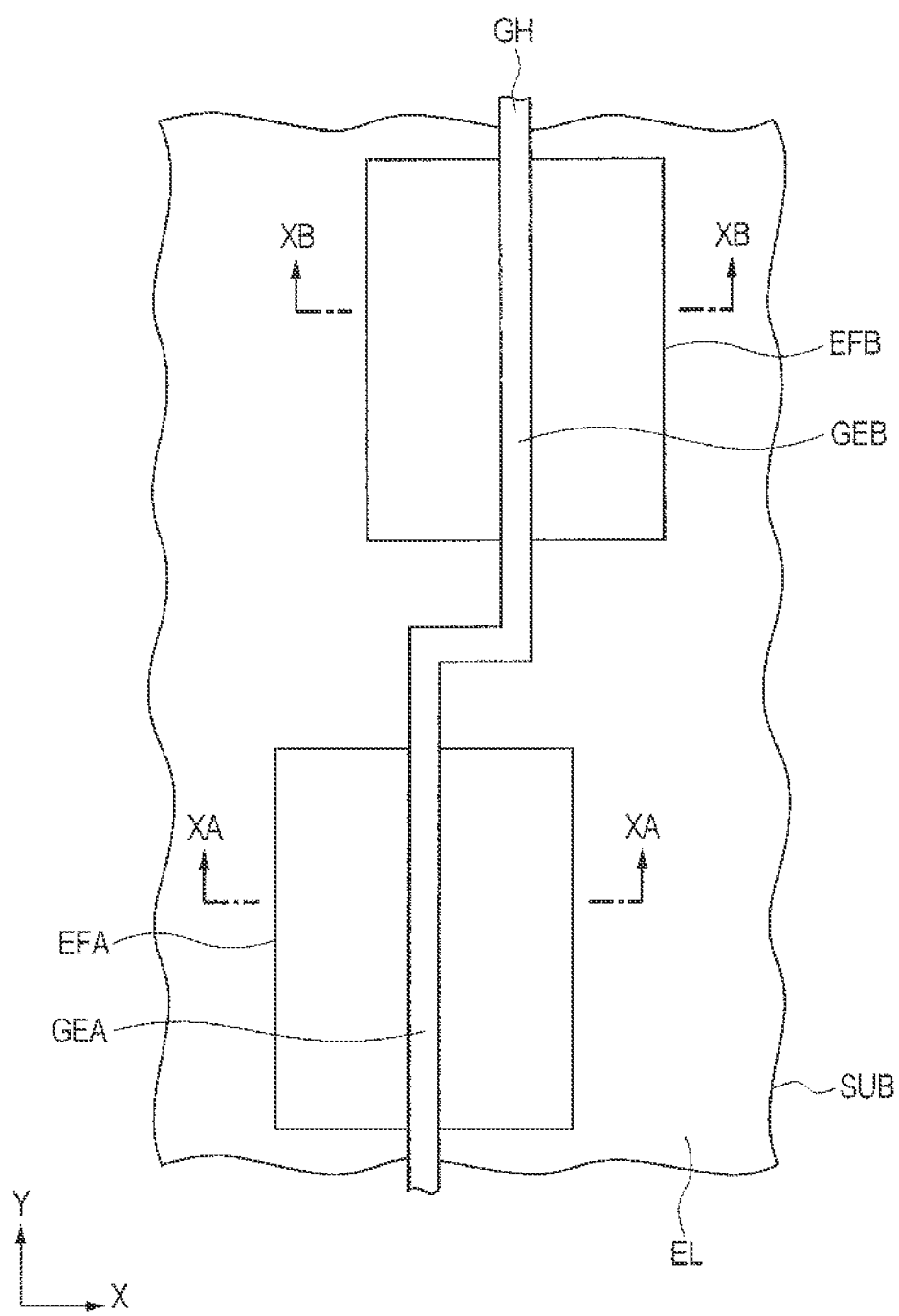
FIG. 9 is a plan diagram showing a process carried out after the process shown in FIGS. 8A and 8B in the same embodiment.
Figure 10A:
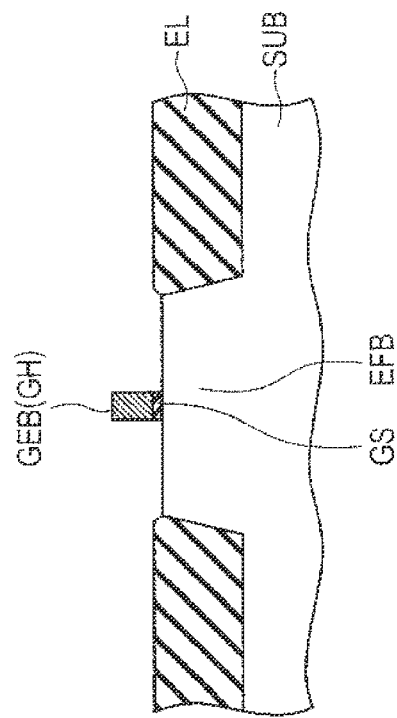
Figure 10B:
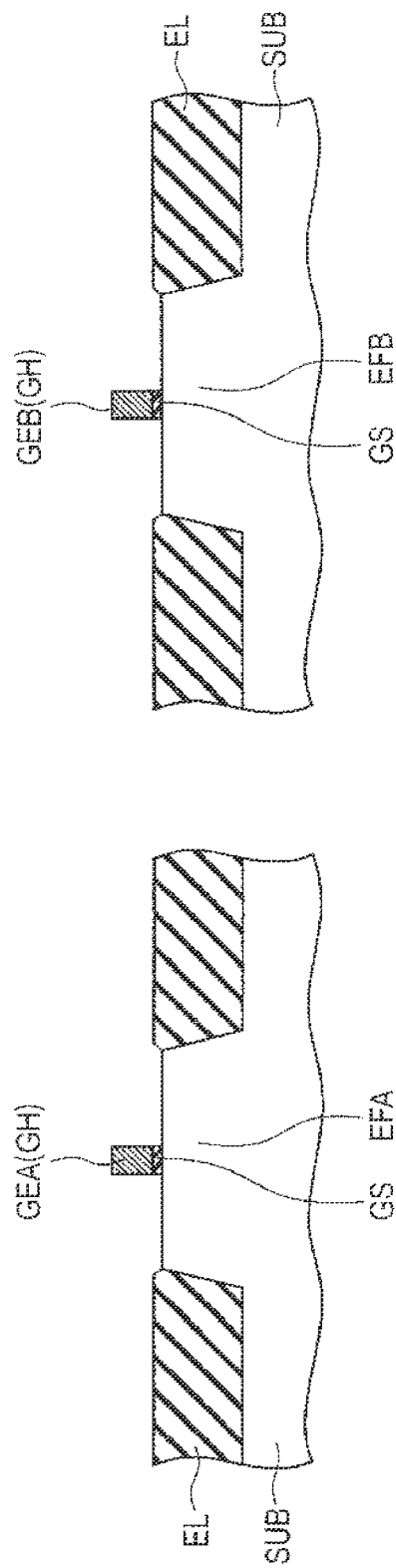

Thereafter, the gate wiring GH is exposed as shown in FIGS. 9 and 10 by removing the resist pattern RP. Incidentally, FIGS. 9 and 10 show the gate wiring GH which crosses the first element forming area EFA and the second element forming area EFB respectively for simplification of the drawings. In the gate wiring GH, a portion thereof which crosses the first element forming area EFA serves as the gate electrode GEA, and a portion thereof which crosses the second element forming area EFB serves as the gate electrode GEB.

Figures 11A, 11B:
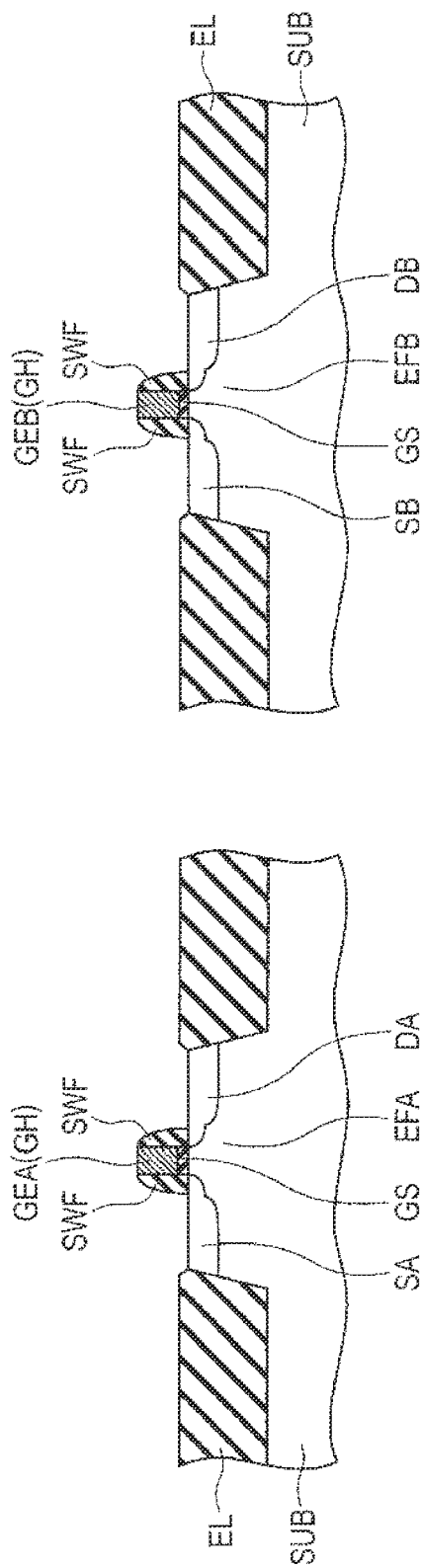

Next, an impurity of a predetermined conductivity type is implanted into the first element forming area EFA and the second element forming area EFB respectively with the gate electrodes GEA and GEB as implantation masks. Next, as shown in FIG. 11, sidewall films SWF are formed over both side surfaces of the gate electrodes GEA and GEB. Next, an impurity of a predetermined conductivity type is implanted into each of the first element forming area EFA and the second element forming area EFB with the gate electrodes GEA and GEB and the sidewall films SWF as implantation masks. Thus, a source area SA and a drain area DA are formed in the first element forming area EFA. A source area SB and a drain area DB are formed in the second element forming area EFB.

Next, as shown in FIG. 12, for example, a stress liner film LN such as a silicon nitride film is formed by the CVD method so as to cover the gate electrodes GEA, GEB and the like. Next, as shown in FIG. 13, for example, an interlayer oxide film IL having a predetermined thickness such as a silicon oxide film is formed by the CVD method so as to cover the stress liner film LN.

Figure 14B:
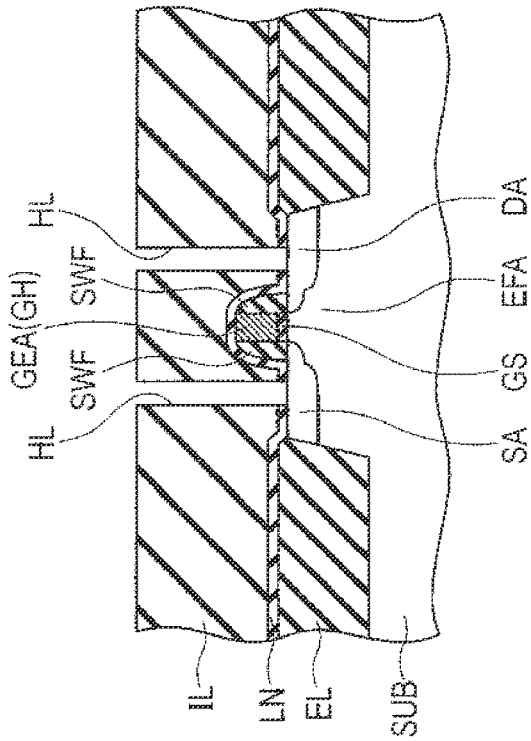
Figure 14A:
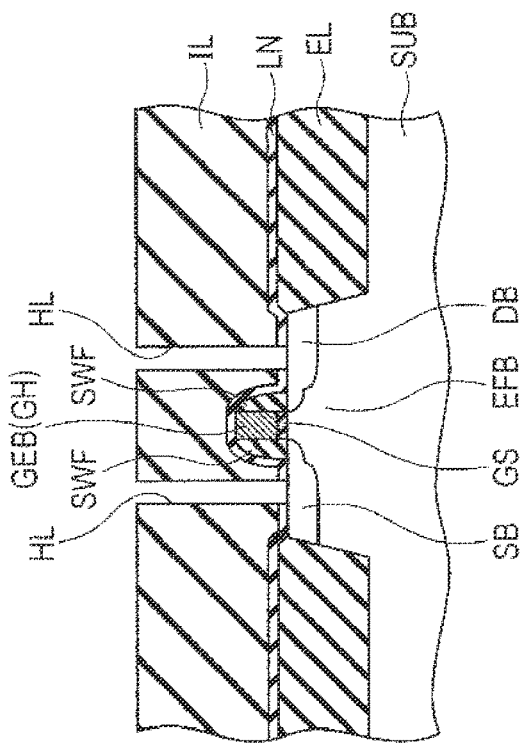

Next, by performing predetermined photoengraving processing and etching processing, contact holes HL which expose the source area SA and the drain area DA respectively are formed in the first element forming area EFA as shown in FIG. 14. Contact holes HL which expose the source area SB and the drain area DB respectively are formed in the second element forming area EFB.

Thereafter, plugs PG are respectively formed in the contact holes HL, and wirings W electrically coupled to the plugs PG are formed (refer to FIGS. 1 and 2). Thus, the main part of the semiconductor device in which one transistor is two-divided into the first transistor TRA and the second transistor TRB in the width direction of the gate electrode (wiring) is completed.

In the above-described semiconductor device, variations in transistor characteristics such as the source-drain diffusion capacitance due to the positional deviation in the gate wiring can be reduced by two-dividing one transistor into the first transistor TRA and the second transistor TRB. This will be described by comparison with a semiconductor device according to a comparative example.

As shown in FIGS. 15 and 16, in the semiconductor device according to the comparative example, a first element forming area CEF1 and a second element forming area CEF2 are defined by forming an element isolation insulating film CEL in the surface of a semiconductor substrate CSUB. A length CX1 in an X direction of the first element forming area CEF1 and a length CX2 in the X direction of the second element forming area CEF2 are set to the same length. A length CY1 in a Y direction of the first element forming area CEF1 and a length CY2 in the Y direction of the second element forming area CEF2 are set to the same length. Further, the length CY1 (CY2) has a length equal to twice the length Y1 (Y2) in the semiconductor device according to the embodiment.

A first transistor CTR1 is formed in the first element forming area CEF1. A second transistor CTR2 is formed in the second element forming area CEF2. The first transistor CTR1 has a gate electrode CGE1, a source area CS1, and a drain area CD1. The gate electrode CGE1 is formed so as to cross the first element forming area CEF1. The source area CS1 is formed in a part of the first element forming area CEF1, which is located on the (negative) side of the X direction with respect to the gate electrode CGE1, and the drain area CD1 is formed in a part of the first element forming area CEF1, which is located on the (positive) side of the X direction with respect to the gate electrode CGE1.

The second transistor CTR2 has a gate electrode CGE2, a source area CS2, and a drain area CD2. The gate electrode CGE2 is formed so as to cross the second element forming area CEF2. The source area CS2 is formed in a part of the second element forming area CEF2, which is located on the (negative) side of the X direction with respect to the gate electrode CGE2, and the drain area CD2 is formed in a part of the second element forming area CEF2, which is located on the (positive) side of the X direction with respect to the gate electrode CGE2.

A stress liner film CLN and an interlayer oxide film CIL are formed so as to cover the first transistor CTR1 and the second transistor CTR2. Plugs CPG are formed so as to penetrate the interlayer oxide film CIL or the like. A plurality of wirings CW are formed over the surface of the interlayer oxide film CIL.

A method of manufacturing the semiconductor device according to the comparative example will next be described. First, the first element forming area CEF1 and the second element forming area CEF2 are defined by forming the element isolation insulating film CEL in the surface of the semiconductor substrate CSUB (refer to FIG. 15).

A gate oxide film CGS is formed in each of the first element forming area CEF1 and the second element forming area CEF2 by performing thermal oxidation processing or the like. A polysilicon film CPSF is formed so as to cover the gate oxide film CGS. Next, a photoresist CRES is applied over the surface of the polysilicon film CPSF (refer to FIG. 17).

Next, gate wirings are formed by double patterning. First, as shown in FIG. 17, the photoresist CRES is exposed using a first mask CMSK1. At this time, a pattern corresponding to a gate electrode CGEA is included in the first mask CMSK1. The pattern is photoengraved in the photoresist CRES which covers the element forming area CEF1.

Next, as shown in FIG. 18, the photoresist CRES is exposed using a second mask CMSK2. At this time, a pattern corresponding to a gate electrode CGEB is included in the second mask CMSK2. The pattern is photoengraved in the photoresist CRES which covers the element forming area CEF2.

Next, as shown in FIG. 19, resist patterns CRP each including resist patterns CRP1 and CRP2 are formed by performing development processing on the photoresist CRES. The resist pattern CRP1 is a resist pattern photoengraved by the first mask CMSK1. The resist pattern CRP2 is a resist pattern photoengraved by the second mask CMSK2.

Next, gate wirings CGH1 and CGH2 are formed, as shown in FIG. 20, by performing etching processing on the polysilicon film CPSF with the resist patterns CRP as etching masks. Incidentally, in FIG. 20, gate wirings other than the gate wirings CGH1 and CGH2 are omitted for convenience of explanation. Thereafter, source areas CS1 and CS2, drain areas CD1 and CD2, a stress liner film CLN, an interlayer oxide film CIL, plugs CPG, and wirings CW are formed, thereby leading to the completion of the semiconductor device according to the comparative example shown in FIGS. 15 and 16.

In the transistors formed with the gate electrodes (gate wirings) by double patterning, alignment deviations may occur in both of the first and second masks. FIG. 21 shows, for example, the gate wiring CGH1 where the alignment of the first mask is deviated in the X direction (negative) from a predetermined position, and the gate wiring CGH2 where the alignment of the second mask is deviated in the X direction (positive) from a predetermined position.

Figure 22:
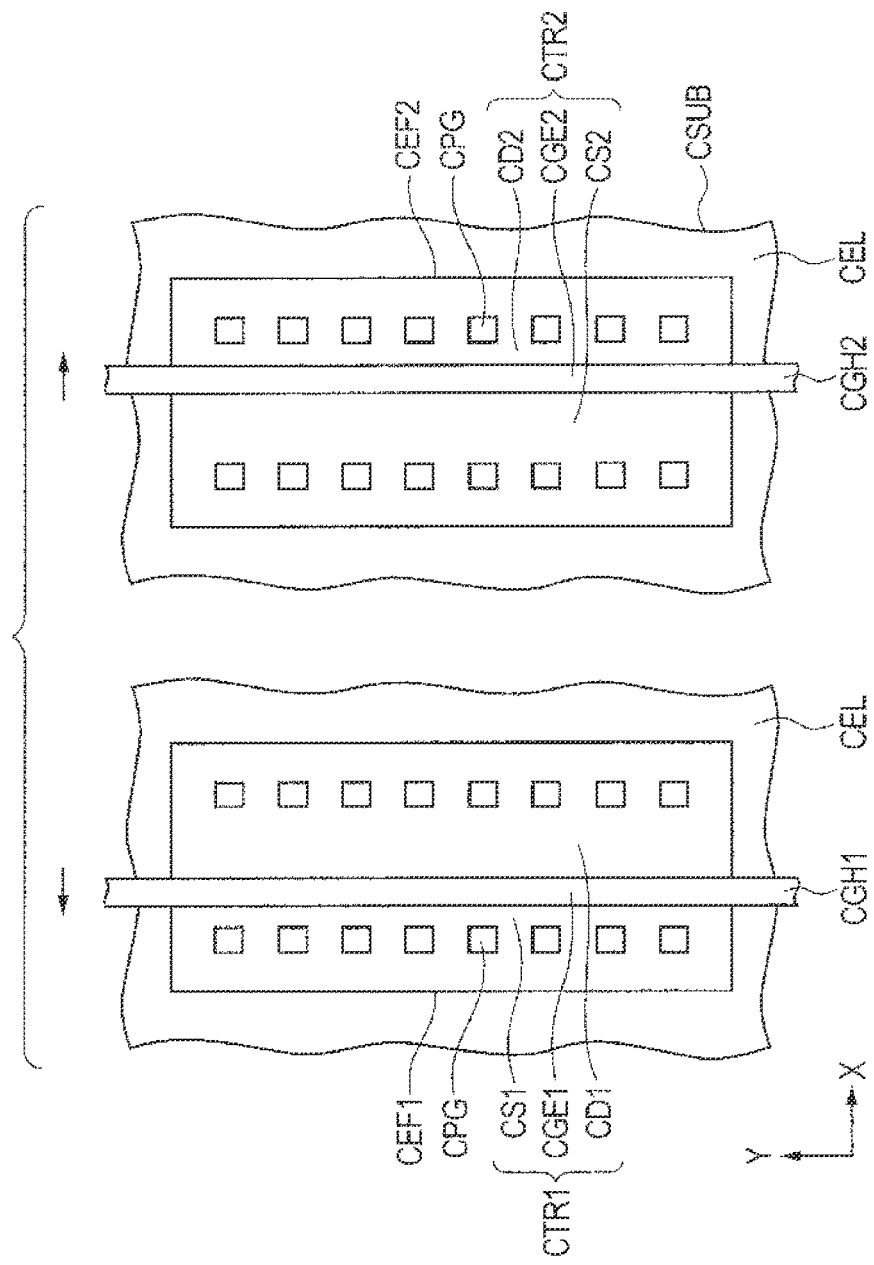
FIG. 22 is a plan diagram showing the semiconductor device according to the comparative example in the case shown in FIG. 21.

After the formation of such gate wirings CGH1 and CGH2, in the semiconductor device formed with the first transistor CTR1 and the second transistor CTR2 as shown in FIG. 22, different transistor characteristics are shown in the first transistor CTR1 and the second transistor CTR2. As parameters for determining the transistor characteristics, may be mentioned five parameters of the source-drain diffusion capacitance, the contact-gate capacitance, stress of the element isolation insulating film, the formation of the stress liner film, and the distance between the adjacent gate electrodes.

The source-drain diffusion capacitance corresponds to the capacitance between the source area and the semiconductor substrate, and the capacitance between the drain area and the semiconductor substrate. With a positional deviation in the gate wiring (gate electrode), the area of a portion where the source (drain) area and the semiconductor substrate contact each other changes so that the source-drain diffusion capacitance varies, thereby affecting the operating speed of the transistor.

The contact-gate capacitance corresponds to the capacitance between the contact (plug) and the gate electrode. With a positional deviation in the gate wiring (gate electrode), the distance between the plug and the gate electrode changes so that the capacitance between the contact and the gate is varied.

The stress of the element isolation insulating film is stress that the element isolation insulating film has. With the positional deviation in the gate wiring (gate electrode), the distance from the gate electrode to the element isolation insulating film is changed and stress received by the element forming area is varied, thereby affecting the driving capability of the transistor.

With the formation of the stress liner film, stress acts on the element forming area to distort a crystal lattice and change the mobility of carriers. With the positional deviation in the gate wiring (gate electrode), the distance from the stress liner film to the element isolation insulating film is changed and the mobility of carriers is varied, thereby affecting the driving capability of the transistor.

The distance between the adjacent gate electrodes changes when the positions of the gate wirings (gate electrodes) are shifted. Thus, stress that acts on the element forming area is varied, thereby affecting the driving capability of the transistor.

Now assume where the first transistor CTR1 and the second transistor CTR2 both shown in FIG. 22 respectively correspond to, for example, an n channel type transistor and a p channel type transistor in one inverter circuit. By doing so, the gate electrode of the n channel type transistor is deviated in the X direction (negative) from a desired position, and the gate electrode of the p channel type transistor is deviated in the X direction (positive) from a desired position. Thus, the operating speed and driving capability or the like of each of the n channel type transistor and the p channel type transistor are varied so that the characteristics of the inverter circuit is changed.

Figure 23:
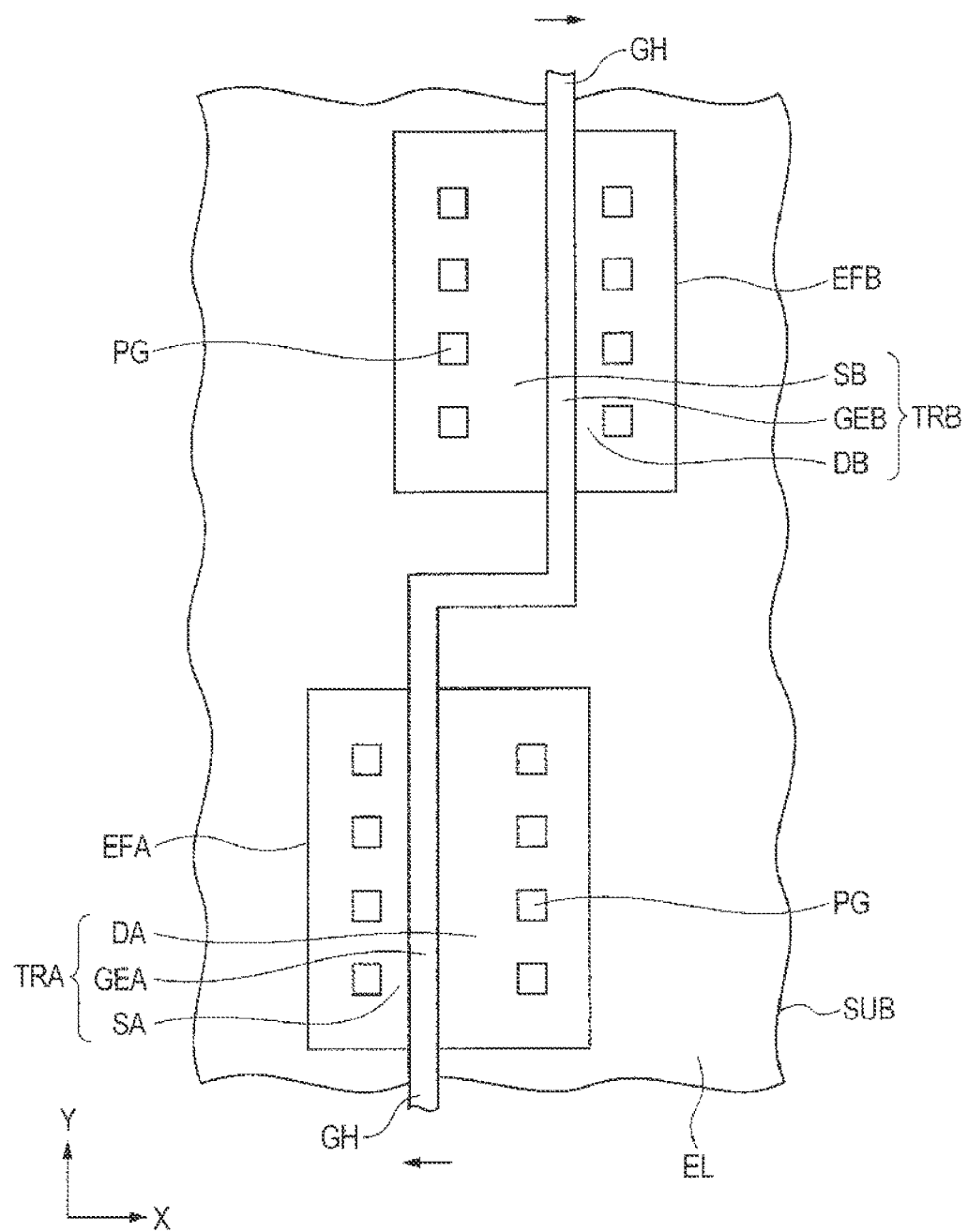
FIG. 23 is a plan diagram showing the semiconductor device where alignment deviations occur in the process shown in FIGS. 6A and 6B and 7A and 7B in the same embodiment.

In the semiconductor device according to the embodiment with respect to the semiconductor device according to such a comparative example, as shown in FIG. 23, one transistor is two-divided into a first transistor TRA and a second transistor TRB. A gate electrode GEA is formed based on a first mask, and a gate electrode GEB is formed based on a second mask. Thus, even if the gate electrodes GEA and GEB are formed deviated from a predetermined position, it is possible to reduce variations in transistor characteristics due to the positional deviations. This will quantitatively be described by particularly taking, for example, the drain diffusion capacitance and the gate-contact capacitance.

Figure 24:
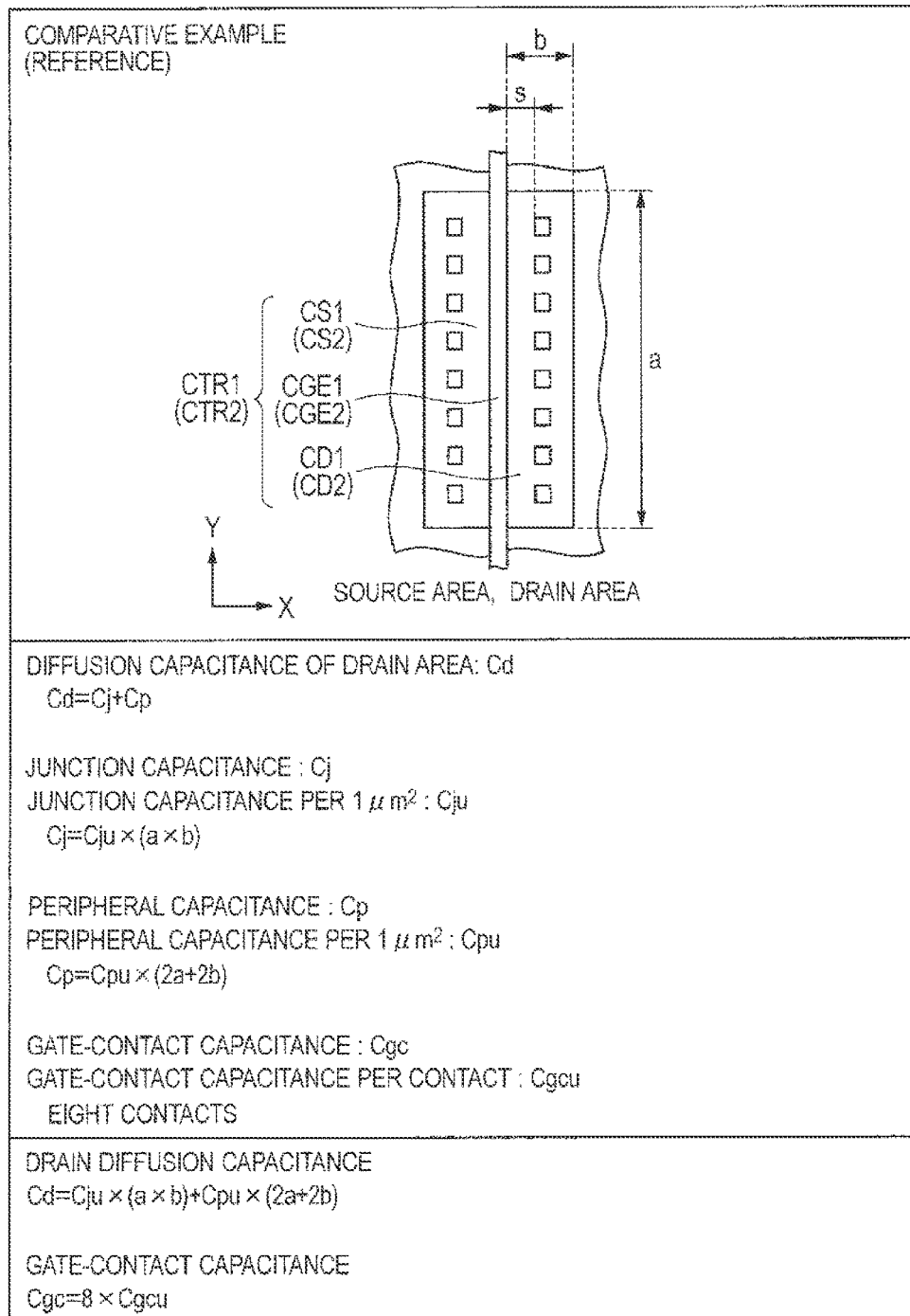
FIG. 24 a first diagram for describing an operative effect in the same embodiment, showing a drain diffusion capacitance and a gate-contact capacitance of the semiconductor device according to the comparative example.

First, as shown in FIG. 24, as to a drain area of a first (second) transistor CTR1 (CTR2) according to a comparative example (reference) in which a gate electrode CGE1 (CGE2) is formed in a desired position, the length in an X direction of an element forming area is assumed to be b, the length thereof in a Y direction is assumed to be a, and the length (distance) between a contact (plug) and the gate electrode CGE1 (CGE2) is assumed to be s.

Further, a diffusion capacitance of the drain area is assumed to be Cd, a junction capacitance is assumed to be Cj, a junction capacitance per unit area (1 μm$^2$) is assumed to be Cju, a peripheral capacitance is assumed to be Cp, a peripheral capacitance per unit length (1 μm) is assumed to be Cpu, a gate-contact capacitance is assumed to be Cgc, and a gate-contact capacitance per contact is assumed to be Cbcu.

Figure 25:
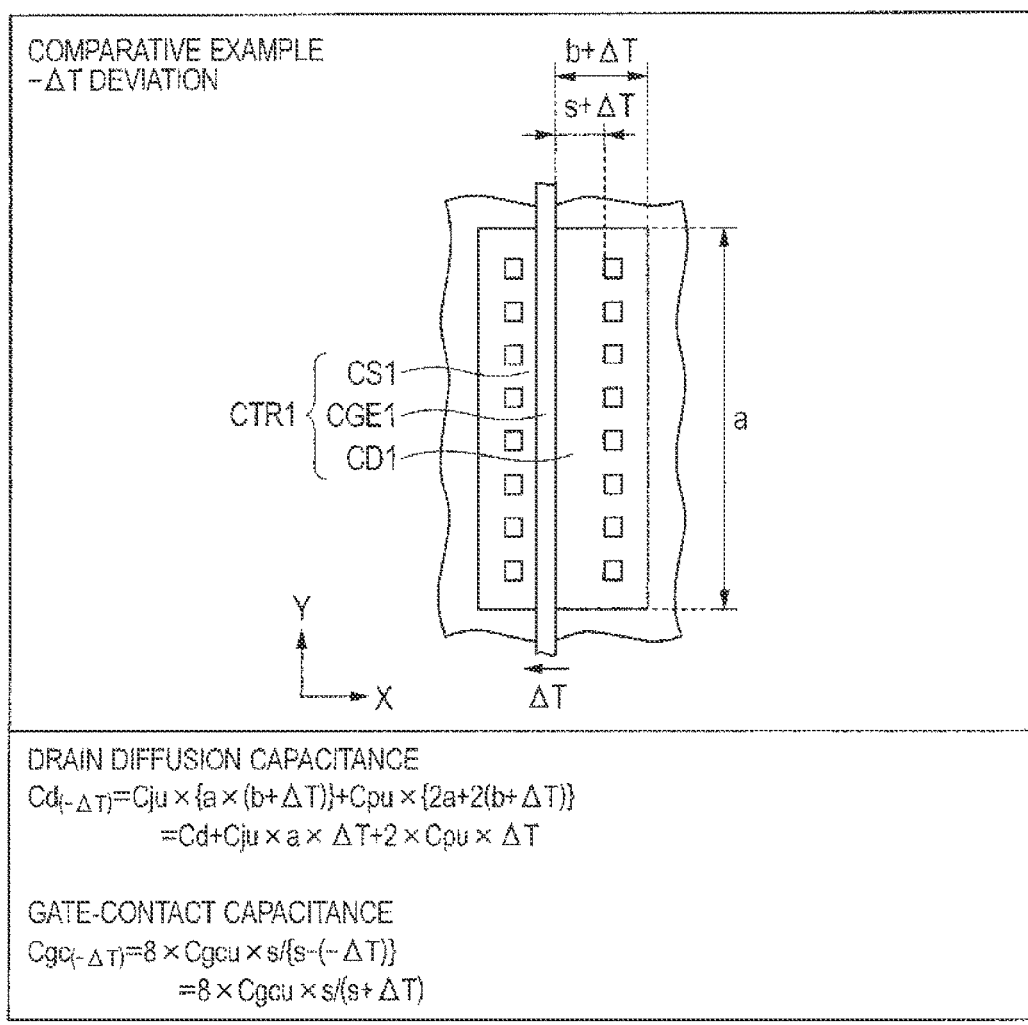
FIG. 25 is a second diagram for describing an operative effect in the same embodiment, showing a drain diffusion capacitance and a gate-contact capacitance of the semiconductor device according to the comparative example.

Then, the drain diffusion capacitance Cd is expressed by the following equation. Cd=Cju×(a×b)+Cpu×(2a+2b). Further, the gate-contact capacitance Cgc is expressed by the following equation:

Cgc=8×Cgcu. Next, assume where the gate electrode CGE1 of the first transistor CTR1 is deviated by −ΔT in the X direction due to a deviation in the alignment of the first mask as shown in FIG. 25. In this case, the drain diffusion capacitance $CD_{(-\Delta T)}$ is expressed by the following equation:
$Cd_{(-\Delta T)}$=Cd+Cju×a×ΔT+2×Cpu×ΔT. As expressed in the above equation, the drain diffusion capacitance $CD_{(-\Delta T)}$ corresponds to the result of addition of capacitances dependent on the deviation (ΔT) to the drain diffusion capacitance Cd in the comparative example taken as the reference.

Further, the gate-contact capacitance $Cgc_{(-\Delta T)}$ is expressed by the following equation. $Cgc_{(-\Delta T)}$=8×Cgcu×s/(s+ΔT). As expressed in the above equation, the gate-contact capacitance $Cgc_{(-\Delta T)}$ is subjected to a variation dependent on $\Delta T$ with respect to the gate-contact capacitance Cgc in the comparative example taken as the reference.

Figure 26:
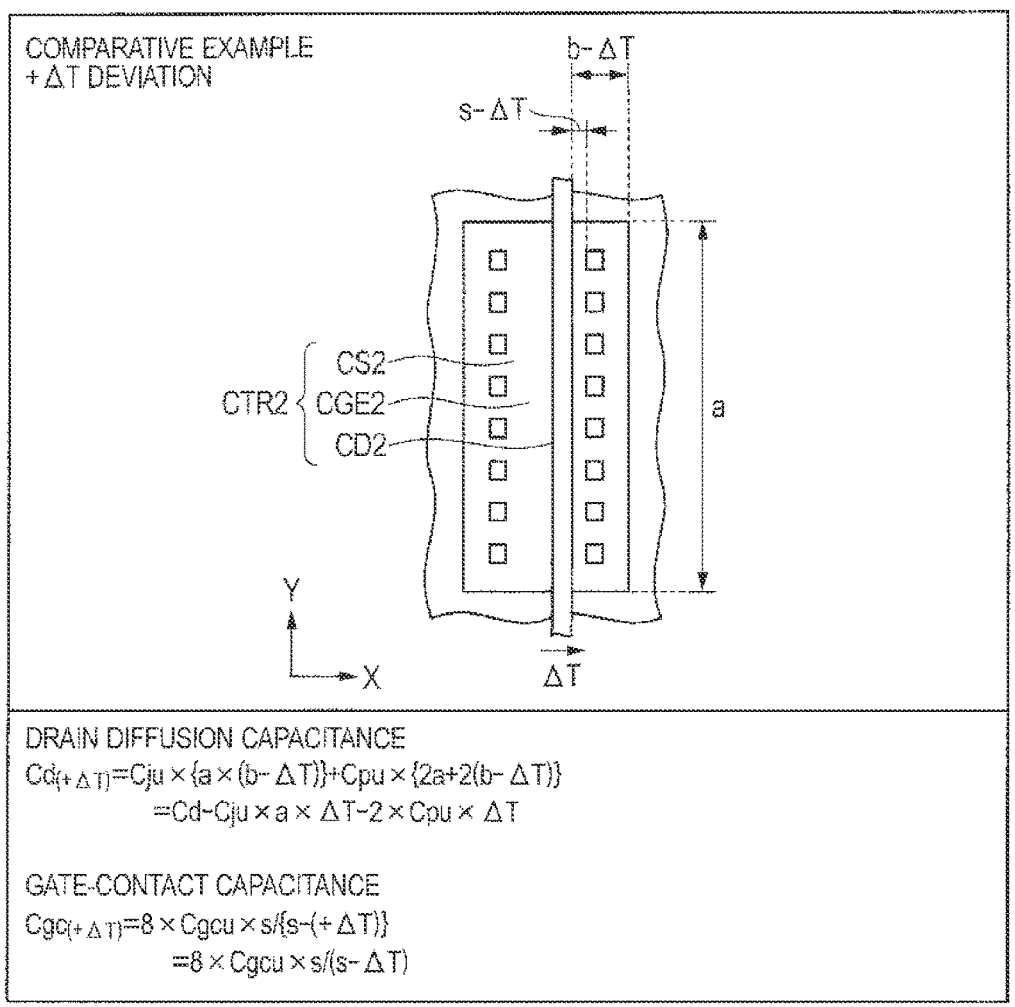
FIG. 26 is a third diagram for describing an operative effect in the same embodiment, showing a drain diffusion capacitance and a gate-contact capacitance of the semiconductor device according to the comparative example.

Next, assume where the gate electrode CGE2 of the second transistor CTR2 is deviated by $+\Delta T$ in the X direction due to a deviation in the alignment of the second mask as shown in FIG. 26. In this case, the drain diffusion capacitance $CD_{(+\Delta T)}$ is expressed by the following equation:

$Cd_{(+\Delta T)} = Cd - Cju \times a \times \Delta T - 2 \times Cpu \times \Delta T$. As expressed in the above equation, the drain diffusion capacitance $CD_{(+\Delta T)}$ corresponds to the result of subtraction of capacitances dependent on the deviation ($\Delta T$) from the drain diffusion capacitance Cd in the comparative example taken as the reference.

Further, the gate-contact capacitance $Cgc_{(+\Delta T)}$ is expressed by the following equation. $Cgc_{(+\Delta T)} = 8 \times Cgcu \times s/(s-\Delta T)$. As expressed in the above equation, the gate-contact capacitance $Cgc_{(+\Delta T)}$ is subjected to a variation dependent on $\Delta T$ with respect to the gate-contact capacitance Cgc in the comparative example taken as the reference.

Figure 27:
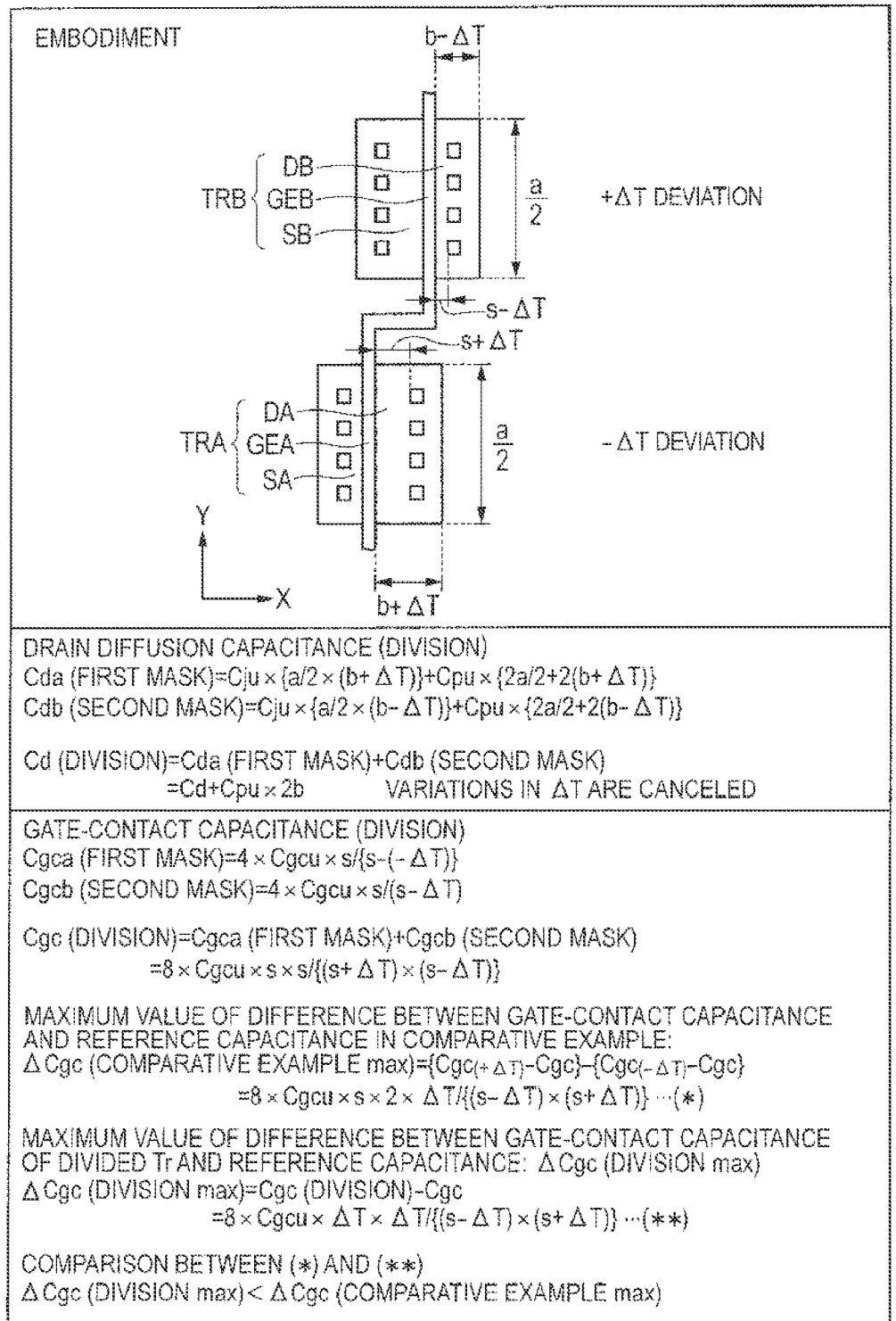
FIG. 27 is a diagram for describing an operative effect in the same embodiment, showing a drain diffusion capacitance and a gate-contact capacitance of the semiconductor device.

A description will next be made about the semiconductor device according to the embodiment. As shown in FIG. 27, assume where the gate electrode GEA of the first transistor TRA is deviated by $-\Delta T$ in the X direction, and the gate electrode GEB of the second transistor TRB is deviated by $+\Delta T$ in the X direction. The first transistor TRA and the second transistor TRB correspond to transistors obtained by equally dividing the first (second) transistor CTR1 (CTR2) into two in its gate width direction. The lengths in the Y direction of their element forming areas become a/2.

Here, the diffusion capacitance of the drain area of the first transistor TRA is assumed to be Cda (first mask), the diffusion capacitance of the drain area of the second transistor TRB is assumed to be Cdb (second mask), and the diffusion capacitance of the combined first transistor TRA and second transistor TRB as one transistor is assumed to be Cd (division). Further, the gate-contact capacitance of the first transistor TRA is assumed to be Cgca, the gate-contact capacitance of the second transistor TRB is assumed to be Cgcb, and the gate-contact capacitance of the combined first and second transistors TRA and TRB as one transistor is assumed to be Cgc (division).

Then, the drain diffusion capacitance Cd (division) is expressed by the following equation. Cd (division)=Cd+Cpu×2b. It is understood that as expressed in the above equation, the capacitance dependent on the deviation $\Delta T$ is not formed by dividing one transistor into the first transistor TRA and the second transistor TRB, so that a variation in the drain diffusion capacitance can be suppressed.

Further, the gate-contact capacitance Cgc (division) is expressed by the following equation. Cgc (division)=8×Cgcu×s×s/{(s+$\Delta T$)×(s-$\Delta T$)}. The maximum value of the difference between the gate-contact capacitance and the reference capacitance in the semiconductor device according to the comparative example is assumed to be $\Delta$Cgc (comparative examplemax), and the maximum value of the difference between the gate-contact capacitance and the reference capacitance in the semiconductor device according to the embodiment is assumed to be $\Delta$Cgc (divisionmax).

Then, the following relation is obtained between $\Delta$Cgc (divisionmax) and $\Delta$Cgc (comparative examplemax).

$\Delta$Cgc (divisionmax)<$\Delta$Cgc (comparative examplemax). It is understood that as expressed in the above equation, one transistor is divided into the first transistor TRA and the second transistor TRB, so that the gate-contact capacitance can be suppressed as compared with the case of one transistor.

As described above, in the semiconductor device according to the embodiment with respect to the semiconductor device according to the comparative example, it is understood that one transistor is divided into the two transistors of the first transistor TRA and the second transistor TRB to thereby make it possible to suppress the variation in the drain diffusion capacitance with respect to the positional deviation and suppress the gate-contact capacitance. Further, it is understood that when symmetry is taken into consideration, this tendency can be said to be similar even about the source area, and hence the source diffusion capacitance and the gate-contract capacitance can be suppressed.

Further, variations in stress can be suppressed by dividing the single first (second) transistor CTR1 (CTR2) into the first transistor TRA and the second transistor TRB. That is, even if the gate electrodes GEA and GEB are deviated in position, variations in stress received by the first element forming area EFA and the second element forming area FEB can be suppressed by the element isolation insulating film EL and the stress liner film LN as compared with the case where the gate electrode CGE1 (CGE2) is deviated in position. Thus, it is possible to uniformize the driving capability of each of the first transistor TRA and the second transistor TRB.

Incidentally, while the above-described semiconductor device has been describe by taking, for example, the case where the single first (second) transistor CTR1 (CTR2) is two-divided into the first transistor TRA and the second transistor TRB in the width direction of the gate electrode, it may be divided equally into three or more.

Second Embodiment

A description will be made herein about a semiconductor device equipped with transistors coupled in series.

Figure 28:
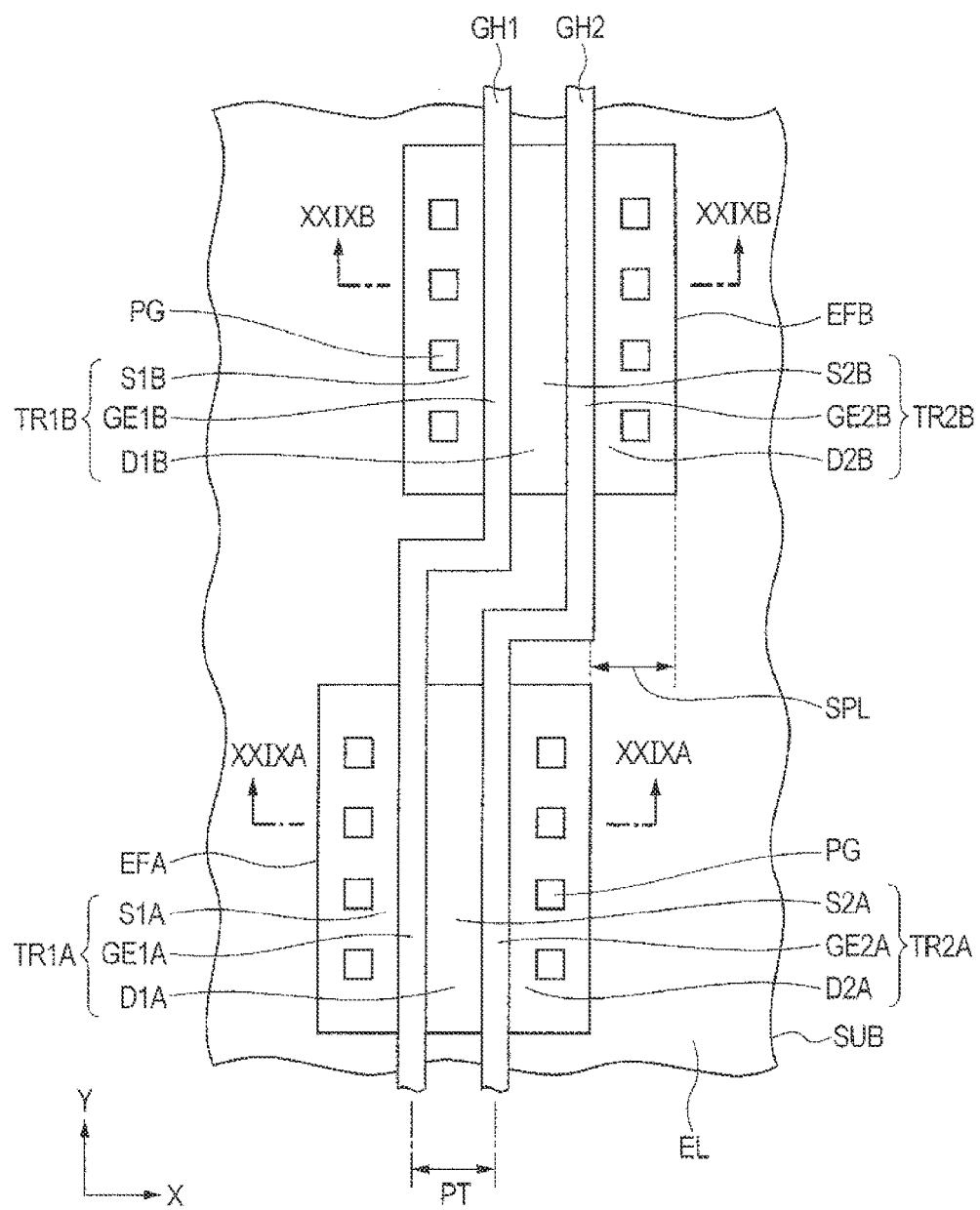
FIG. 28 is a plan diagram showing a semiconductor device according to a second embodiment.
Figure 29B:
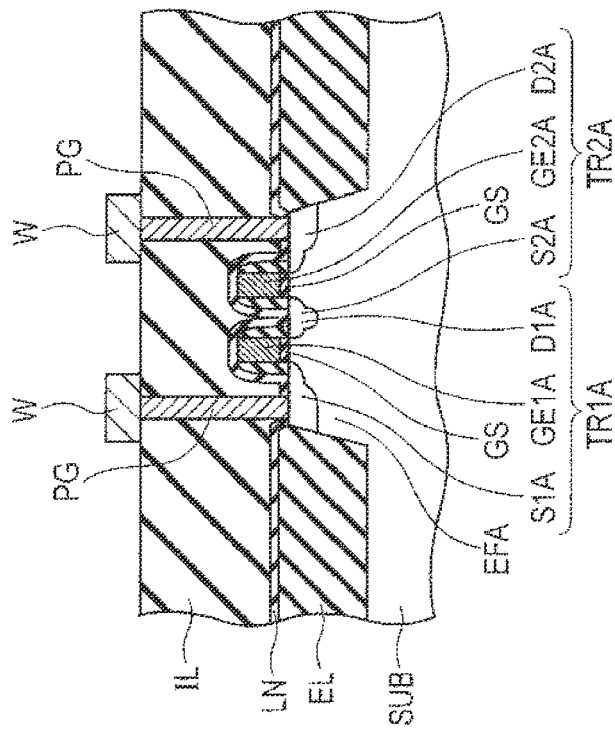
Figure 29A:
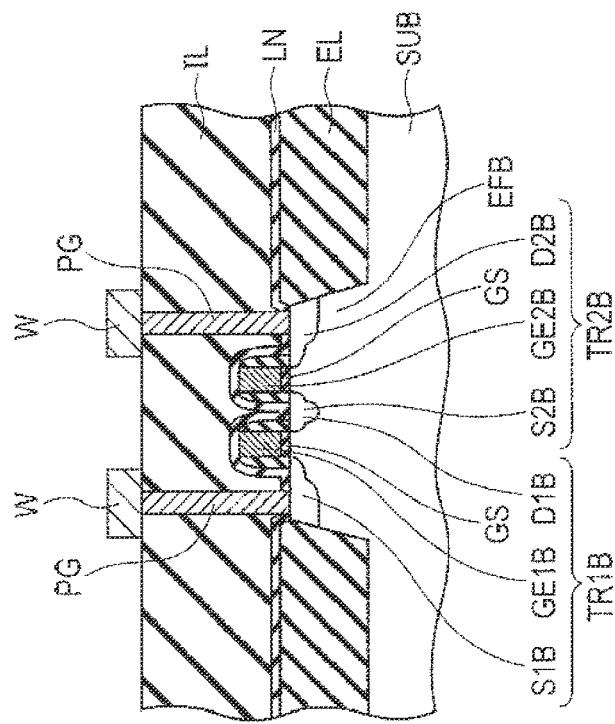

As shown FIGS. 28 and 29, one of the two transistors coupled in series is divided into a first transistor TR1A and a second transistor TR1B. The other thereof is divided into a first transistor TR2A and a second transistor TR2B. The first transistor TR1A and the first transistor TR2A are formed in an element forming area EFA. The second transistor TR1B and the second transistor TR2B are formed in an element forming area EFB.

The first transistor TR1A has a gate electrode GE1A, a source area S1A, and a drain area D1A. The second transistor TR1B has a gate electrode GE1B, a source area S1B, and a drain area D1B. The first transistor TR2A has a gate electrode GE2A, a source area S2A, and a drain area D2A. The second transistor TR2B has a gate electrode GE2B, a source area S2B, and a drain area D2B.

The gate electrode GE1A and the gate electrode GE1B are coupled to each other and respectively form part of a gate wiring GH1. The gate electrode GE2A and the gate electrode GE2B are coupled to each other and respectively form part of a gate wiring GH2. The gate electrodes GE1A, GE1B, GE2A, and GE2B are formed by double patterning. For example, the gate electrodes GE1A and GE2B are formed based on a pattern of one mask, and the gate electrodes GE2A and GE1B are formed based on a pattern of another mask.

Further, the first element forming area EFA and the second element forming area EFB are set to the same size (length in an X direction and length in a Y direction). The first element forming area EFA and the second element forming area EFB are arranged deviated from each other by a length SPL corresponding to the minimum pitch PT between the gate wirings GH1 and GH2 in the X direction orthogonal to the Y direction in which the gate wirings GH1 and GH2 extend. Incidentally, since the present semiconductor device is similar in configuration other than the above to the semiconductor device shown in FIGS. 1 and 2, the same members are respectively given the same reference numerals, and their description will not be repeated unless otherwise required.

Figure 30A:
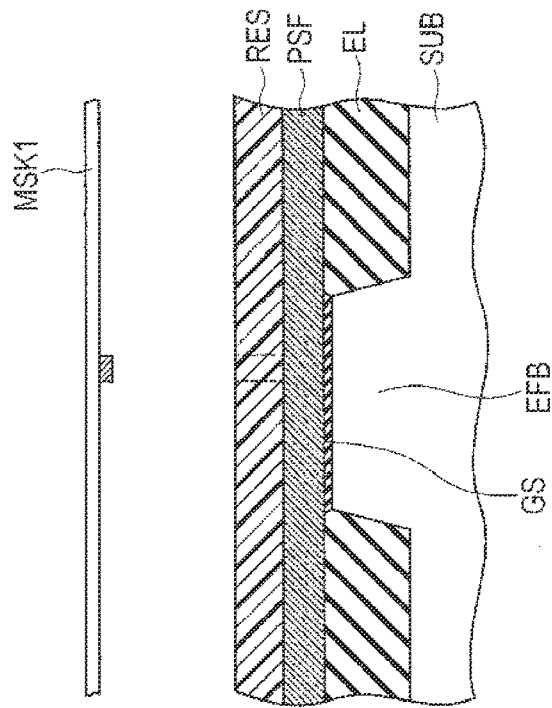
Figure 30B:
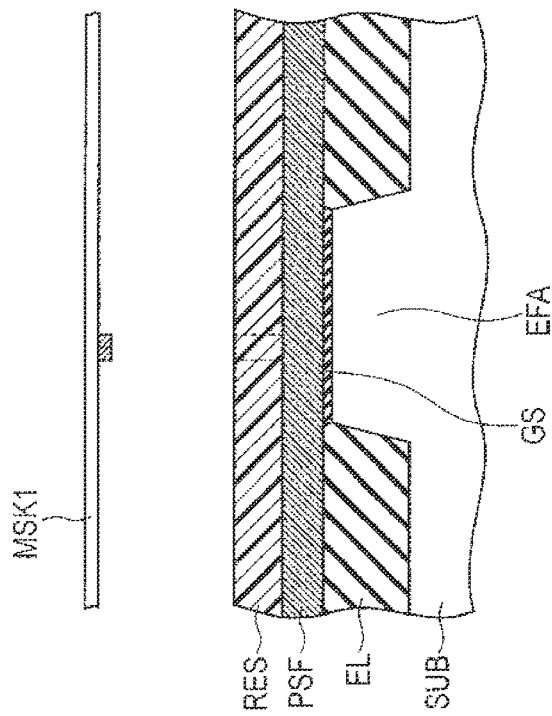

A description will next be made about one example of a manufacturing method of the semiconductor device described above. First, after going through processes similar to the processes shown in FIGS. 3 through 5, gate wirings (gate electrodes) are formed by double patterning. As shown in FIG. 30, a photoresist RES is exposed using a first mask MSK1. At this time, patterns (light shielding film) corresponding to predetermined plural gate electrodes (gate wirings) are formed in the first mask MSK1. A pattern corresponding to the gate electrode GE1A and a pattern corresponding to the gate electrode GE2B are included herein. Their patterns are photoengraved in the photoresist RES which covers the first element forming area EFA and the second element forming area EFB.

Next, as shown in FIG. 31, the photoresist RES is exposed using a second mask MSK2. At this time, patterns (light shielding film) corresponding to other predetermined plural gate electrodes (gate wirings) are formed in the second mask MSK2. A pattern corresponding to the gate electrode GE2A and a pattern corresponding to the gate electrode GE1B are included herein. Their patterns are photoengraved in the photoresist RES which covers the first element forming area EFA and the second element forming area EFB.

Next, as shown in FIG. 32, resist patterns RP each including resist patterns RP1 and RP2 are formed by performing development processing on the photoresist RES. The resist pattern RP1 is a resist pattern photoengraved by the first mask MSK1. The resist pattern RP2 is a resist pattern photoengraved by the second mask MSK2. Next, gate wirings GH1 and GH2 (refer to FIG. 33) are formed by performing etching processing on a polysilicon film PSF with the resist pattern RP as an etching mask.

Figure 33:
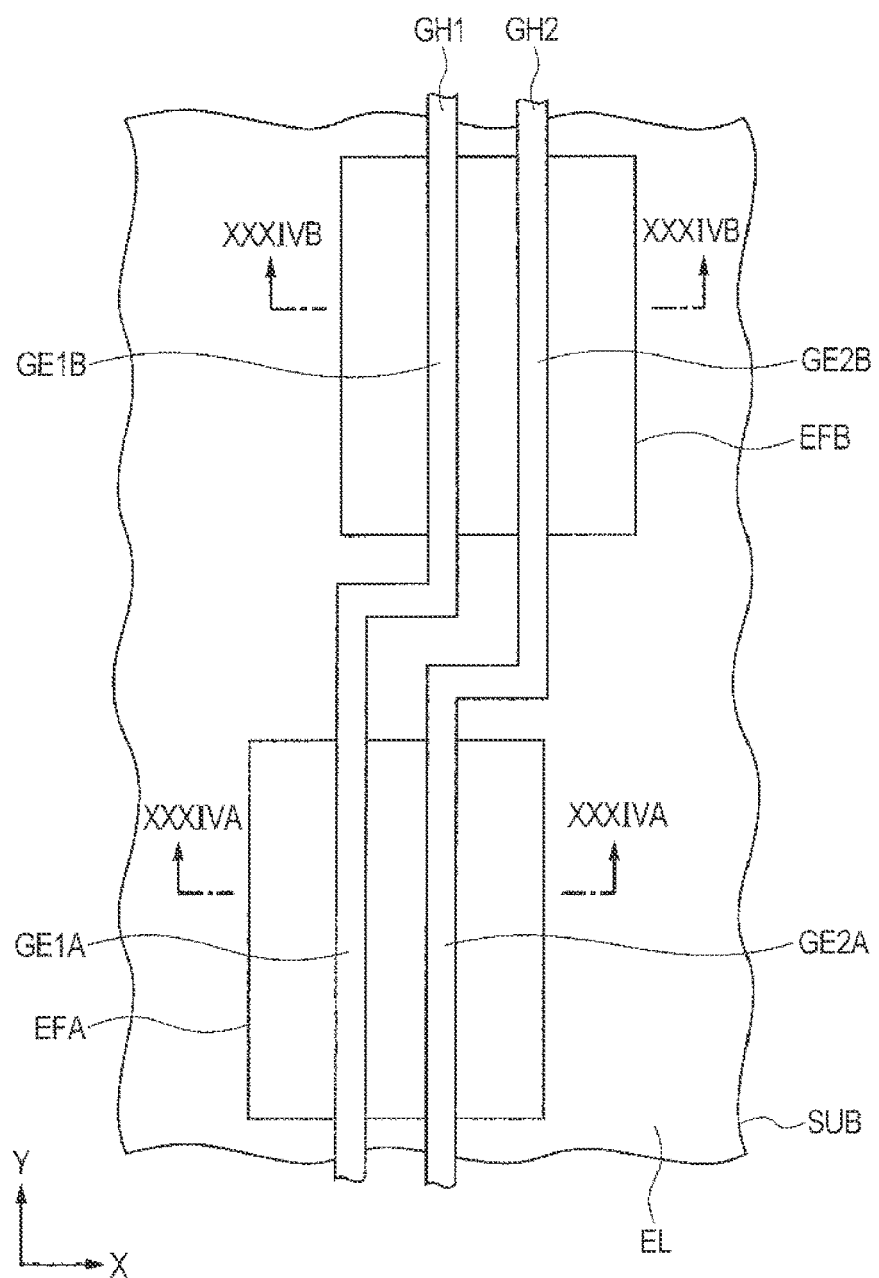
FIG. 33 is a plan diagram showing a process carried out after the process shown in FIGS. 32A and 32B in the same embodiment.
Figure 34:
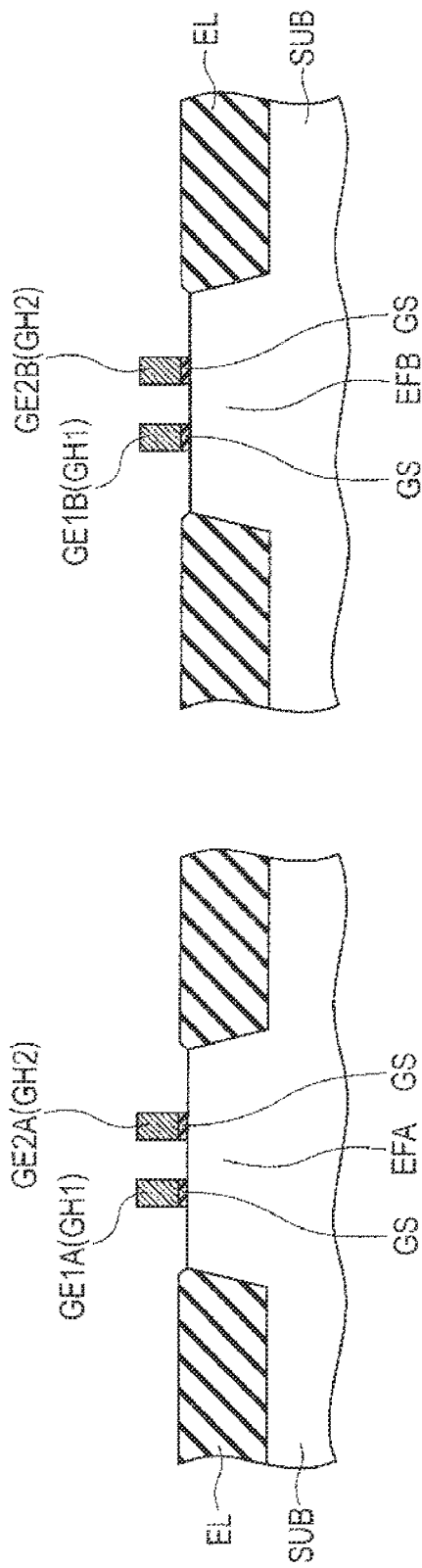

Thereafter, the gate wirings GH1 and GH2 are exposed as shown in FIGS. 33 and 34 by removing the resist pattern RP. In the gate wiring GH1, a portion thereof which crosses the first element forming area EFA serves as the gate electrode GE1A, and a portion thereof which crosses the second element forming area EFB serves as the gate electrode GE1B. Further, in the gate wiring GH2, a portion thereof which crosses the first element forming area EFA serves as the gate electrode GE2A, and a portion thereof which crosses the second element forming area EFB serves as the gate electrode GE2B. Thereafter, after going through processes similar to the processes shown in FIGS. 11 through 14, the main part of the semiconductor device shown in FIGS. 28 and 29 is completed.

Figure 35:
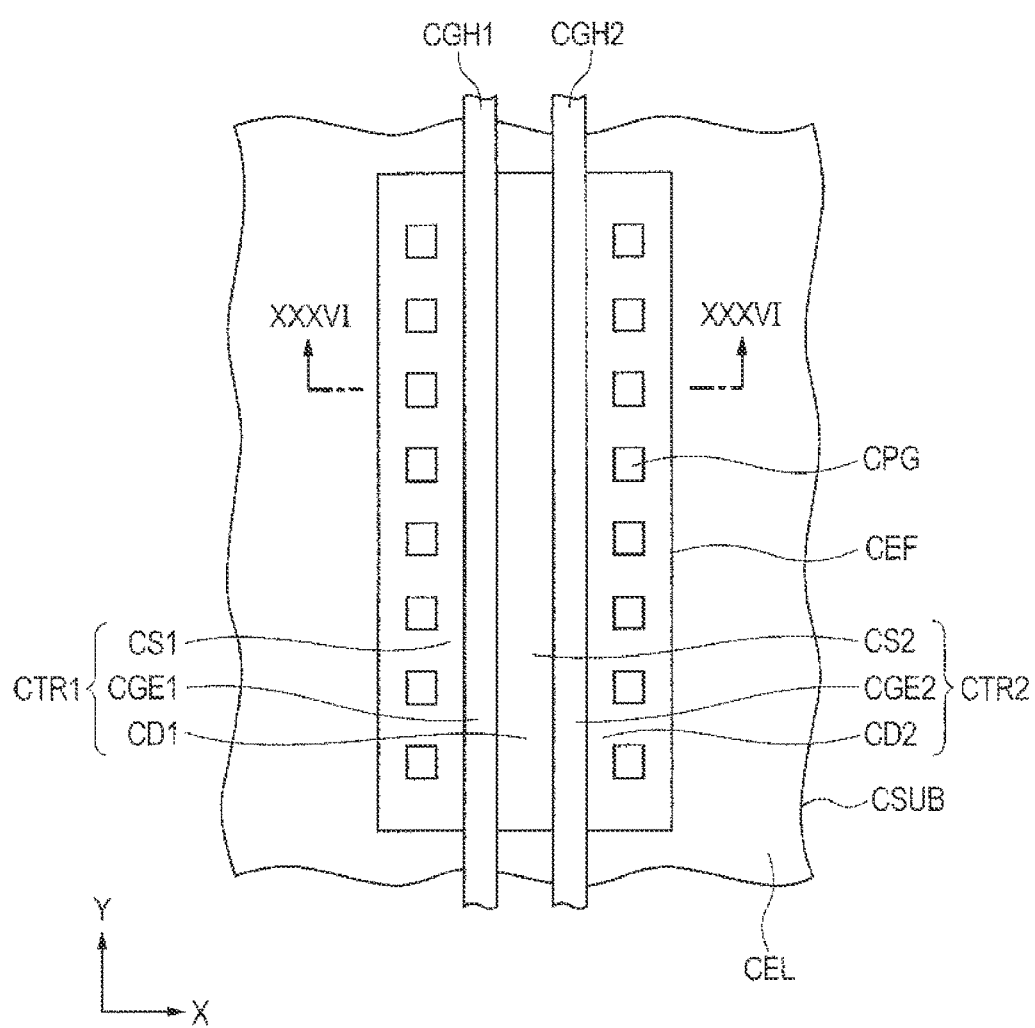
FIG. 35 is a plan diagram showing a semiconductor device according to another comparative example.
Figure 36:
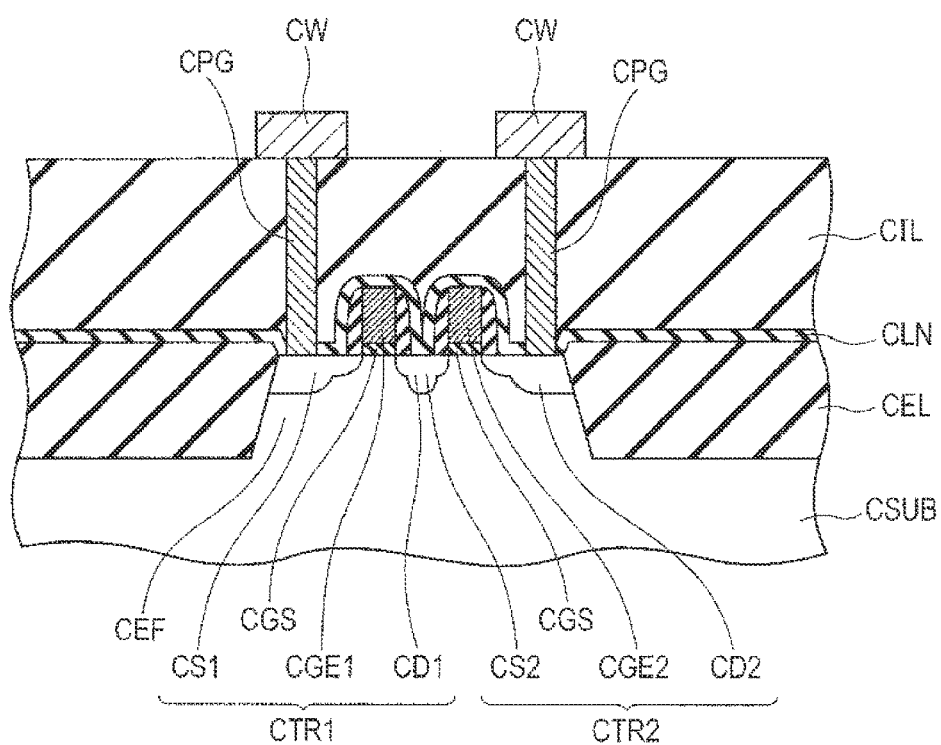
FIG. 36 is a sectional diagram taken along sectional line XXXVI-XXXVI shown in FIG. 35.

A description will next be made about a semiconductor device according to another comparative example, which is equipped with transistors coupled in series. As shown in FIGS. 35 and 36, a first transistor CTR1 and a second transistor CTR2 coupled in series are formed in an element forming area CEF. The first transistor CTR1 has a gate electrode CGE1, a source area CS1, and a drain area CD1. The second transistor CTR2 has a gate electrode CGE2, a source area CS2, and a drain area CD2. Incidentally, since the present semiconductor device is similar in configuration other than the above to the semiconductor device according to the comparative example shown in FIGS. 15 and 16, the same members are respectively given the same reference numerals, and their description will not be repeated unless otherwise required.

The semiconductor device according to another comparative example described above is formed through the processes similar to the manufacturing method of the semiconductor device according to the comparative example shown in FIGS. 15 and 16 other than the case where the patterns of the masks for forming the gate wirings are different in alignment.

In the semiconductor device according to another comparative example, a pattern corresponding to the gate electrode CGE1 (gate wiring CGH1) is photoengraved by performing exposure using a first mask (not shown). A pattern corresponding to the gate electrode CGE2 (gate wiring CGH2) is photoengraved by performing exposure using a second mask (not shown).

At this time, there is a case where the gate electrodes (gate wirings) are deviated in position due to a deviation in the alignment of the first mask and a deviation in the alignment of the second mask. A description will now be made about typical examples of the alignment of the gate electrodes which have caused positional deviations.

Figure 37:
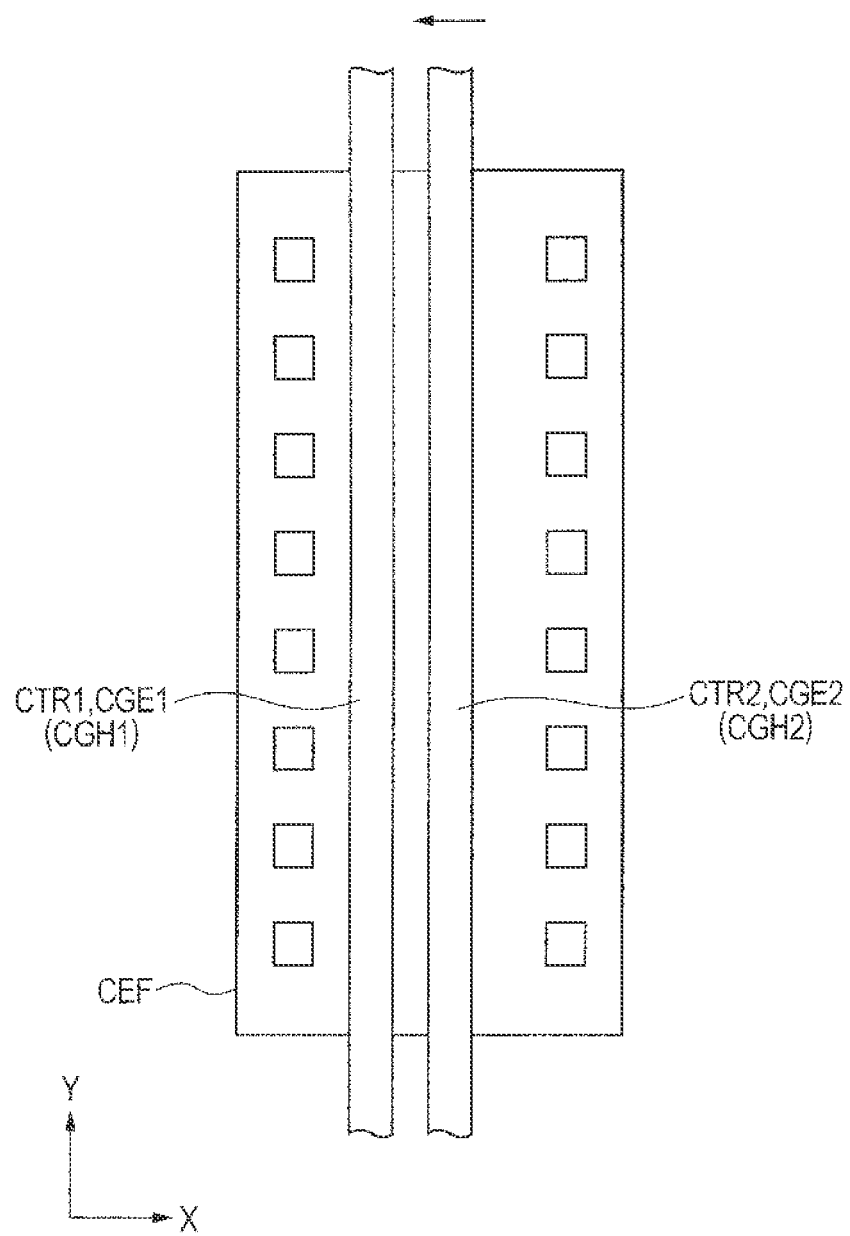
FIG. 37 is a first plan diagram showing an alignment relationship between gate electrodes where an alignment deviation occurs in the semiconductor device according to another comparative example.
Figure 38:
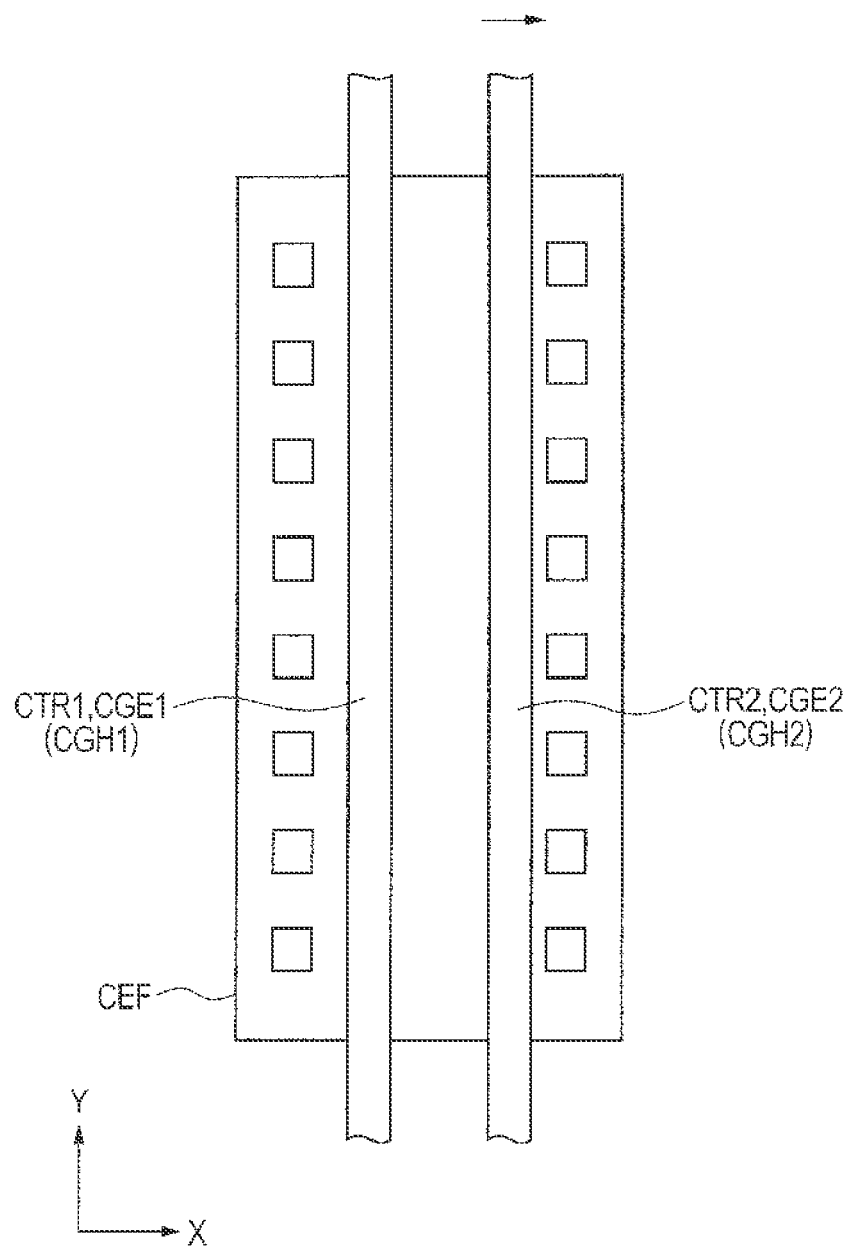
FIG. 38 is a second plan diagram showing an alignment relationship between the gate electrodes where an alignment deviation occurs in the semiconductor device according to another comparative example.

FIG. 37 shows an alignment relationship between the gate electrodes CGE1 and CGE2 particularly where the gate electrode CGE2 (second mask) is deviated in the X direction (negative). FIG. 38 shows an alignment relationship between the gate electrodes CGE1 and CGE2 particularly where the gate electrode CGE2 (second mask) is deviated in the X direction (positive).

Figure 39:
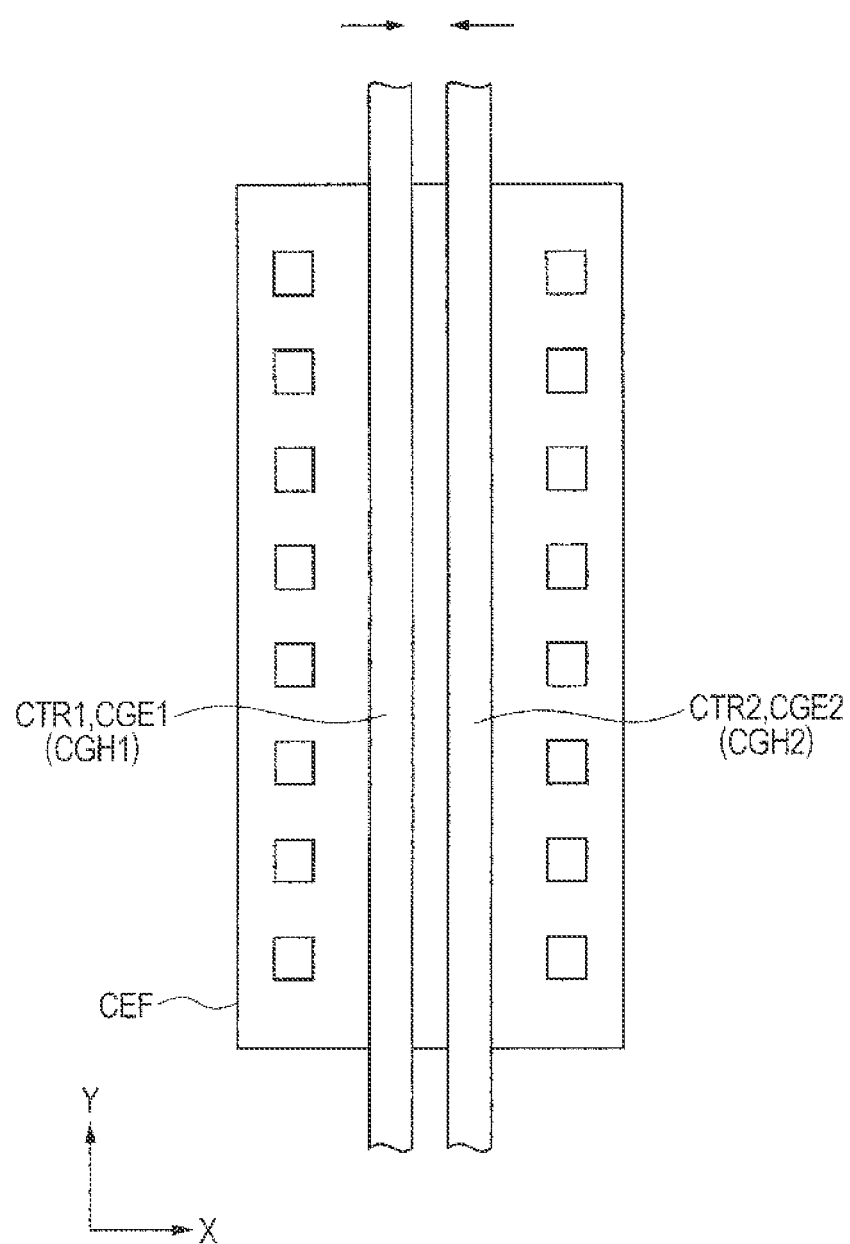
FIG. 39 is a third plan diagram showing an alignment relationship between the gate electrodes where alignment deviations occur in the semiconductor device according to another comparative example.
Figure 40:
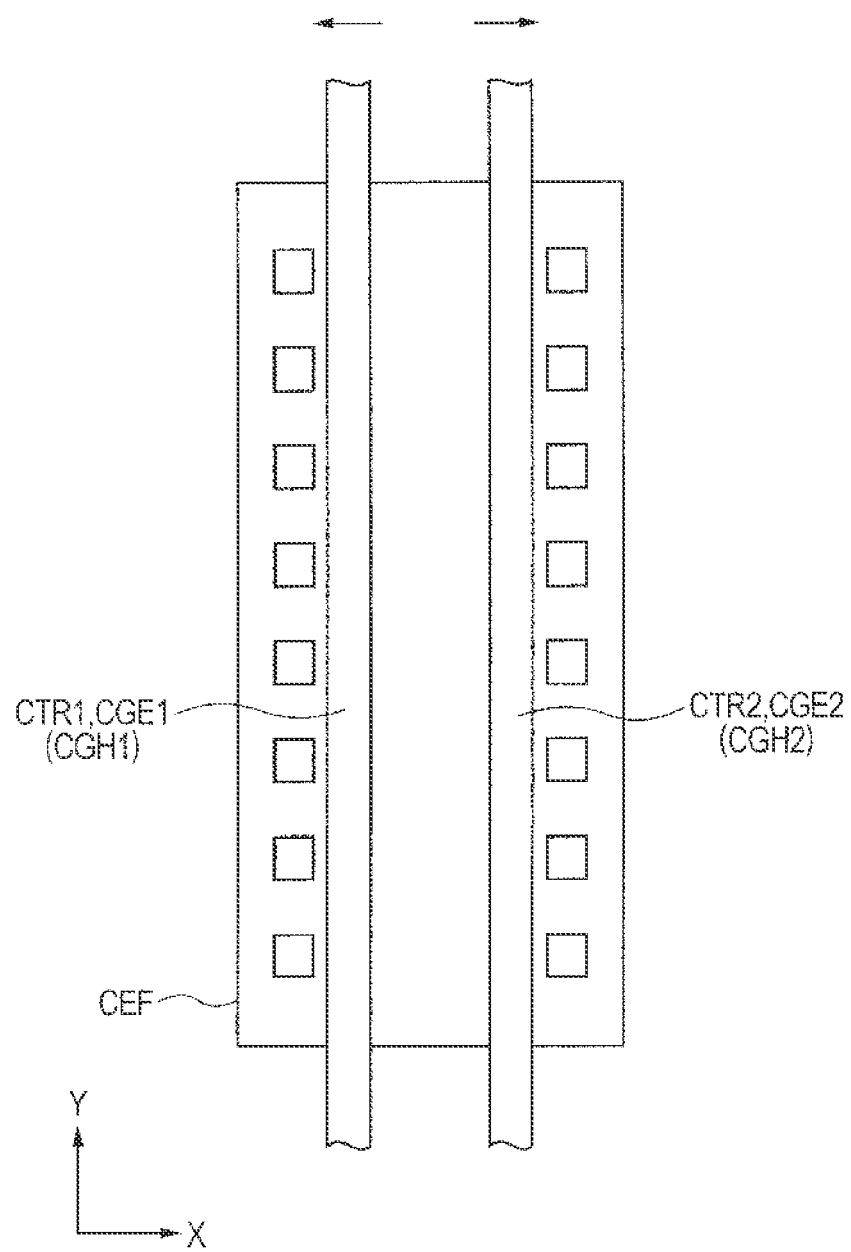
FIG. 40 is a fourth plan diagram showing an alignment relationship between the gate electrodes where alignment deviations occur in the semiconductor device according to another comparative example.

FIG. 39 shows an alignment relationship between the gate electrodes CGE1 and CGE2 where the gate electrode CGE1 (first mask) is deviated in the X direction (positive), and the gate electrode CGE2 (second mask) is deviated in the X direction (negative). FIG. 40 shows an alignment relationship between the gate electrodes CGE1 and CGE2 where the gate electrode CGE1 (first mask) is deviated in the X direction (negative), and the gate electrode CGE2 (second mask) is deviated in the X direction (positive).

In the semiconductor device according to another comparative example shown in FIGS. 37 through 40, stress or the like which acts on each of the source-drain diffusion capacitance, the contact-gate capacitance, and the element forming area is varied by the gate wirings CGH1 and CGH2 being respectively formed deviated from a desired position, in a manner similar to the description about the semiconductor device according to the comparative example.

A description will next be made about the case where in the semiconductor device according to the embodiment with respect to the semiconductor device according to another comparative example, the gate wirings are deviated in position in a manner similar to the semiconductor device according to another comparative example.

Figure 41:
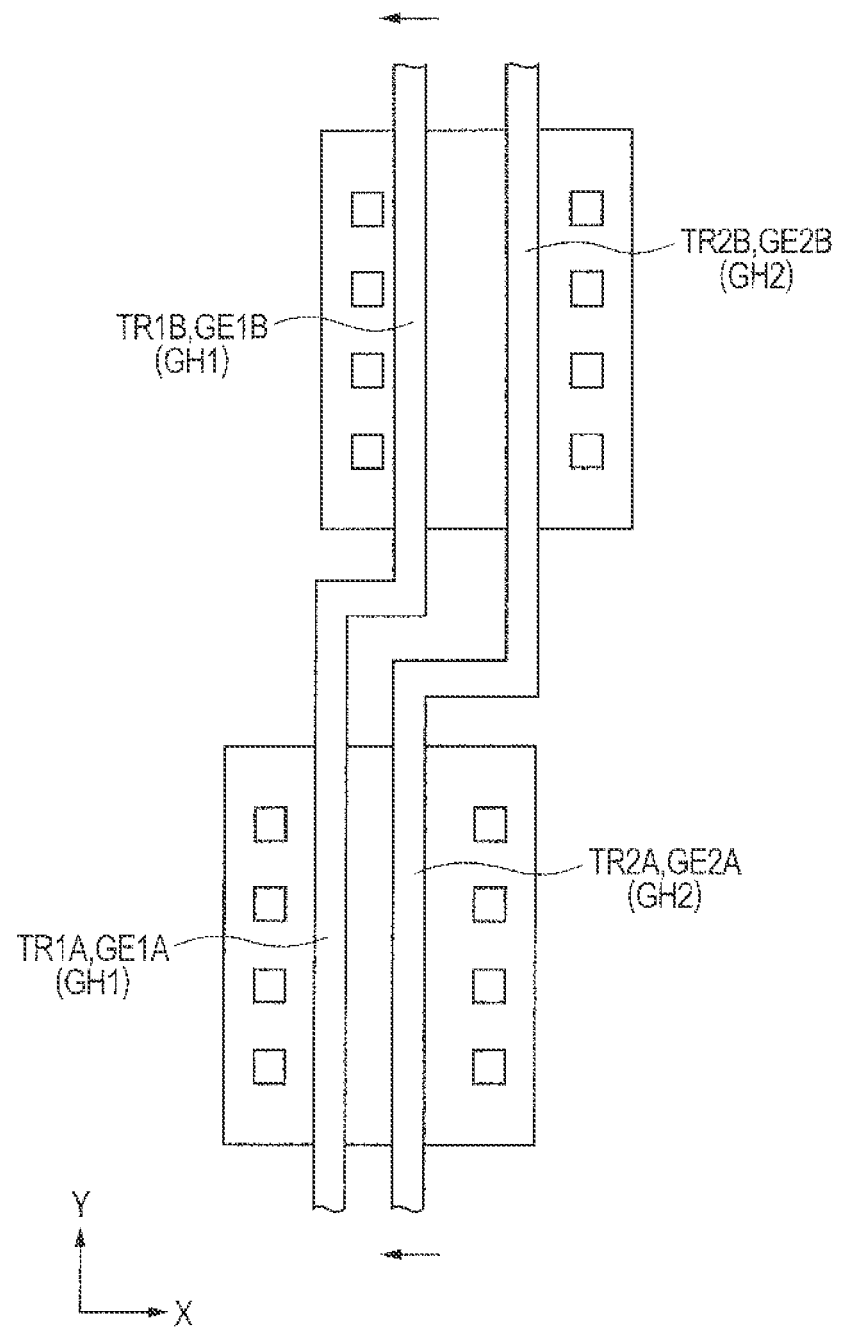
FIG. 41 is a first plan diagram showing the semiconductor device where an alignment deviation occurs in the processes shown in FIGS. 30A and 30B and 31A and 31B in the same embodiment.

First, as with the case shown in FIG. 37, FIG. 41 shows an alignment relationship among the gate electrodes GE1A, GE1B, GE2A, and GE2B where the gate electrode GE1B and the gate electrode GE2A (second mask) are deviated in the X direction (negative).

Figure 42:
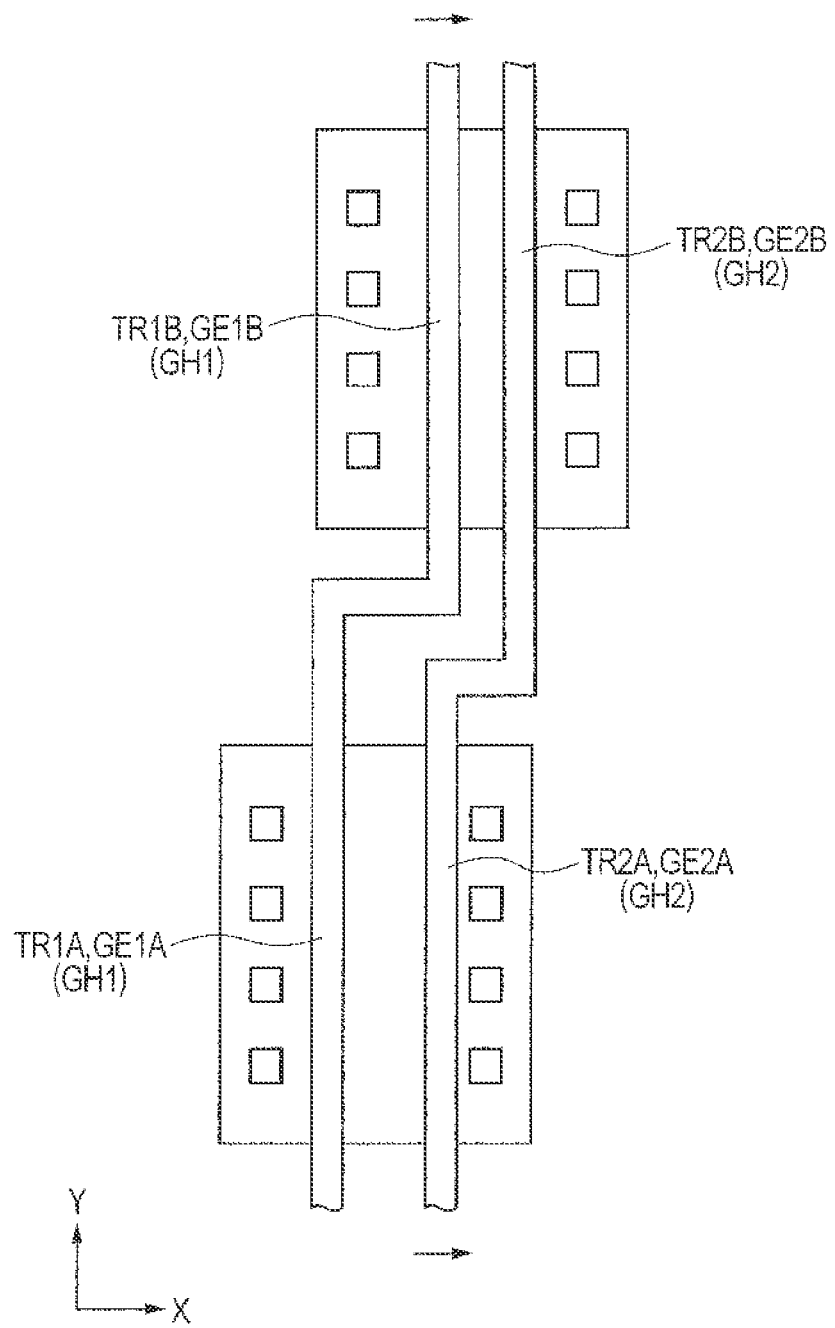
FIG. 42 is a second plan diagram showing the semiconductor device where an alignment deviation occurs in the processes shown in FIGS. 30A and 30B and 31A and 31B in the same embodiment.

As with the case shown in FIG. 38, FIG. 42 shows an alignment relationship among the gate electrodes GE1A, GE1B, GE2A and GE2B where the gate electrode GE1B and the gate electrode GE2A (second mask) are deviated in the X direction (positive).

Figure 43:
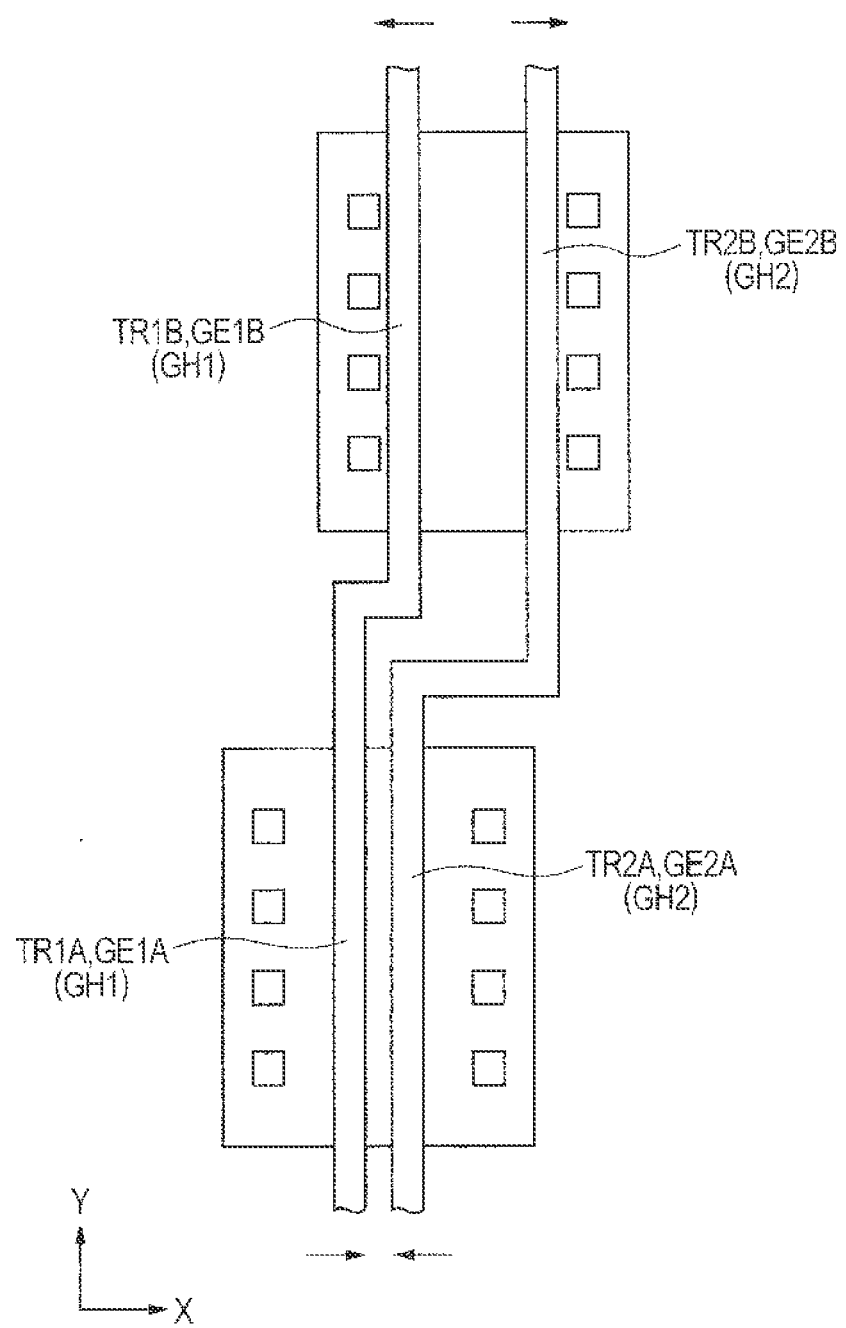
FIG. 43 is a third plan diagram showing the semiconductor device where alignment deviations occur in the processes shown in FIGS. 30A and 30B and 31A and 31B in the same embodiment.

As with the case shown in FIG. 39, FIG. 43 shows an alignment relationship among the gate electrodes GE1A, GE1B, GE2A and GE2B where the gate electrode GE1A and the gate electrode GE2B (first mask) are deviated in the X direction (positive), and the gate electrode GE2A and the gate electrode GE1B (second mask) are deviated in the X direction (negative).

Figure 44:
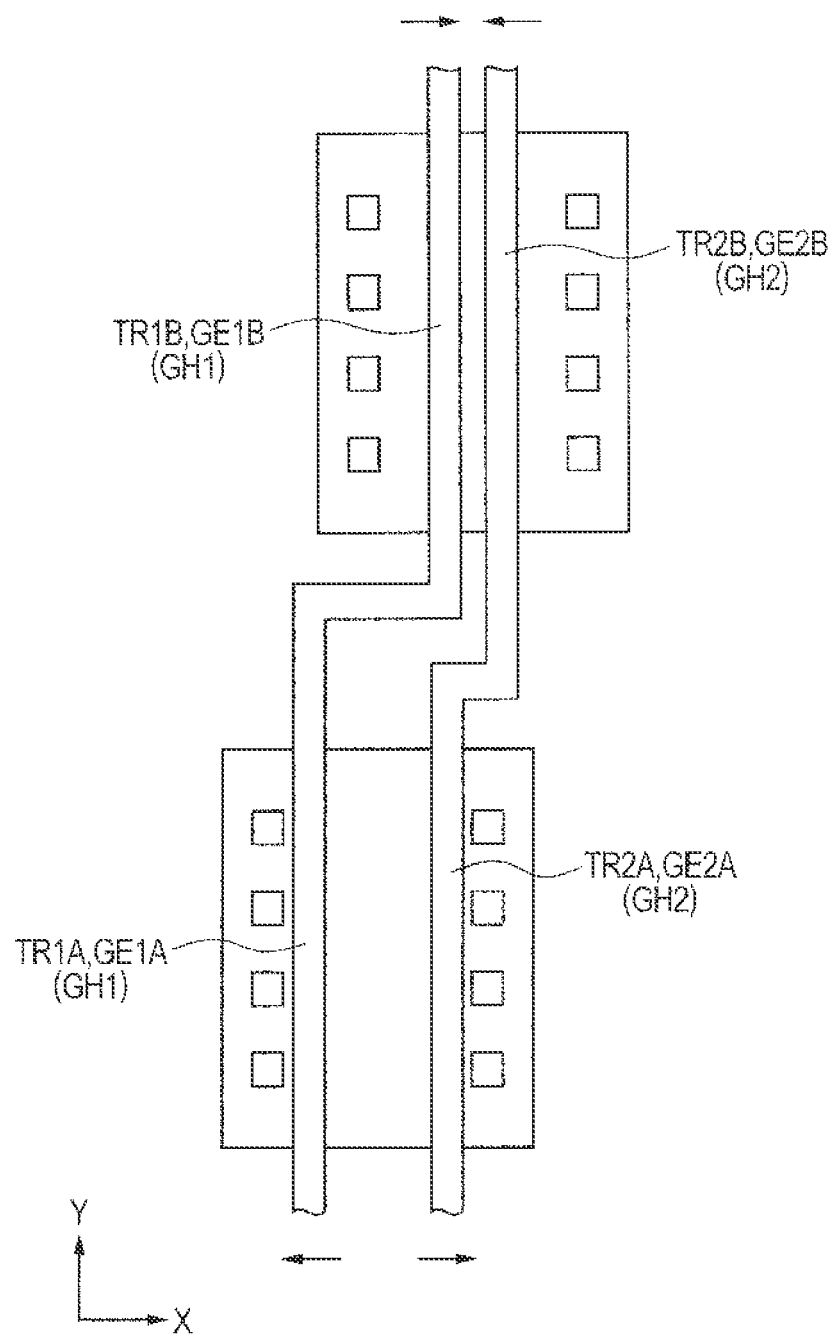
FIG. 44 is a fourth plan diagram showing the semiconductor device where alignment deviations occur in the processes shown in FIGS. 30A and 30B and 31A and 31B in the same embodiment.

As with the case shown in FIG. 40, FIG. 44 shows an alignment relationship among the gate electrodes GE1A, GE1B, GE2A and GE2B where the gate electrode GE1A and the gate electrode GE2B (first mask) are deviated in the X direction (negative), and the gate electrode GE2A and the gate electrode GE1B (second mask) are deviated in the X direction (positive).

The semiconductor device according to the embodiment is formed with the transistors corresponding to the transistors provided by equally two-dividing the first transistor CTR1 and the second transistor CTR2 coupled in series in the semiconductor device according to another comparative example, in the width direction of the gate electrodes respectively. That is, the first transistor TR1A and the second transistor TR1B corresponding to the transistors provided by dividing the first transistor CTR1 into two are formed, and the first transistor TR2A and the second transistor TR2B corresponding to the transistors provided by dividing the second transistor CTR2 into two are formed.

Thus, even if the gate electrodes GE1A, GE1B, GE2A, and GE2B are formed deviated as shown in FIGS. 41 to 44 respectively, the source-drain diffusion capacitance, the contact-gate capacitance and the like can be estimated in the same manner as the case described in the first embodiment. Accordingly, it can be said that in the semiconductor device according to the embodiment, the source-drain diffusion capacitance, the gate-contact capacitance and the like can be suppressed as compared with the semiconductor device according to another comparative example.

Further, even though the gate electrodes GE1A, GE1B, GE2A, and GE2B have caused positional deviations, variations in stress received by the first element forming area EFA and the second element forming area EFB can be suppressed by the element isolation insulating film EL and the stress liner film LN as compared with the case where the gate electrode CGE1 (CGE2) is deviated in position. Thus, it is possible to uniformize the driving capabilities of the first transistor TR1A, the second transistor TR1B, the first transistor TR2A, and the second transistor TR2B.

Incidentally, although a description has been made of the case where in the above-described semiconductor device, the two transistors are coupled in series, three or more transistors may be coupled in series.

Third Embodiment

A description will now be made about various semiconductor devices each equipped with an inverter.

First Example

Figure 45:
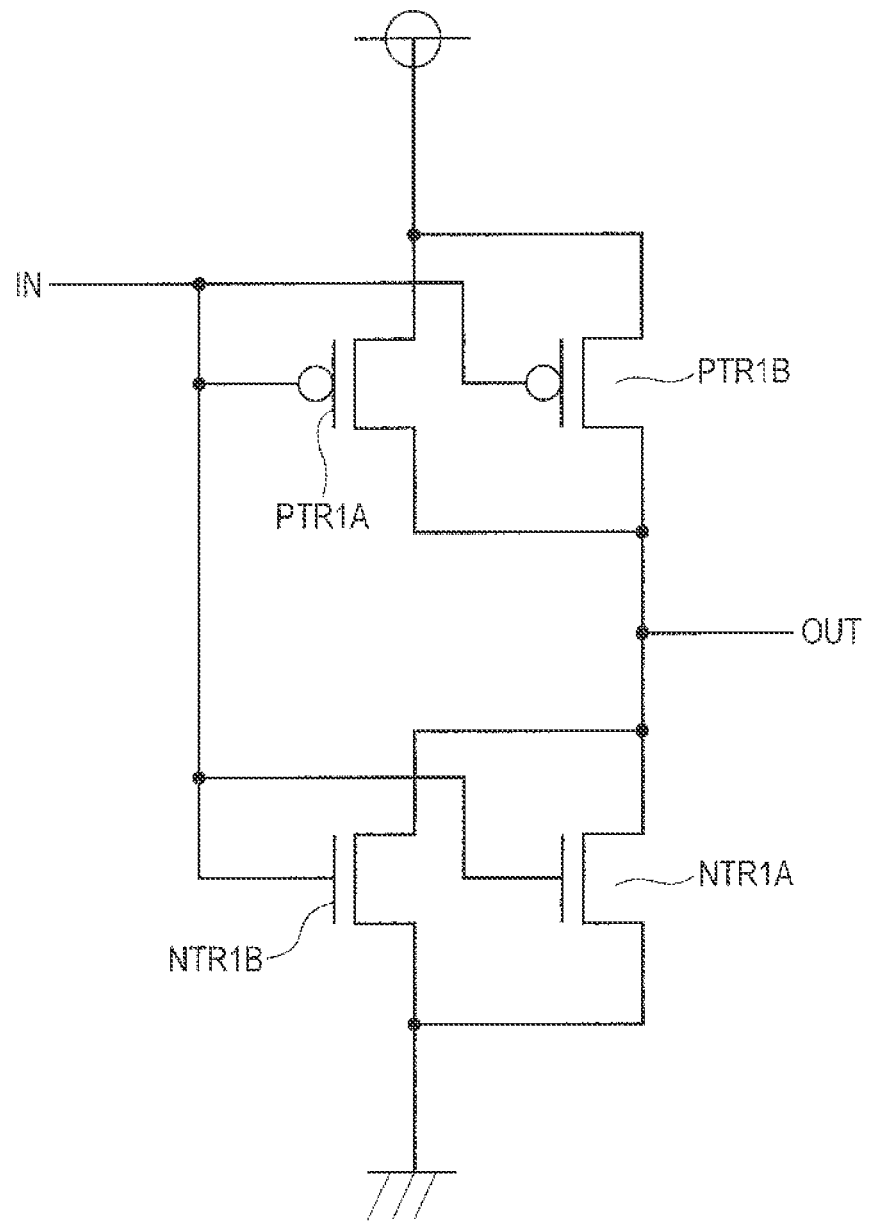
FIG. 45 is a diagram showing an inverter circuit of a semiconductor device according to a first example in a third embodiment.

A semiconductor device according to a first example will first be described. A circuit diagram of an inverter comprised of a p channel type transistor and an n channel type transistor is shown in FIG. 45. The p channel type transistor is divided into a p channel type first transistor PTR1A and a p channel type second transistor PTR1B. The n channel type transistor is divided into an n channel type first transistor NTR1A and an n channel type second transistor NTR1B.

Figure 46:
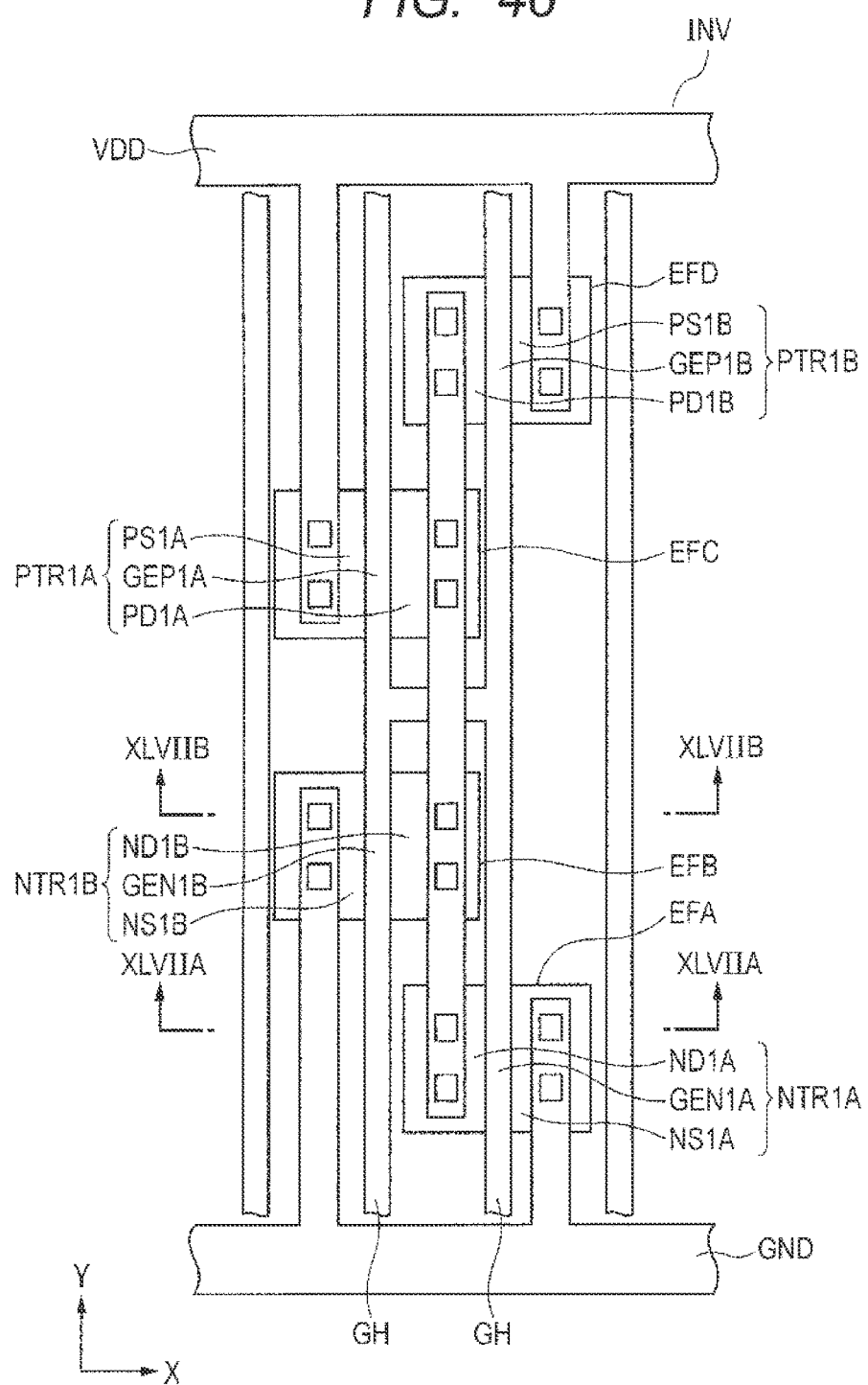
FIG. 46 is a plan diagram showing the semiconductor device according to the first example in the same embodiment.
Figure 47B:
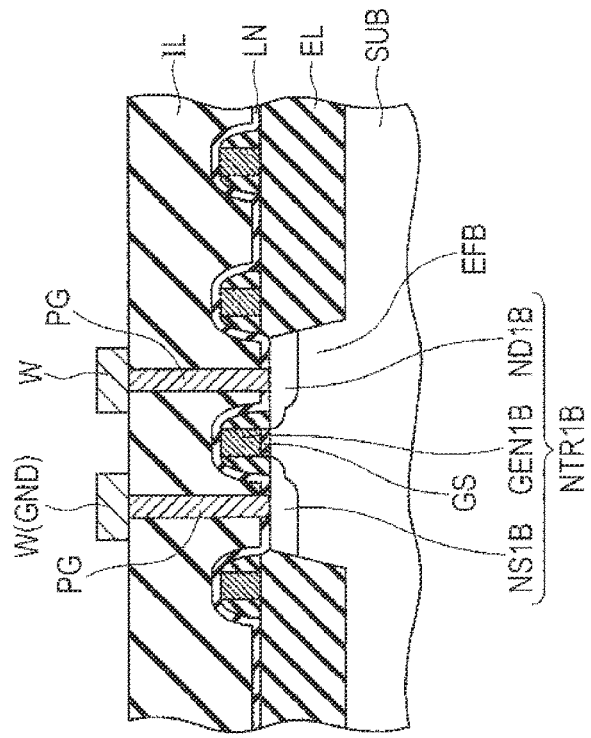
Figure 47A:
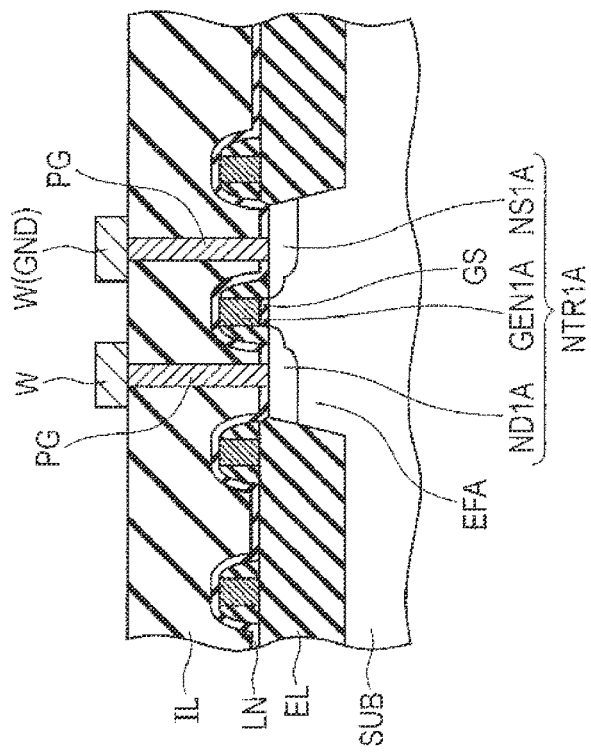

The structure of the inverter will next be described. In the inverter INV as shown in FIGS. 46 and 47, the n channel type first transistor NTR1A is formed in a first element forming area EFA, and the n channel type second transistor NTR1B is formed in a second element forming area EFB. The p channel type first transistor PTR1A is formed in a third element forming area EFC, and the p channel type second transistor PTR1B is formed in a fourth element forming area EFD.

The n channel type first transistor NTR1A has a gate electrode GEN1A, a source area NS1A, and a drain area ND1A. The n channel type second transistor NTR1B has a gate electrode GEN1B, a source area NS1B, and a drain area ND1B. The p channel type first transistor PTR1A has a gate electrode GEP1A, a source area PS1A, and a drain area PD1A. The p channel type second transistor PTR1B has a gate electrode GEP1B, a source area PS1B, and a drain area PD1B.

In the n channel type first transistor NTR1A, the source area NS1A is formed on the (positive) side of an X direction with respect to the gate electrode GEN1A, and the drain area ND1A is formed on the (negative) side of the X direction with respect thereto. In the n channel type second transistor NTR1B, the source area NS1B is formed on the (negative) side of the X direction with respect to the gate electrode GEN1B, and the drain area ND1B is formed on the (positive) side of the X direction with respect thereto.

In the p channel type first transistor PTR1A, the source area PS1A is formed on the (negative) side of the X direction with respect to the gate electrode GEP1A, and the drain area PD1A is formed on the (positive) side of the X direction with respect thereto. In the p channel type second transistor PTR1B, the source area PS1B is formed on the (positive) side of the X direction with respect to the gate electrode GEP1B, and the drain area PD1B is formed on the (negative) side of the X direction.

The gate electrode GEN1A, the gate electrode GEN1B, the gate electrode GEP1A, and the gate electrode GEP1B are electrically coupled by gate wirings GH. The gate electrode GEN1A, the gate electrode GEN1B, the gate electrode GEP1A, and the gate electrode GEP1B are formed by double patterning. The gate electrode GEN1B and the gate electrode GEP1A are formed based on a pattern of one mask, and the gate electrode GEN1A and the gate electrode GEP1B are formed based on a pattern of another mask.

The source area NS1A and the source area NS1B are electrically coupled to a ground wiring GND by wirings W. The source area PS1A and the source area PS1B are electrically coupled to a power supply wiring VDD. The drain area ND1A, the drain area ND1B, the drain area PD1A, and the drain area PD1B are electrically coupled by wirings W. Incidentally, since the present semiconductor device is similar to the semiconductor device shown in FIGS. 1 and 2 in configuration other than the above, the same members are respectively given the same reference numerals, and their description will not be repeated unless otherwise required.

Figure 48A:
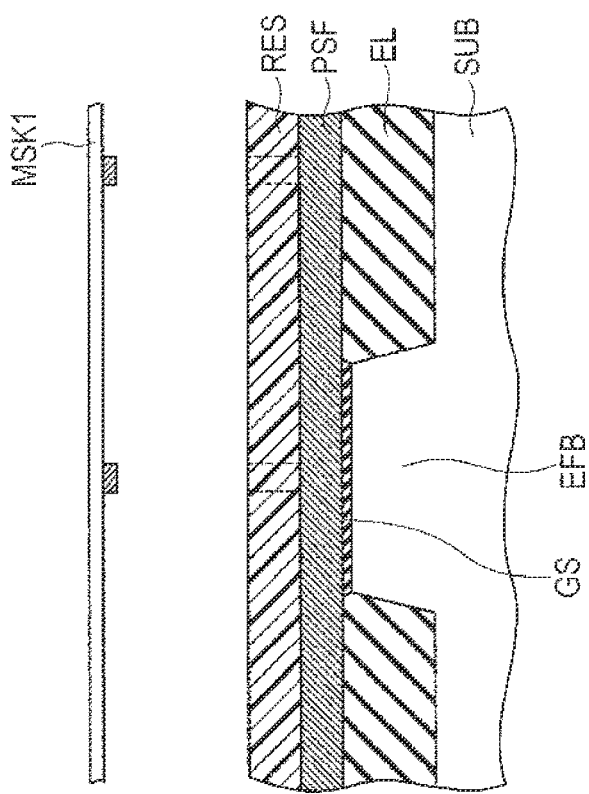
Figure 48B:
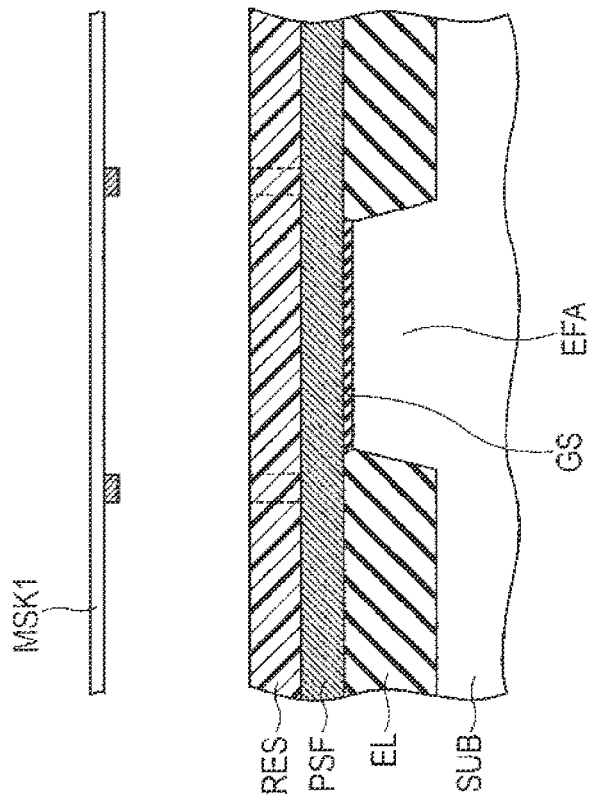

A description will next be made about one example of a manufacturing method of the semiconductor device described above. First, after going through processes similar to the processes shown in FIGS. 3 through 5, gate wirings (gate electrodes) are formed by double patterning. As shown in FIG. 48, a photoresist RES is exposed using a first mask MSK1. At this time, patterns (light shielding film) corresponding to predetermined plural gate electrodes (gate wirings) are formed in the first mask MSK1. For example, a pattern corresponding to the gate electrode GEN1B and a pattern corresponding to the gate electrode GEP1A are included herein. Their patterns are photoengraved in the photoresist RES which covers the second element forming area EFB and the third element forming area EFC (not shown).

Figure 49B:
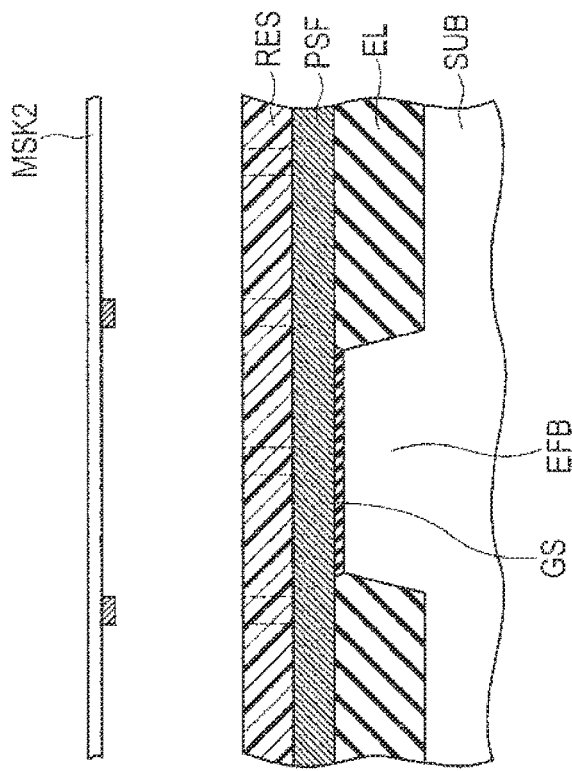
Figure 49A:
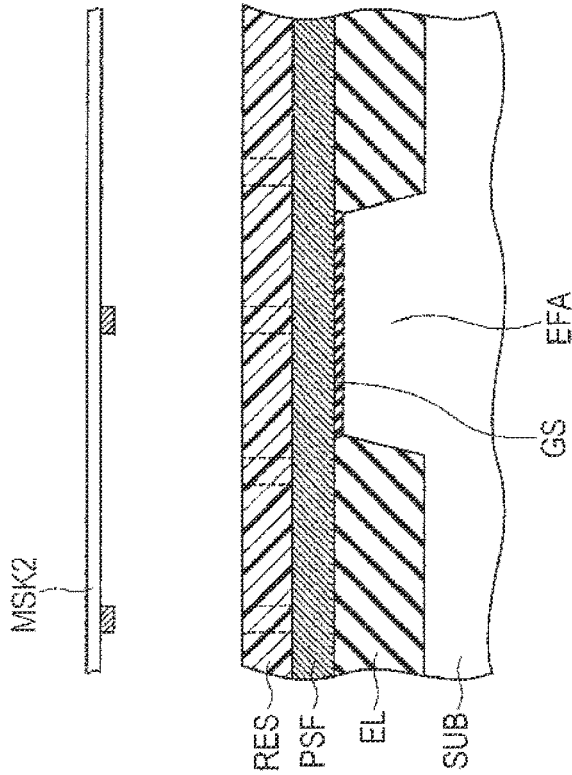

Next, as shown in FIG. 49, the photoresist RES is exposed using a second mask MSK2. At this time, patterns (light shielding film) corresponding to other predetermined plural gate electrodes (gate wirings) are formed in the second mask MSK2. A pattern corresponding to the gate electrode GEN1A and a pattern corresponding to the gate electrode GEP1B are included herein. Their patterns are photoengraved in the photoresist RES which covers the first element forming area EFA and the fourth element forming area EFD.

Figure 50A:
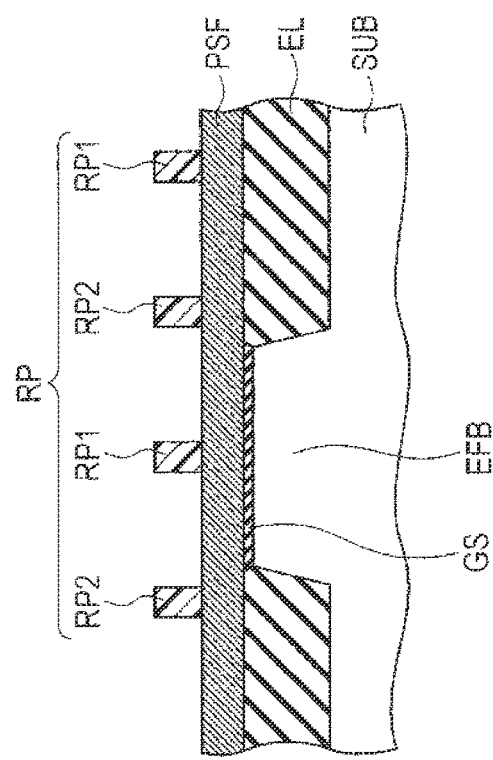
Figure 50B:
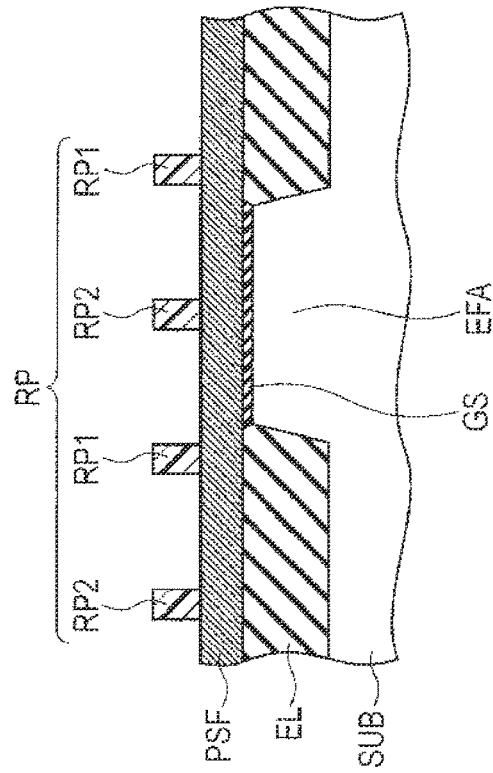

Next, as shown in FIG. 50, a resist pattern RP including a resist pattern RP1 and a resist pattern RP2 is formed by performing development processing on the photoresist RES. The resist pattern RP1 is a resist pattern photoengraved by the first mask MSK1. The resist pattern RP2 is a resist pattern photoengraved by the second mask MSK2. Next, gate wirings GH (refer to FIG. 51) are formed by performing etching processing on a polysilicon film PSF with the resist pattern RP as an etching mask.

Figure 51:
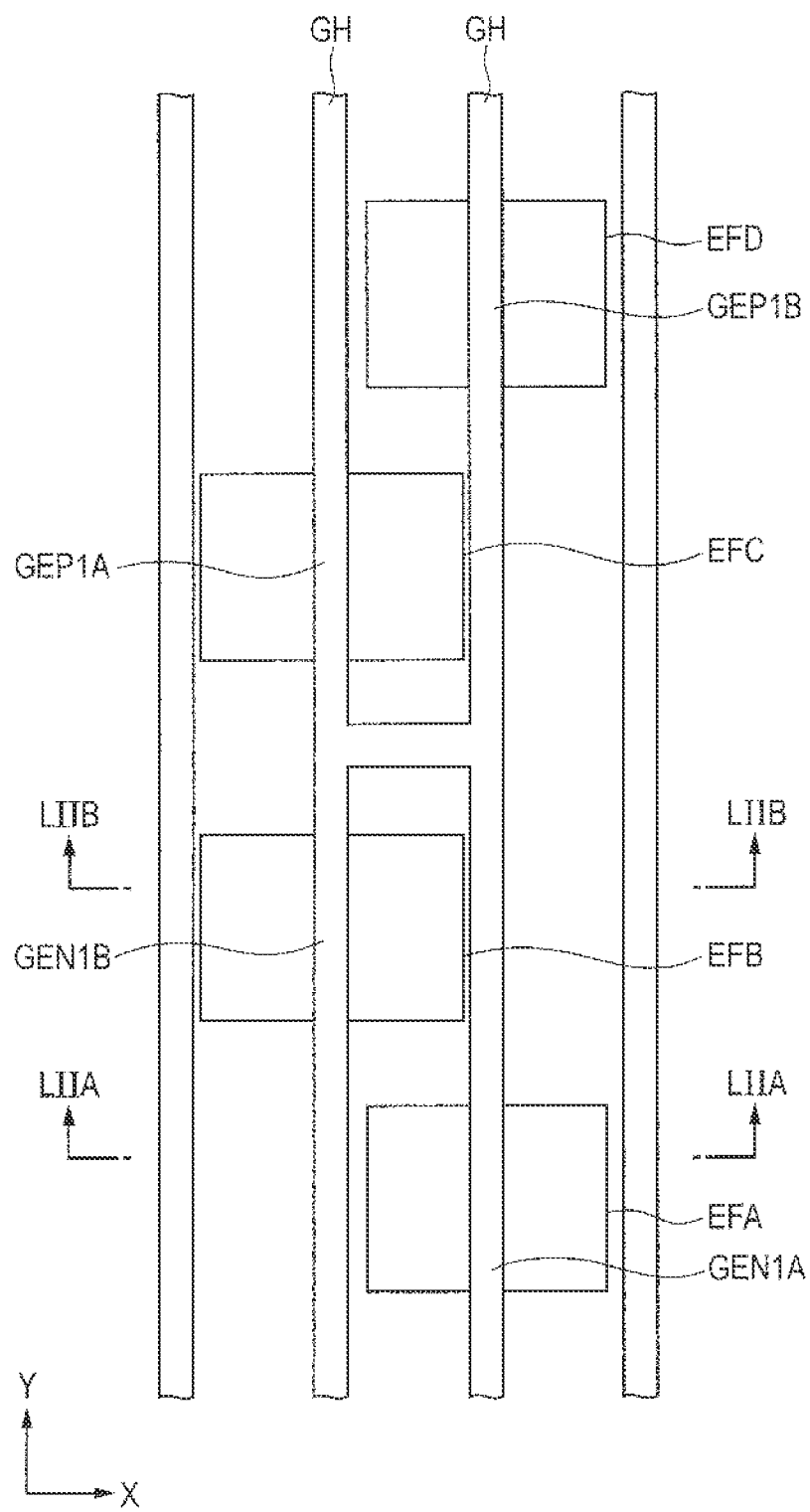
FIG. 51 is a plan diagram showing a process carried out after the process shown in FIGS. 50A and 50B in the same embodiment.

Thereafter, the gate wirings GH are exposed as shown in FIGS. 51 and 52 by removing the resist pattern RP. Of the gate wirings GH, a portion which crosses the first element forming area EFA serves as the gate electrode GEN1A, and a portion which crosses the second element forming area EFB serves as the gate electrode GEN1B. Further, a portion which crosses the third element forming area EFC serves as the gate electrode GEP1A, and a portion which crosses the fourth element forming area EFD serves as the gate electrode GEP1B. Thereafter, after going through processes similar to the processes shown in FIGS. 11 through 14, the main part of the semiconductor device shown in FIGS. 46 and 47 is completed.

In the semiconductor device equipped with the inverter, according to the first example, one p channel type transistor is divided into the p channel type first transistor PTR1A and the p channel type second transistor PTR1B. Further, one n channel type transistor is divided into the n channel type first transistor NTR1A and the n channel type second transistor NTR1B.

Thus, even though the gate wiring GH including the gate electrode GEN1B and the gate electrode GEP1A, and the gate wiring GH including the gate electrode GEN1A and the gate electrode GEP1B are formed with being deviated in position, the source-drain diffusion capacitance, the contact-gate capacitance and the like can be estimated in the same manner as the case described in the first embodiment. Accordingly, it can be said that in the semiconductor device equipped with the inverter, according to the first example, the source-drain diffusion capacitance, the gate-contact capacitance and the like can be suppressed as compared with the semiconductor device equipped with the inverter in which the p channel type transistor and the n channel type transistor are not respectively divided.

Further, even though the gate electrode GEN1B, the gate electrode GEP1A, the gate electrode GEN1A, and the gate electrode GEP1B have caused positional deviations, variations in stress received by the first element forming area EFA to the fourth element forming area EFD can be suppressed by the element isolation insulating film EL and the stress liner film LN as compared with the case where the gate electrode of the undivided transistor is deviated in position. Thus, it is possible to uniformize the driving capabilities of the p channel type first transistor PTR1A and the p channel type second transistor PTR1B, and the driving capabilities of the n channel type first transistor NTR1A and the n channel type second transistor NTR1B. As a result, it is possible to stabilize the operation of the inverter.

Second Example

Figure 53:
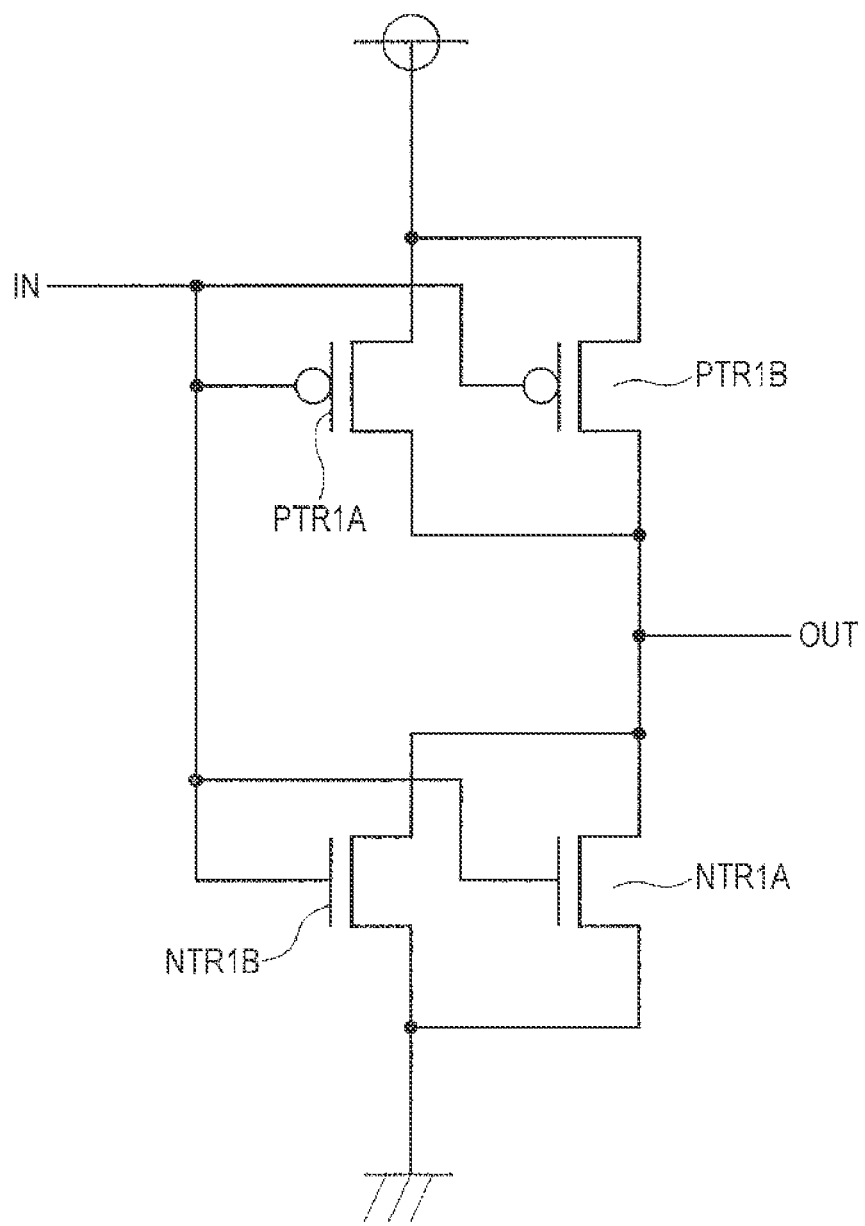
FIG. 53 is a diagram showing an inverter circuit of a semiconductor device according to a second example in the same embodiment.

A semiconductor device according to a second example will next be described. FIG. 53 shows a circuit diagram of an inverter comprised of a p channel type transistor and an n channel type transistor. The circuit diagram of the inverter according to the second example is the same as the circuit diagram of the inverter according to the first example.

Figure 54:
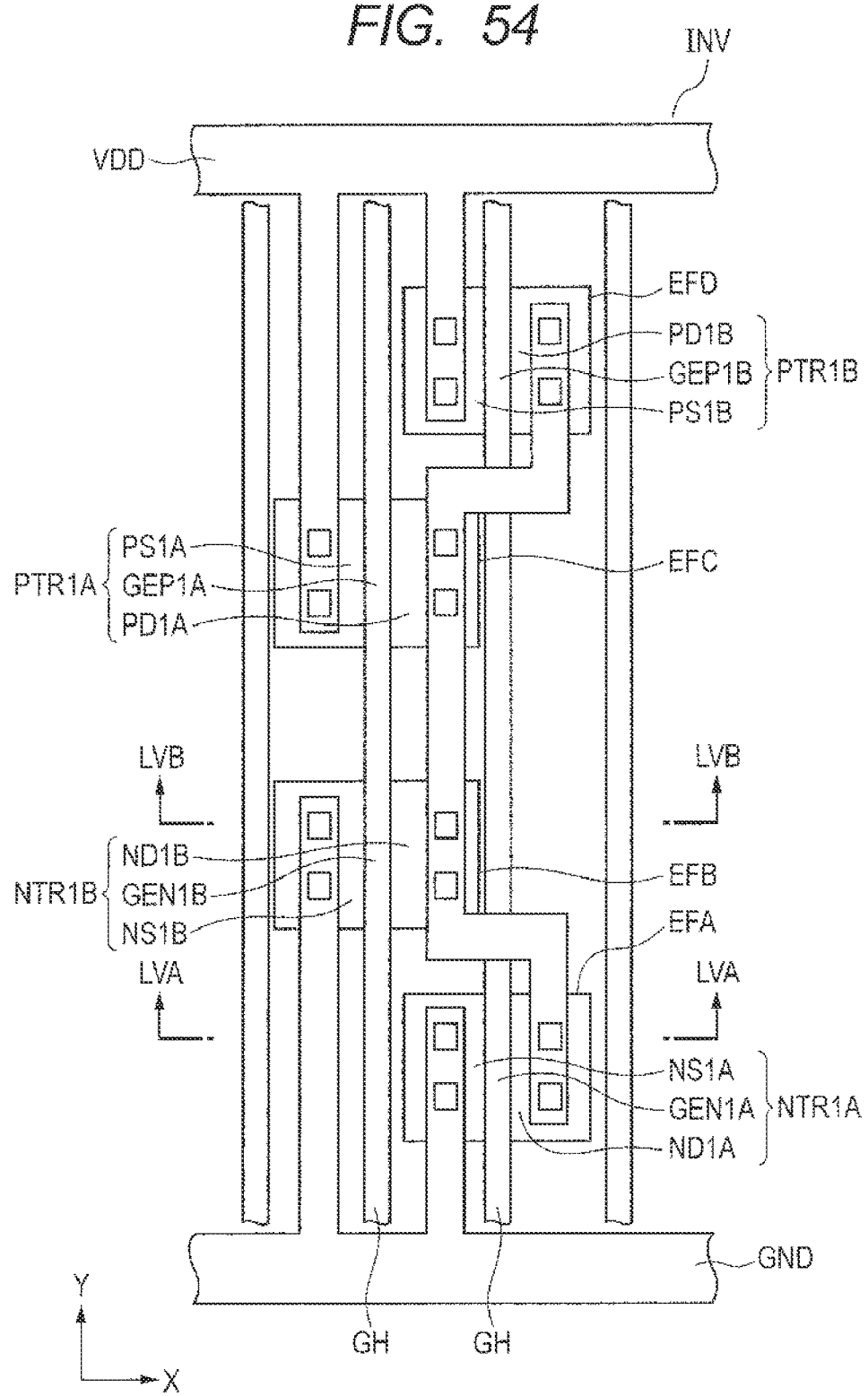
FIG. 54 is a plan diagram showing the semiconductor device according to the second example in the same embodiment.
Figure 55:
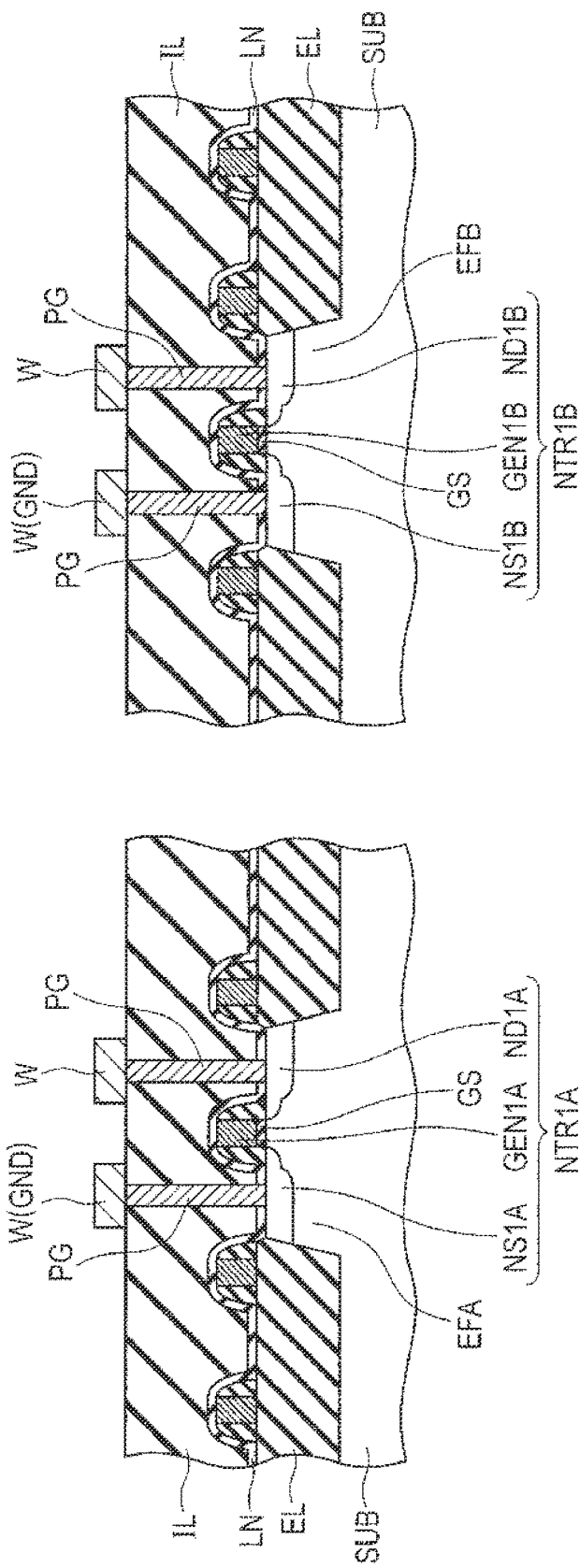

The structure of the inverter will next be described. In the inverter INV as shown in FIGS. 54 and 55, an n channel type first transistor NTR1A is formed in a first element forming area EFA, and an n channel type second transistor NTR1B is formed in a second element forming area EFB. A p channel type first transistor PTR1A is formed in a third element forming area EFC, and a p channel type second transistor PTR1B is formed in a fourth element forming area EFD.

In the semiconductor device according to the second example, all of source areas NS1A, NS1B, PS1A, and PS1B are formed on the (negative) side of an X direction with respect to their corresponding gate electrodes GEN1A, GEN1B, GEP1A, and GEP1B. Further, all of drain areas ND1A, ND1B, PD1A, and PD1B are formed on the (positive) side of the X direction with respect to their corresponding gate electrodes GEN1A, GEN1B, GEP1A, and GEP1B. Incidentally, since the present semiconductor device is similar to the semiconductor device shown in FIGS. 46 and 47 in configuration other than the above, the same members are respectively given the same reference numerals, and their description will not be repeated unless otherwise required.

In the semiconductor device equipped with the inverter, according to the second example, one p channel type transistor is divided into the p channel type first transistor PTR1A and the p channel type second transistor PTR1B. Further, one n channel type transistor is divided into the n channel type first transistor NTR1A and the n channel type second transistor NTR1B.

The gate electrode GEN1A, the gate electrode GEN1B, the gate electrode GEP1A, and the gate electrode GEP1B are formed by double patterning. The gate electrode GEN1B and the gate electrode GEP1A are formed based on a pattern of one mask, and the gate electrode GEN1A and the gate electrode GEP1B are formed based on a pattern of another mask.

Thus, even though the gate wiring GH including the gate electrode GEN1B and the gate electrode GEP1A, and the gate wiring GH including the gate electrode GEN1A and the gate electrode GEP1B are formed with being deviated in position, the source-drain diffusion capacitance, the contact-gate capacitance and the like can be estimated in the same manner as the case described in the first embodiment. Accordingly, it can be said that in the semiconductor device equipped with the inverter, according to the second example, the source-drain diffusion capacitance, the gate-contact capacitance and the like can be suppressed as compared with the semiconductor device equipped with the inverter in which the p channel type transistor and the n channel type transistor are not respectively divided.

Further, even though the gate electrode GEN1B, the gate electrode GEP1A, the gate electrode GEN1A, and the gate electrode GEP1B have caused positional deviations, variations in stress received by the first element forming area EFA to the fourth element forming area EFD can be suppressed by the element isolation insulating film. EL and the stress liner film LN as compared with the case where the gate electrode of the undivided transistor is deviated in position. Thus, it is possible to uniformize the driving capabilities of the p channel type first transistor PTR1A and the p channel type second transistor PTR1B, and the driving capabilities of the n channel type first transistor NTR1A and the n channel type second transistor NTR1B. As a result, it is possible to stabilize the operation of the inverter.

Third Example

Figure 56:
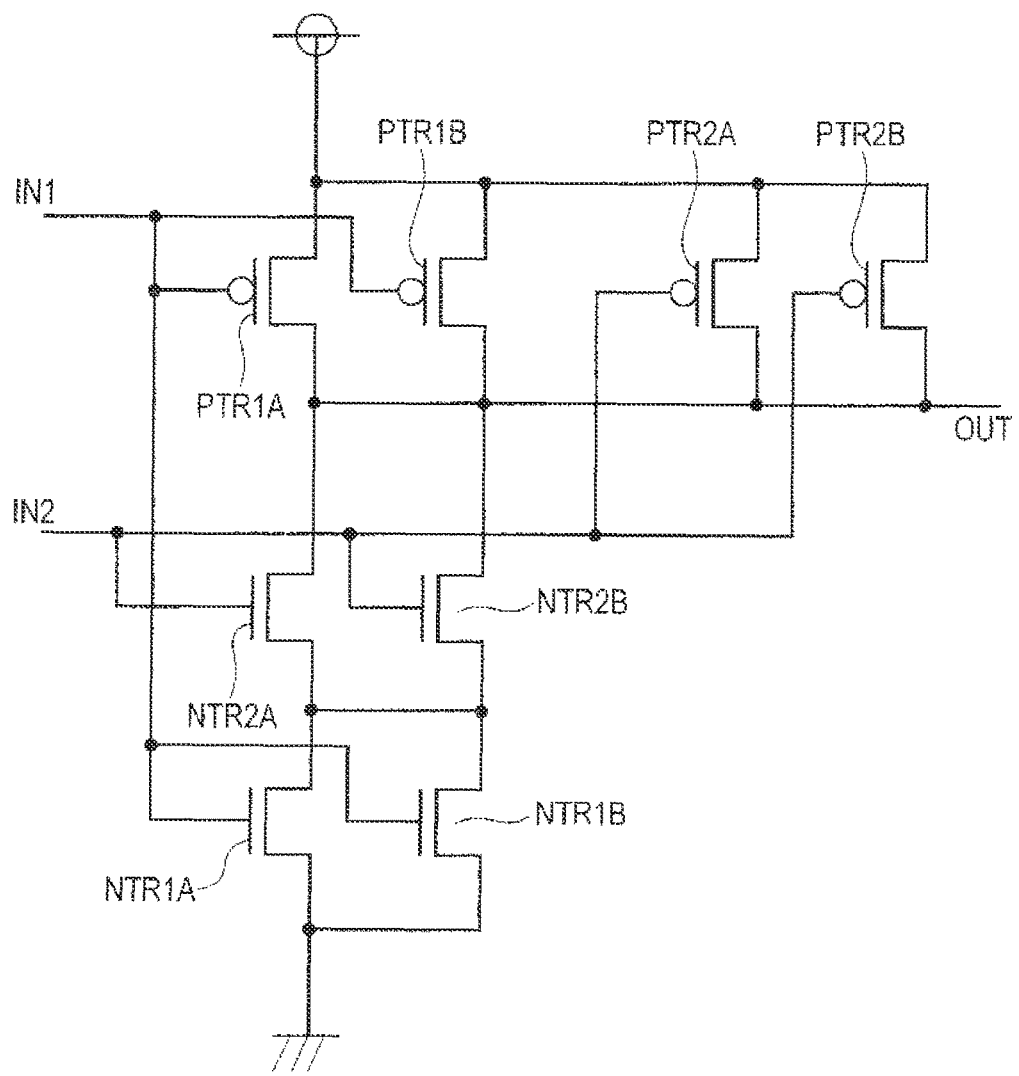
FIG. 56 is a diagram showing an inverter circuit of a semiconductor device according to a third example in the same embodiment.

A semiconductor device according to a third example will next be described. FIG. 56 shows a circuit diagram of a two-input NAND type inverter. One p channel type transistor is divided into a p channel type first transistor PTR1A, and a p channel type second transistor PTR1B. Another p channel type transistor is divided into a p channel type third transistor PTR2A and a p channel type fourth transistor PTR2B.

One n channel type transistor is divided into an n channel type first transistor NTR1A and an n channel type second transistor NTR1B. Another n channel type transistor is divided into an n channel type third transistor NTR2A and an n channel type fourth transistor NTR2B.

The structure of the inverter will next be described. Structurally, it is configured as a structure in which the n channel type third transistor NTR2A, the n channel type fourth transistor NTR2B, the p channel type third transistor PTR2A, and the p channel type fourth transistor PTR2B are added to the inverter according to the first example.

Figure 57:
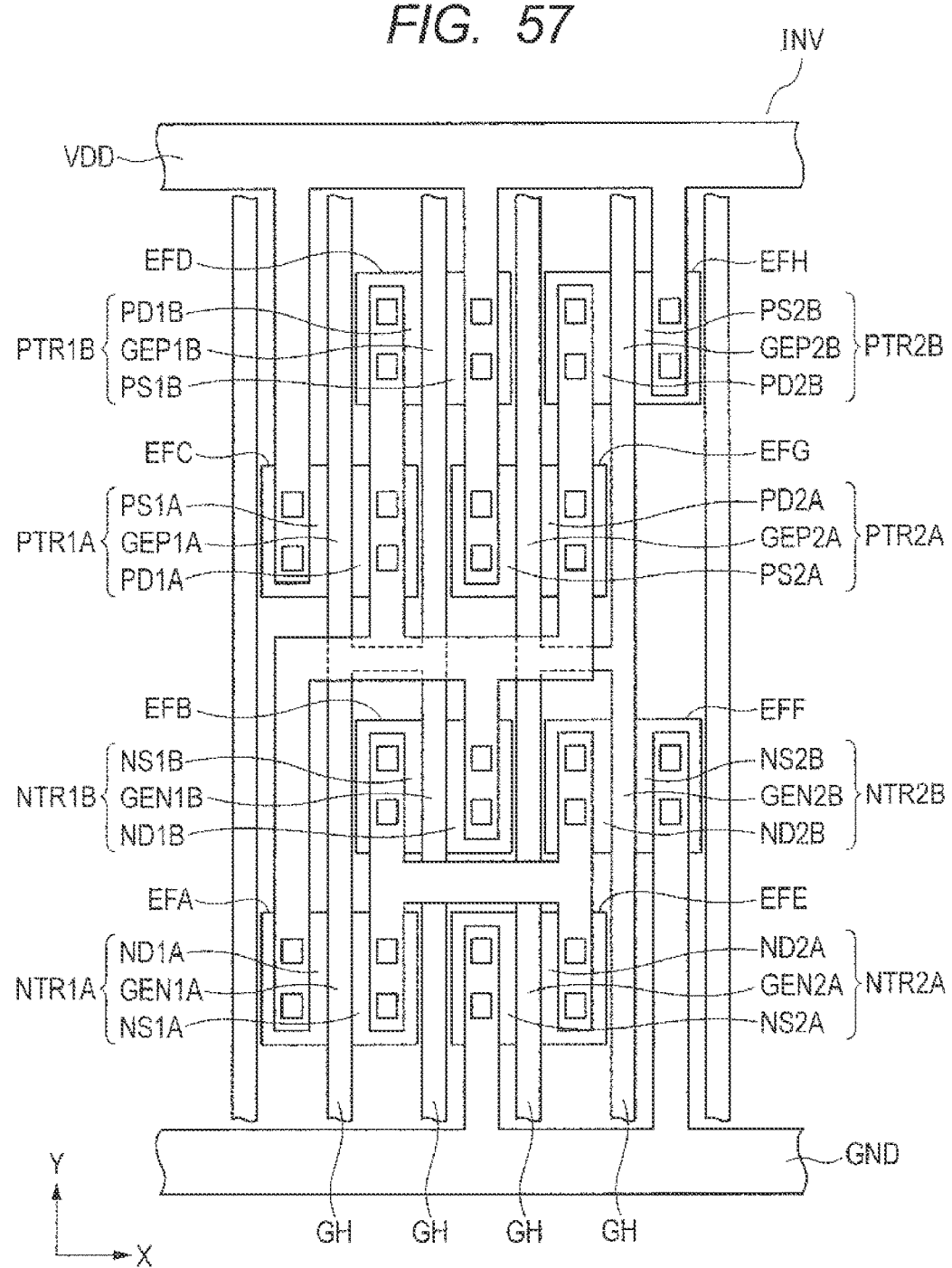
FIG. 57 is a plan diagram showing the semiconductor device according to the third example in the same embodiment.

In the inverter INV as shown in FIG. 57, the n channel type third transistor NTR2A is formed in a fifth element forming area EFE, and the n channel type fourth transistor NTR2B is formed in a sixth element forming area EFF. The p channel type third transistor PTR2A is formed in a seventh element forming area EFG, and the p channel type fourth transistor PTR2B is formed in an eighth element forming area EFH.

The n channel type third transistor NTR2A has a gate electrode GEN2A, a source area NS2A, and a drain area ND2A. The n channel type fourth transistor NTR2B has a gate electrode GEN2B, a source area NS2B, and a drain area ND2B. The p channel type third transistor PTR2A has a gate electrode GEP2A, a source area PS2A, and a drain area PD2A. The p channel type fourth transistor PTR2B has a gate electrode GEP2B, a source area PS2B, and a drain area PD2B.

In the n channel type third transistor NTR2A, the source area NS2A is formed on the (negative) side of an X direction with respect to the gate electrode GEN2A, and the drain area ND2A is formed on the (positive) side of the X direction with respect thereto. In the n channel type fourth transistor NTR2B, the source area NS2B is formed on the (positive) side of the X direction with respect to the gate electrode GEN2B, and the drain area ND2B is formed on the (negative) side of the X direction with respect thereto.

In the p channel type third transistor PTR2A, the source area PS2A is formed on the (negative) side of the X direction with respect to the gate electrode GEP2A, and the drain area PD2A is formed on the (positive) side of the X direction with respect thereto. In the p channel type fourth transistor PTR2B, the source area PS2B is formed on the (positive) side of the X direction with respect to the gate electrode GEP2B, and the drain area PD2B is formed on the (negative) side of the X direction with respect thereto.

The gate electrode GEN2A, the gate electrode GEN2B, the gate electrode GEP2A, and the gate electrode GEP2B are electrically coupled by gate wirings GH. The source area NS2A and the source area NS2B are electrically coupled to a ground wiring GND by wirings. The source area PS2A and the source area PS2B are electrically coupled to a power supply wiring VDD.

The drain area ND2A and the drain area ND2B are electrically coupled to the source area NS1A and the source area NS1B. The drain area PD2A and the drain area PD2B are electrically coupled to the drain area ND1A, the drain area ND1B, the drain area PD1A, and the drain area PD1B.

Incidentally, a planar structure other than the above is similar to the planar structure shown in FIG. 46 according to the first example. Further, a sectional structure (not shown) is similar to the sectional structure shown in FIGS. 47A and 47B according to the first example. Therefore, the same members are respectively given the same reference numerals, and their description will not be repeated unless otherwise required.

Next, a manufacturing method of the above-described semiconductor device is substantially the same as the manufacturing method according to the first example since patterns for the element forming areas and gate wirings are simply added. In particular, the gate electrode GEN1A, the gate electrode GEN1B, the gate electrode GEP1A, the gate electrode GEP1B, the gate electrode GEN2A, the gate electrode GEN2B, the gate electrode GEP2A, and the gate electrode GEP2B are formed by double patterning.

For example, the gate electrode GEN1A, the gate electrode GEP1A, the gate electrode GEN2A, and the gate electrode GEP2A are formed based on a pattern of one mask, and the gate electrode GEN1B, the gate electrode GEP1B, the gate electrode GEN2B, and the gate electrode GEP2B are formed on a pattern of another mask.

Thus, even though the gate wirings GH including the gate electrode GEN1A, the gate electrode GEP1A, the gate electrode GEN2A, and the gate electrode GEP2A, and the gate wirings GH including the gate electrode GEN1B, the gate electrode GEP1B, the gate electrode GEN2B, and the gate electrode GEP2B are formed with being deviated in position, the source-drain diffusion capacitance, the contact-gate capacitance and the like can be estimated in the same manner as the case described in the first embodiment. Accordingly, it can be said that in the semiconductor device equipped with the inverter, according to the third example, the source-drain diffusion capacitance, the gate-contact capacitance and the like can be suppressed as compared with the semiconductor device equipped with the inverter in which the p channel type transistor and the n channel type transistor are not respectively divided.

Further, even though the gate electrodes GEN1A, GEN1B, GEP1A, GEP1B, GEN2A, GEN2B, GEP2A, and GEP2B have caused positional deviations, variations in stress received by the first element forming area EFA to the eighth element forming area EFH can be suppressed by the element isolation insulating film EL and the stress liner film LN as compared with the case where the gate electrode of the undivided transistor is deviated in position.

Thus, it is possible to uniformize the driving capabilities of the p channel type first transistor PTR1A and the p channel type second transistor PTR1B, and the driving capabilities of the n channel type first transistor NTR1A and the n channel type second transistor NTR1B. Further, it is possible to uniformize the driving capabilities of the p channel type third transistor PTR2A and the p channel fourth transistor PTR2B, and the driving capabilities of the n channel type third transistor NTR2A and the n channel type fourth transistor NTR2B. As a result, it is possible to stabilize the operation of the inverter.

Fourth Example

Figure 58:
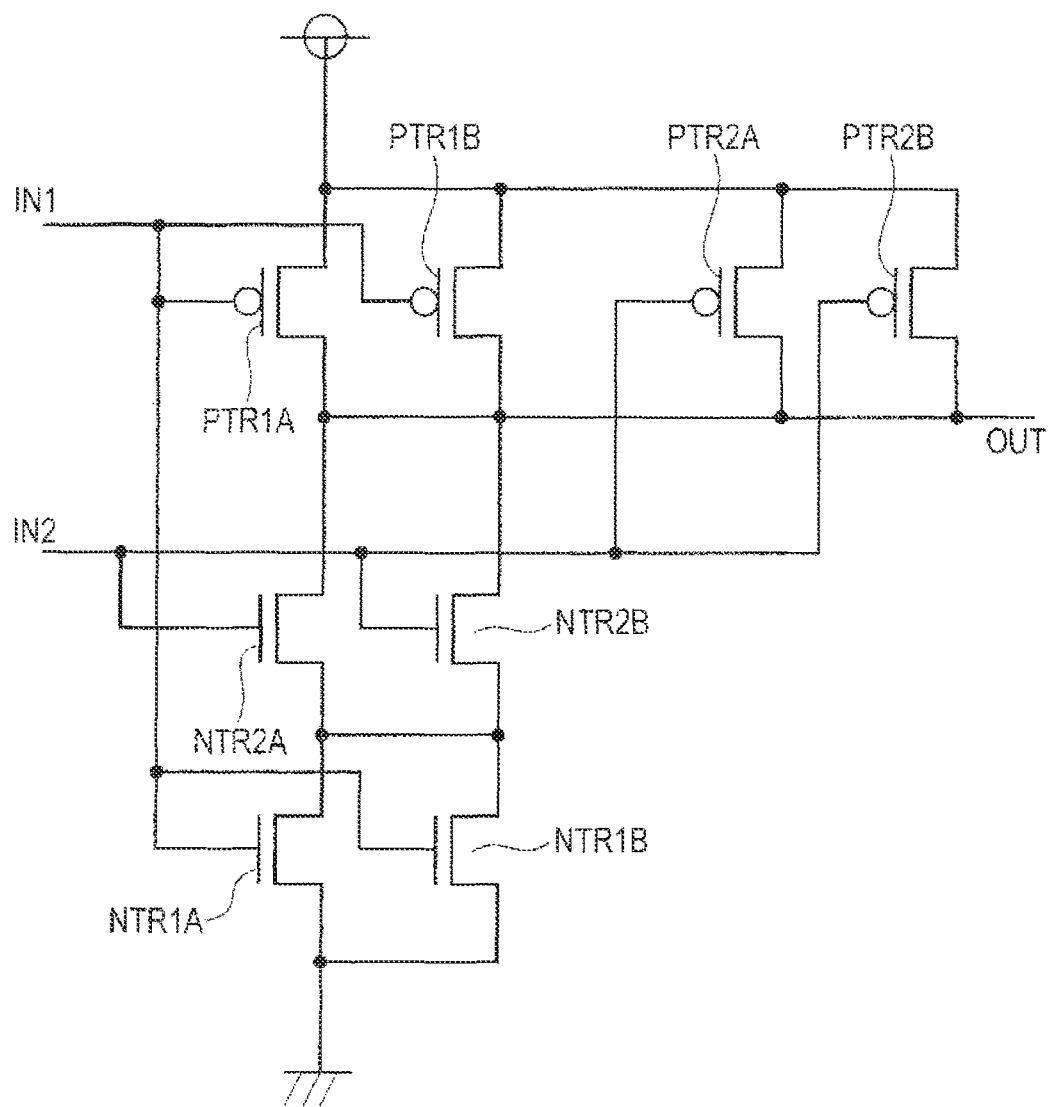
FIG. 58 is a diagram showing an inverter circuit of a semiconductor device according to a fourth example in the same embodiment.

A semiconductor device according to a fourth example will next be described. FIG. 58 shows a circuit diagram of a two-input NAND type inverter comprised of a p channel type transistor and an n channel type transistor. The circuit diagram of the inverter according to the fourth example is the same as the circuit diagram of the inverter according to the third example.

The structure of the inverter will next be described. Structurally, it is configured as a structure in which an n channel type third transistor NTR2A, an n channel type fourth transistor NTR2B, a p channel type third transistor PTR2A, and a p channel type fourth transistor PTR2B are added to the inverter according to the first example as with the third example.

Figure 59:
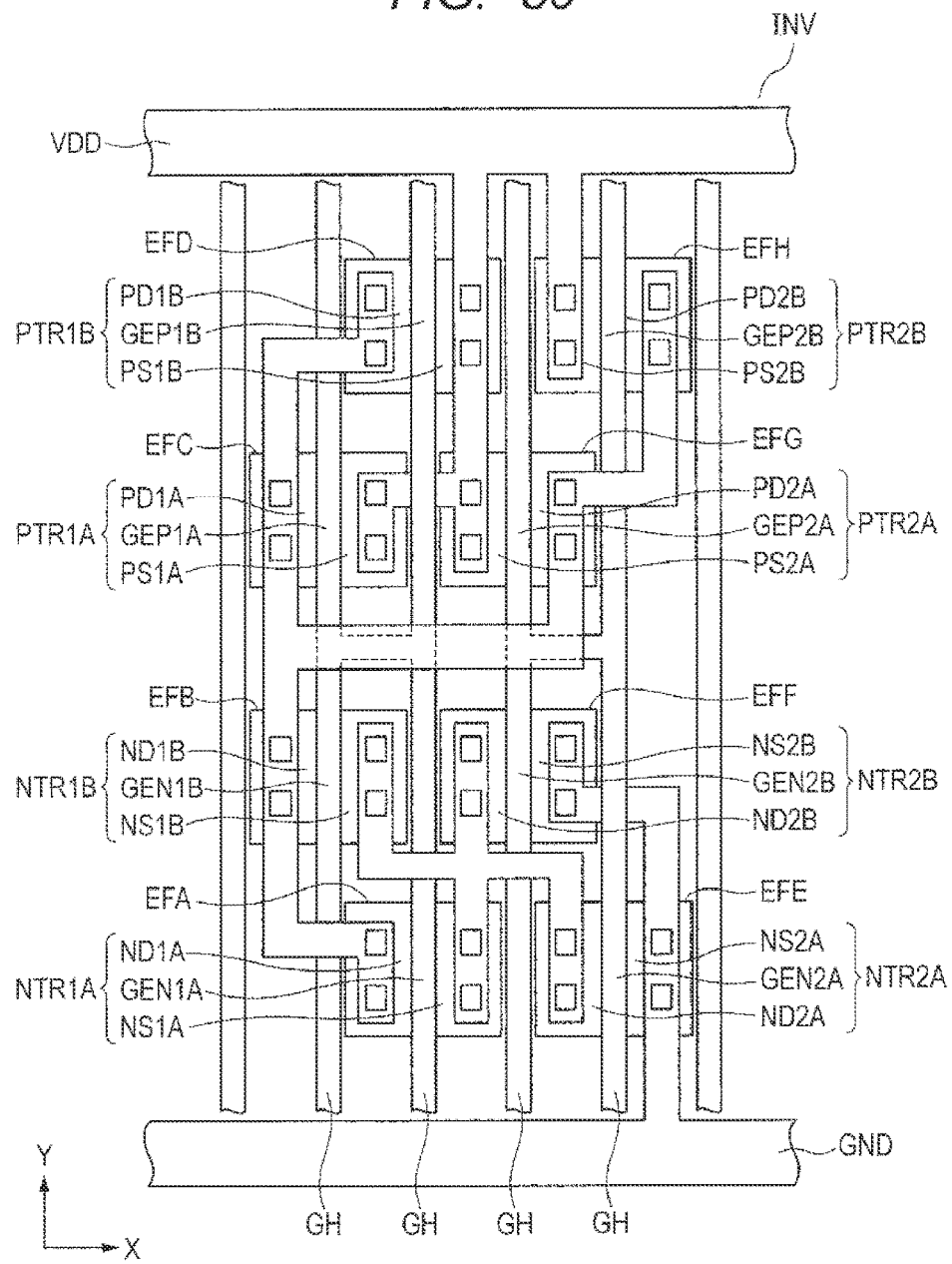
FIG. 59 is a plan diagram showing the semiconductor device according to a fourth example in the same embodiment.

As shown in FIG. 59, in the semiconductor device according to the fourth example, all of source areas NS1A, NS1B, PS1A, PS1B, NS2A, NS2B, PS2A, and PS2B are formed on the (positive) side of an X direction with respect to their corresponding gate electrodes GEN1A, GEN1B, GEP1A, GEP1B, GEN2A, GEN2B, GEP2A, and GEP2B. Further, all of drain areas ND1A, ND1B, PD1A, PD1B, ND2A, ND2B, PD2A, and PD2B are formed on the (negative) side of the X direction with respect to their corresponding gate electrodes GEN1A, GEN1B, GEP1A, GEP1B, GEN2A, GEN2B, GEP2A, and GEP2B.

Incidentally, a planar structure other than the above is similar to the planar structure shown in FIG. 57 according to the third example. Further, a sectional structure (not shown) is similar to the sectional structure shown in FIGS. 47A and 47B according to the first example. Therefore, the same members are respectively given the same reference numerals, and their description will not be repeated unless otherwise required.

In the semiconductor device according to the fourth example, as with the third example, particularly, the gate electrode GEN1A, the gate electrode GEN1B, the gate electrode GEP1A, the gate electrode GEP1B, the gate electrode GEN2A, the gate electrode GEN2B, the gate electrode GEP2A, and the gate electrode GEP2B are formed by double patterning. For example, the gate electrode GEN1A, the gate electrode GEP1A, the gate electrode GEN2A, and the gate electrode GEP2A are formed based on a pattern of one mask. The gate electrode GEN1B, the gate electrode GEP1B, the gate electrode GEN2B, and the gate electrode GEP2B are formed based on a pattern of another mask.

Thus, even though the gate wirings GH including the gate electrode GEN1A, the gate electrode GEP1A, the gate electrode GEN2A, and the gate electrode GEP2A, and the gate wirings GH including the gate electrode GEN1B, the gate electrode GEP1B, the gate electrode GEN2B, and the gate electrode GEP2B are formed with being deviated in position, the source-drain diffusion capacitance, the contact-gate capacitance and the like can be estimated in the same manner as the case described in the first embodiment. Accordingly, it can be said that in the semiconductor device equipped with the inverter, according to the third example, the source-drain diffusion capacitance, the gate-contact capacitance and the like can be suppressed as compared with the semiconductor device equipped with the inverter in which the p channel type transistor and the n channel type transistor are not respectively divided.

Further, even though the gate electrodes GEN1A, GEN1B, GEP1A, GEP1B, GEN2A, GEN2B, GEP2A, and GEP2B have caused positional deviations, variations in stress received by the first element forming area EFA to the eighth element forming area EFH can be suppressed by the element isolation insulating film EL and the stress liner film LN as compared with the case where the gate electrode of the undivided transistor is deviated in position.

Thus, it is possible to uniformize the driving capabilities of the p channel type first transistor PTR1A and the p channel type second transistor PTR1B, and the driving capabilities of the n channel type first transistor NTR1A and the n channel type second transistor NTR1B. Further, it is possible to uniformize the driving capabilities of the p channel type third transistor PTR2A and the p channel type fourth transistor PTR2B, and the driving capabilities of the n channel type third transistor NTR2A and the n channel type fourth transistor NTR2B. As a result, it is possible to stabilize the operation of the inverter.

Fourth Embodiment

A description will be made here about a semiconductor device equipped with transistors each having a Fin type source-drain area. Such a transistor is referred to as a FinFET (Field Effect Transistor).

First Example

Figure 60:
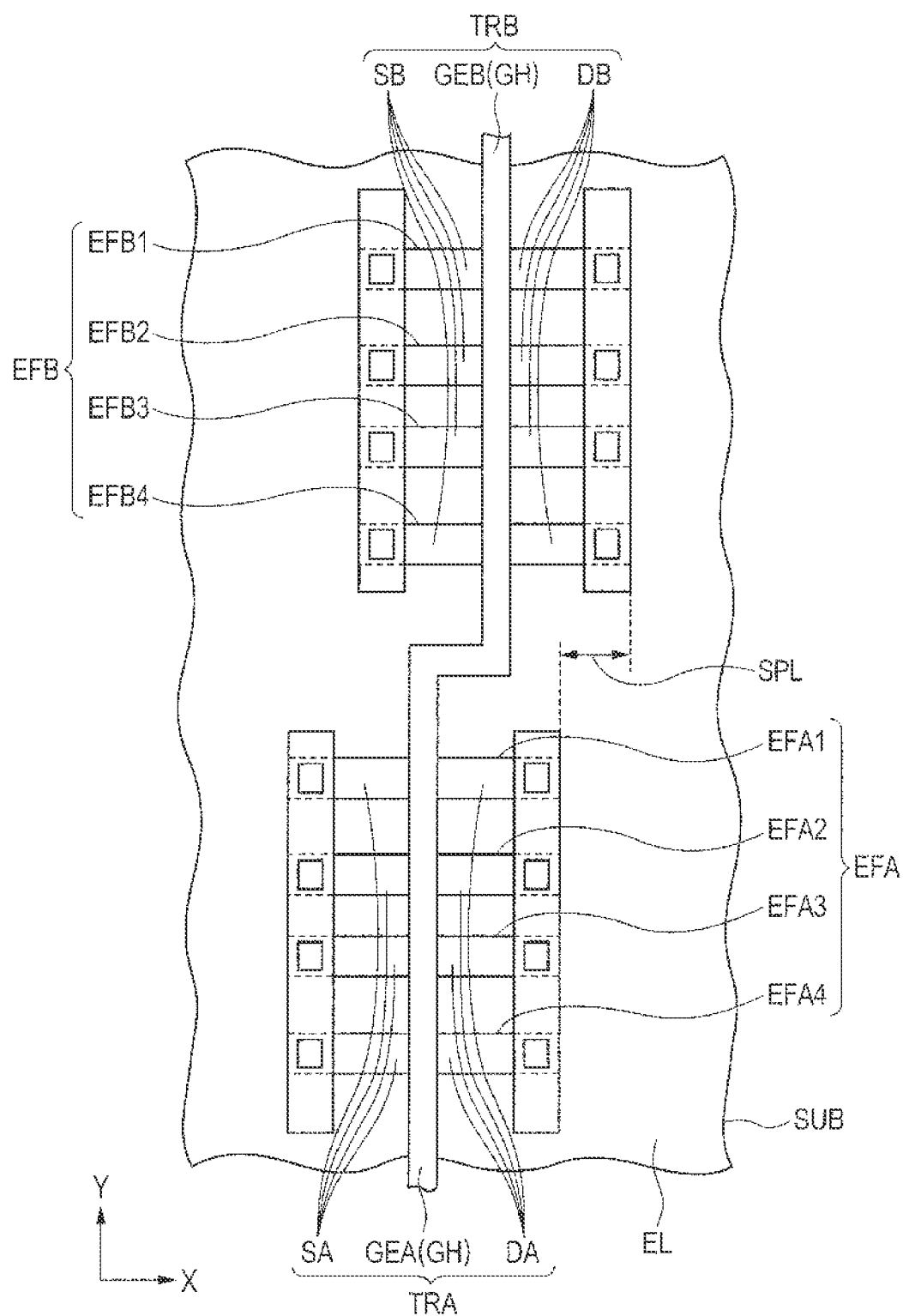
FIG. 60 is a plan diagram showing a semiconductor device according to a first example in a fourth embodiment.

A description will first be made about the semiconductor device in which the transistors TRA and TRB shown in FIG. 1 are configured as Fin type transistors. One transistor CTR (refer to FIG. 62) having a Fin type source-drain area is divided into a transistor TRA and a transistor TRB respectively having Fin type source-drain areas as shown in FIG. 60.

A first element forming area EFA and a second element forming area EFB are defined in the surface of a semiconductor substrate SUB by an element isolation insulating film EL. The first element forming area EFA is configured by a plurality of element forming area parts EFA1, EFA2, EFA3, and EFA4. The element forming area parts EFA1, EFA2, EFA3, and EFA4 respectively extend in an X direction and are arranged spaced from each other in a Y direction. The second element forming area EFB is configured by a plurality of element forming area parts EFB1, EFB2, EFB3, and EFB4. The element forming area parts EFB1, EFB2, EFB3, and EFB4 respectively extend in the X direction and are arranged spaced from each other in the Y direction.

The lengths in the X direction of the element forming area parts EFA1, EFA2, EFA3, and EFA4, and the lengths in the X direction of the element forming area parts EFB1, EFB2, EFB3, and EFB4 are respectively set to the same length. Further, the length (sum) in the Y direction of the element forming area parts EFA1, EFA2, EFA3, and EFA4, and the length (sum) in the Y direction of the element forming area parts EFB1, EFB2, EFB3, and EFB4 are respectively set to the same length.

That is, in the transistor TRA and the transistor TRB, their sizes as for the transistors are set to the same size. The element forming area parts EFA1, EFA2, EFA3, and EFA4, and the element forming area parts EFB1, EFB2, EFB3, and EFB4 are arranged deviated from each other in the X direction by a length SPL corresponding to the minimum pitch of a gate wiring.

The transistor TRA has a gate electrode GEA, and source areas SA and drain areas DA which are respectively plural. The gate electrode GEA is formed so as to cross the element forming area parts EFA1 to EFA4 (first element forming area EFA). The source areas SA are respectively formed in the element forming area parts EFA1 to EFA4 positioned on the (negative) side of the X direction with respect to the gate electrode GEA. The drain areas DA are respectively formed in the element forming area parts EFA1 to EFA4 positioned on the (positive) side of the X direction with respect to the gate electrode GEA.

The transistor TRB has a gate electrode GEB, and source areas SB and drain areas DB which are respectively plural. The gate electrode GEB is formed so as to cross the element forming area parts EFB1 to EFB4 (second element forming area EFB). The source areas SB are respectively formed in the element forming area parts EFB1 to EFB4 positioned on the (negative) side of the X direction with respect to the gate electrode GEB. The drain areas DB are respectively formed in the element forming area parts EFB1 to EFB4 positioned on the (positive) side of the X direction with respect to the gate electrode GEB. The gate electrode GEA and the gate electrode GEB are coupled to each other and form part of the gate wiring GH.

Incidentally, a planar structure other than the above is similar to the planar structure shown in FIG. 1. Further, a sectional structure (not shown) which crosses the element forming areas EFA and EFB in the X direction is similar to the sectional structures shown in FIGS. 2A and 2B. Therefore, the same members are respectively given the same reference numerals, and their description will not be repeated unless otherwise required.

A manufacturing method of the semiconductor device according to the first example is the same as the manufacturing method of the semiconductor device shown in FIG. 1 and the like with the exception that the element forming areas EFA and EFB are respectively configured by the element forming area parts EFA1 to EFA4, and EFB1 to EFB4. The gate electrode GEA and the gate electrode GEB are formed by double patterning. For example, the gate electrode GEA is formed based on a pattern of one mask, and the gate electrode GEB is formed on a pattern of another mask.

Figure 61:
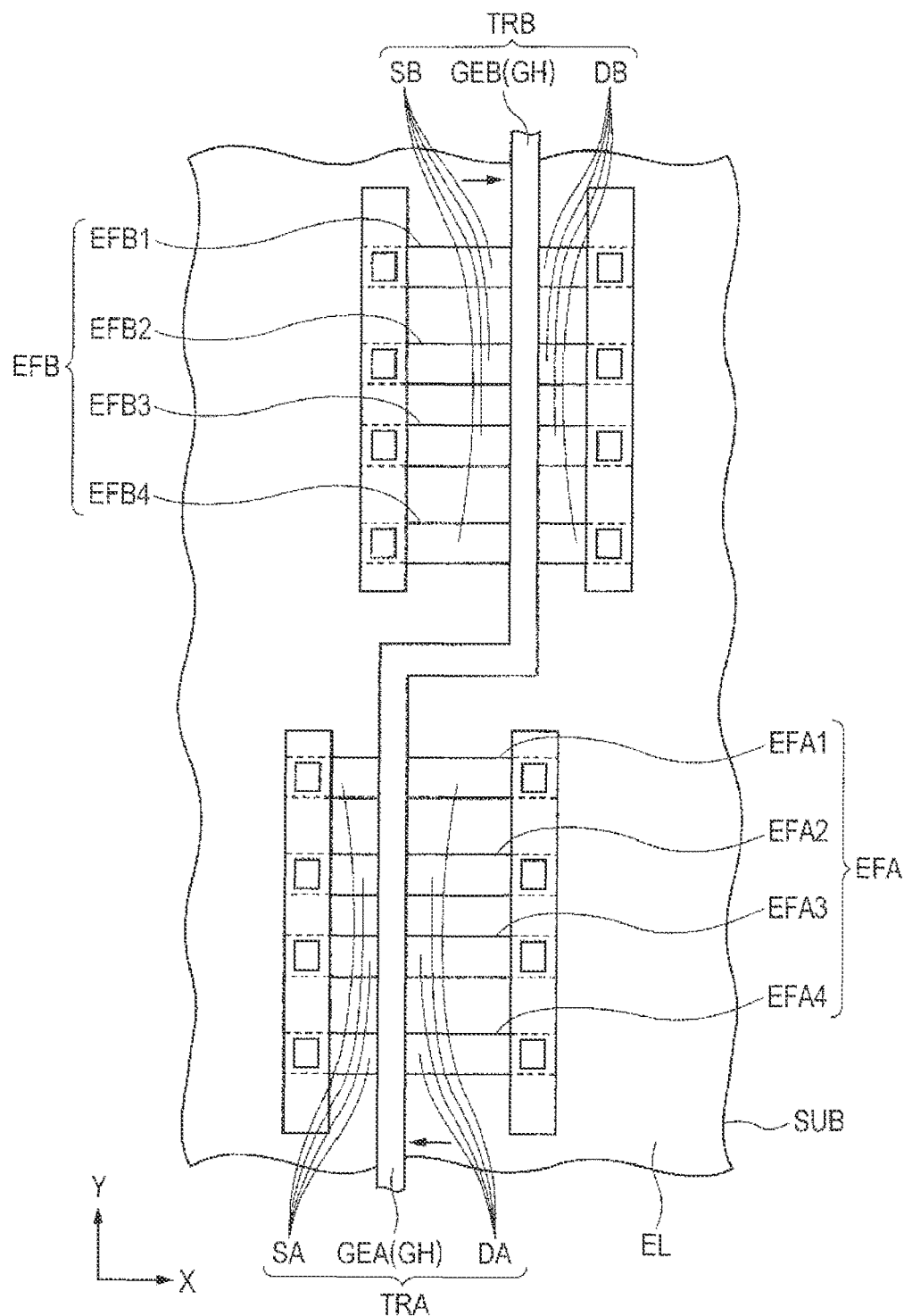
FIG. 61 is a plan diagram showing the semiconductor device according to the first example where alignment deviations occur in the same embodiment.
Figure 62:
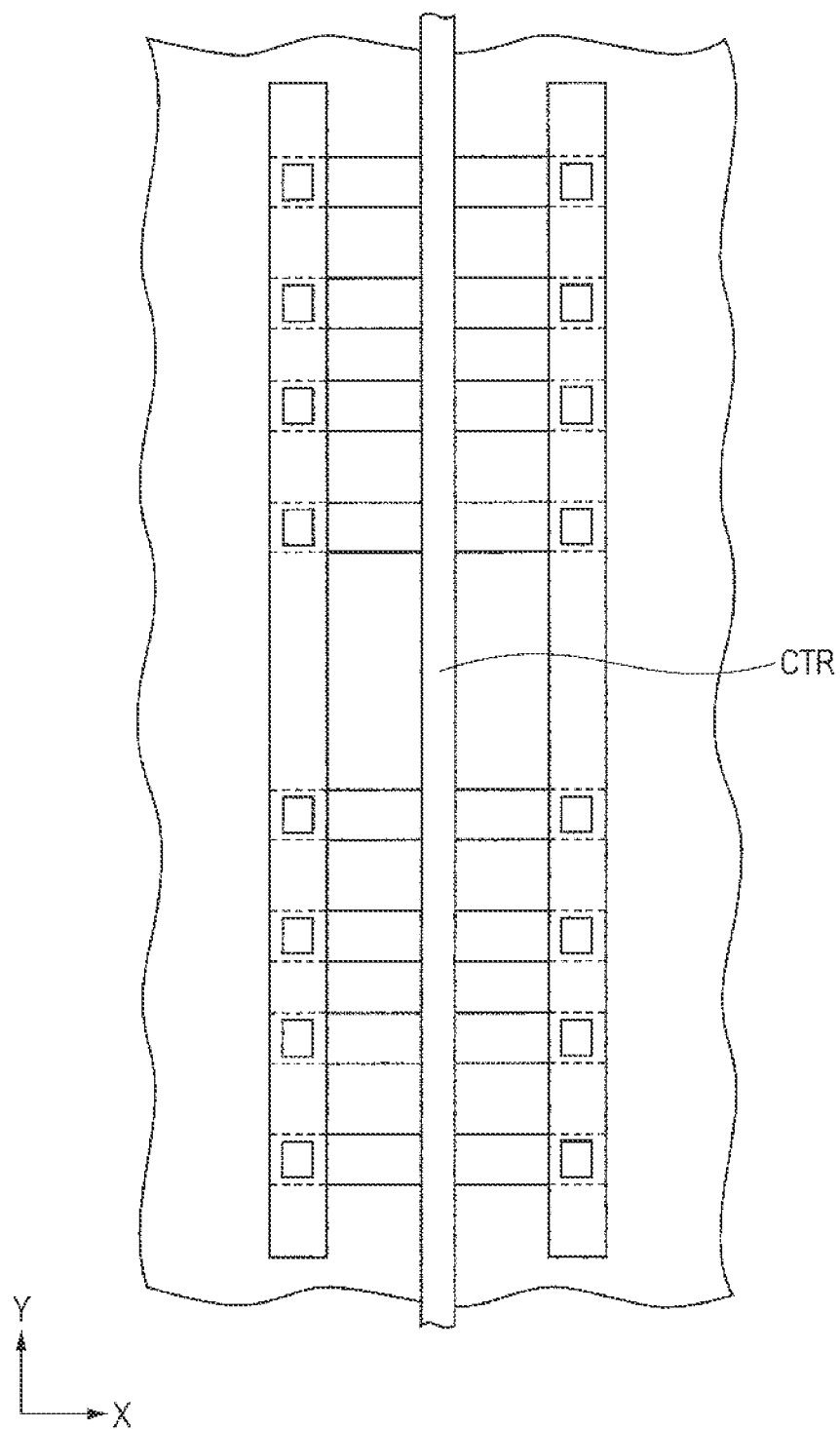
FIG. 62 is a plan diagram showing a semiconductor device according to a further comparative example.

Thus, even though, for example, the gate wiring GH including the gate electrode GEA, and the gate wiring GH including the gate electrode GEB are formed with being deviated in position as shown in FIG. 61, the source-drain diffusion capacitance, the contact-gate capacitance and the like can be estimated in the same manner as the case described in the first embodiment. Accordingly, it can be said that in the semiconductor device according to the first example, the source-drain diffusion capacitance, the gate-contact capacitance and the like can be suppressed as compared with the semiconductor device equipped with the Fin type transistor according to the further comparative example, which is shown in FIG. 62.

Second Example

A description will next be made about a semiconductor device in which the series-coupled transistors TR1A and TR1B, and TR2A and TR2B shown in FIG. 28 are configured as Fin type transistors.

Figure 63:
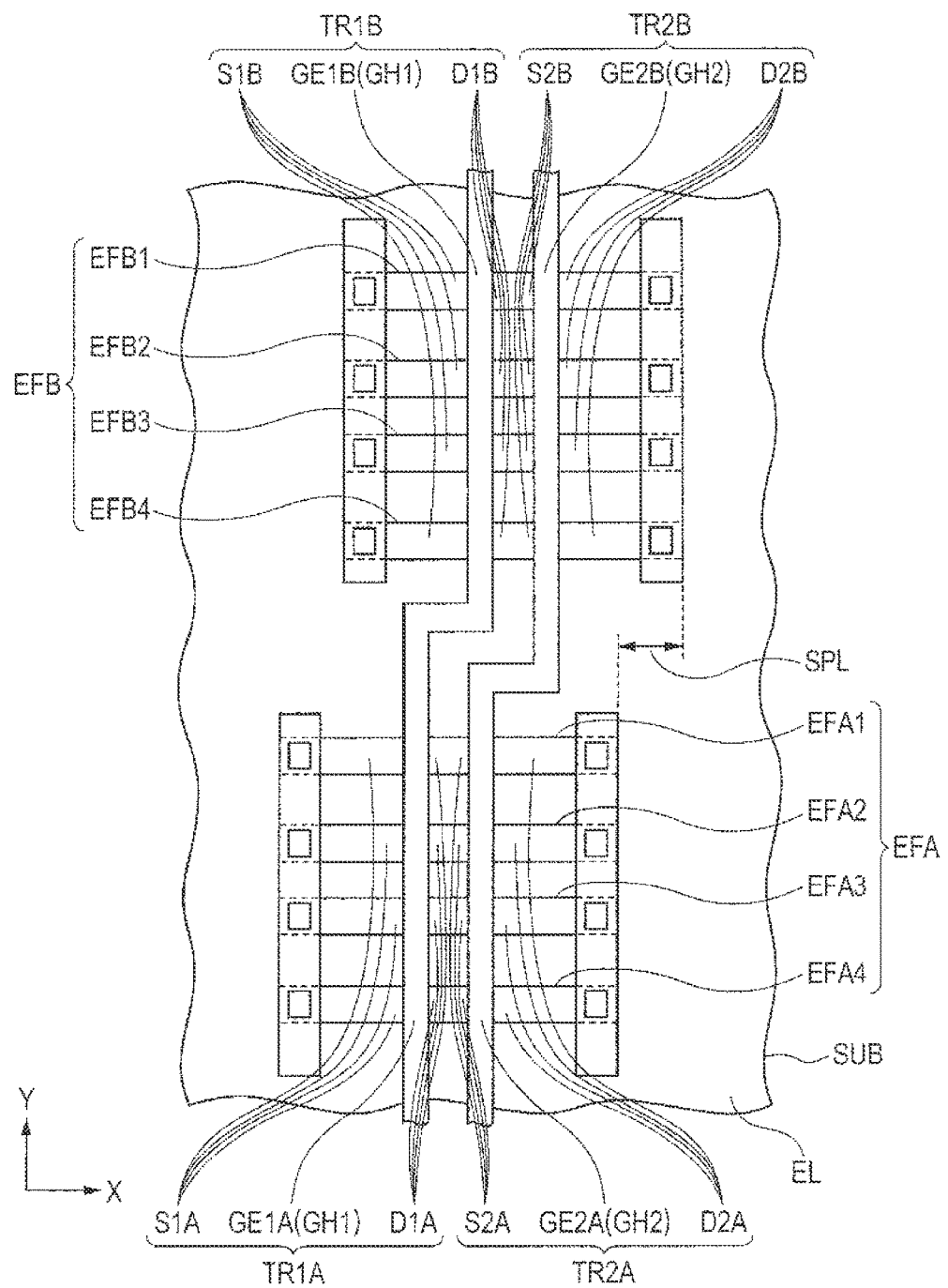
FIG. 63 is a plan diagram showing a semiconductor device according to a second example in the same embodiment.
Figure 64:
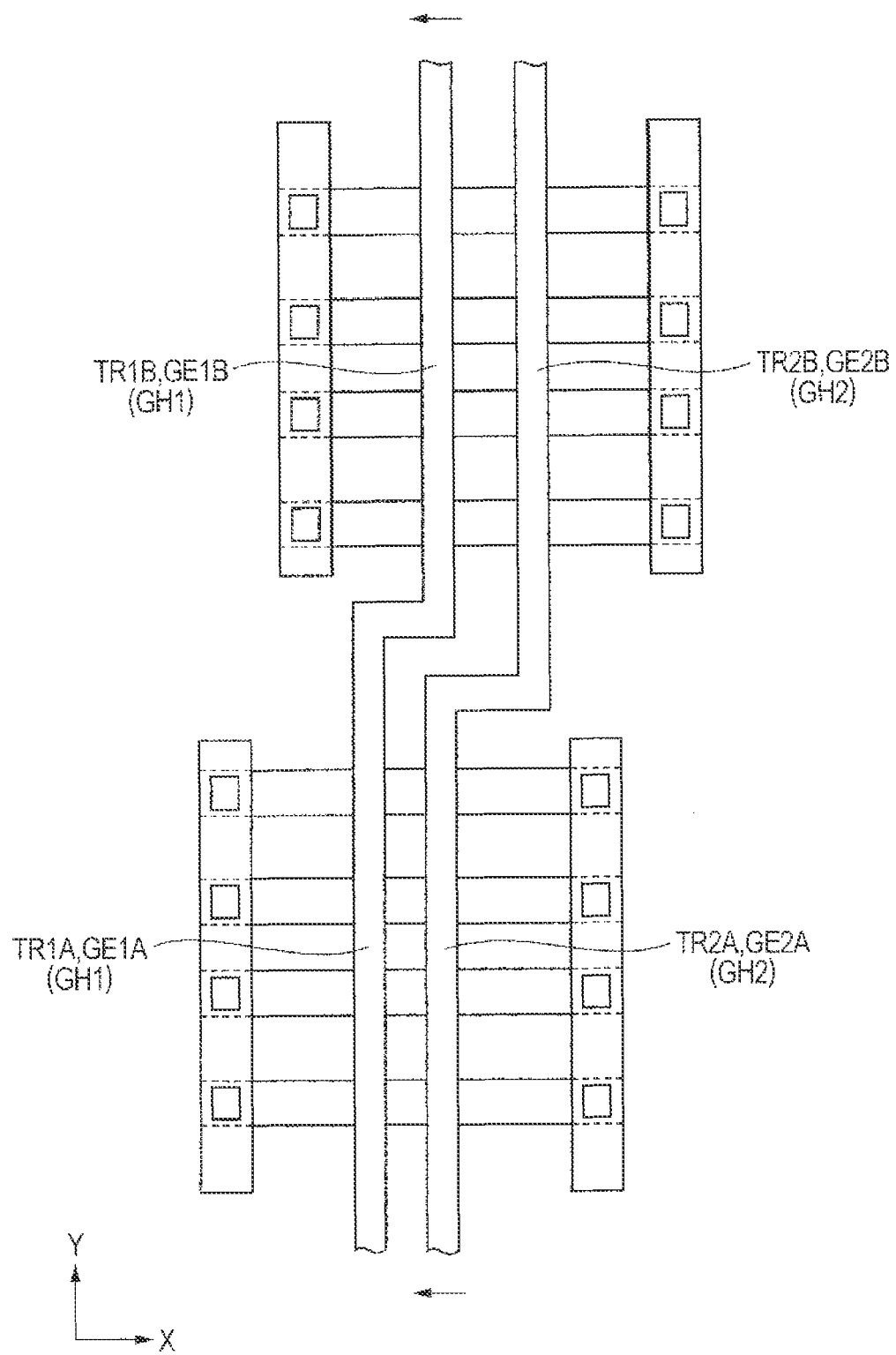
FIG. 64 is a first plan diagram showing the semiconductor device according to the second example where alignment deviations occur in the same embodiment.
Figure 65:
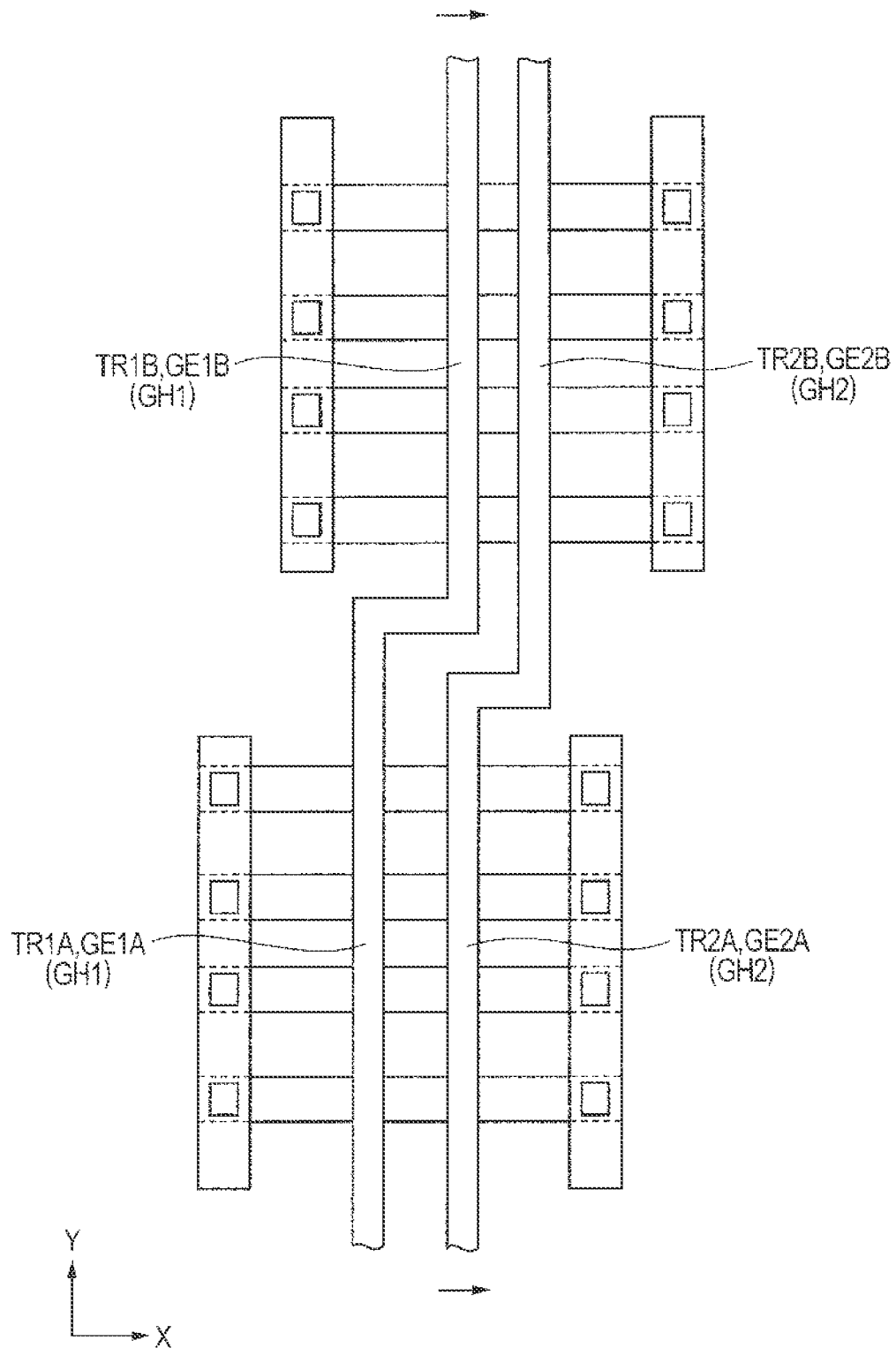
FIG. 65 is a second plan diagram showing the semiconductor device according to the second example where alignment deviations occur in the same embodiment.
Figure 66:
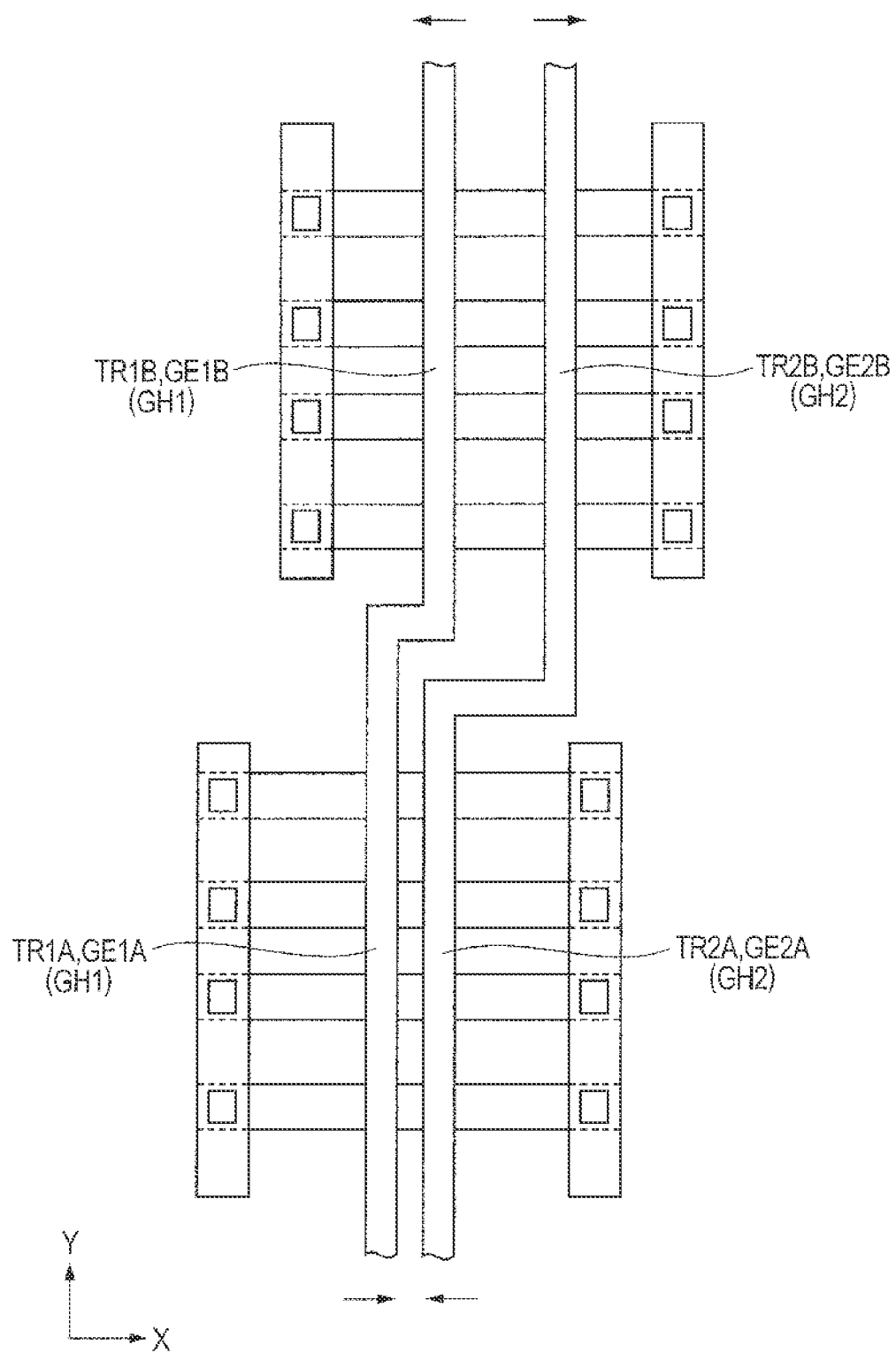
FIG. 66 is a third plan diagram showing the semiconductor device according to the second example where alignment deviations occur in the same embodiment.
Figure 67:
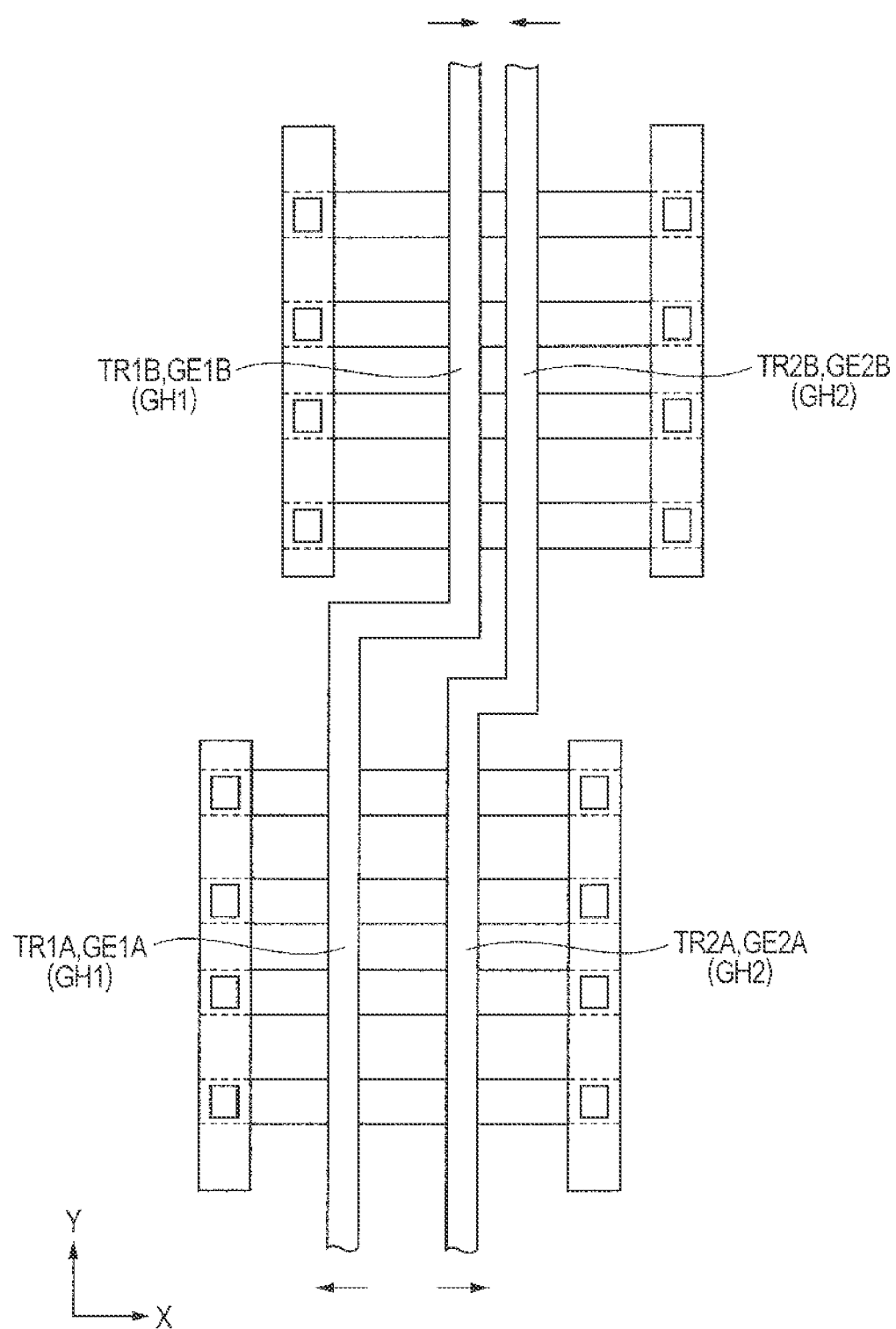
FIG. 67 is a fourth plan diagram showing the semiconductor device according to the second example where alignment deviations occur in the same embodiment.

As shown in FIG. 63, one of the series-coupled Fin type transistors is divided into a first transistor TR1A and a second transistor TR1B respectively having Fin type source-drain areas. The other thereof is divided into a first transistor TR2A and a second transistor TR2B.

The transistor TR1A has a gate electrode GE1A, and source areas S1A and drain areas D1A which are respectively plural. The gate electrode GE1A is formed so as to cross a plurality of element forming area parts EFA1 to EFA4 (first element forming area EFA). The source areas S1A are respectively formed in the element forming area parts EFA1 to EFA4 positioned on the (negative) side of an X direction with respect to the gate electrode GE1A. The drain areas D1A are respectively formed in the element forming area parts EFA1 to EFA4 positioned on the (positive) side of the X direction with respect to the gate electrode GE1A.

The transistor TR1B has a gate electrode GE1B, and source areas S1B and drain areas D1B which are respectively plural. The gate electrode GE1B is formed so as to cross a plurality of element forming area parts EFB1 to EFB4 (second element forming area EFB). The source areas S1B are respectively formed in the element forming area parts EFB1 to EFB4 positioned on the (negative) side of the X direction with respect to the gate electrode GE1B. The drain areas D1B are respectively formed in the element forming area parts EFB1 to EFB4 positioned on the (positive) side of the X direction with respect to the gate electrode GE1B.

The transistor TR2A has a gate electrode GE2A, and source areas S2A and drain areas D2A which are respectively plural. The gate electrode GE2A is formed so as to cross the element forming area parts EFA1 to EFA4 (first element forming area EFA). The source areas S2A are respectively formed in the element forming area parts EFA1 to EFA4 positioned on the (negative) side of the X direction with respect to the gate electrode GE2A. The drain areas D2A are respectively formed in the element forming area parts EFA1 to EFA4 positioned on the (positive) side of the X direction with respect to the gate electrode GE2A.

The transistor TR2B has a gate electrode GE2B, and source areas S2B and drain areas D2B which are respectively plural. The gate electrode GE2B is formed so as to cross the element forming area parts EFB1 to EFB4 (second element forming area EFB). The source areas S2B are respectively formed in the element forming area parts EFB1 to EFB4 positioned on the (negative) side of the X direction with respect to the gate electrode GE2B. The drain areas D2B are respectively formed in the element forming area parts EFB1 to EFB4 positioned on the (positive) side of the X direction with respect to the gate electrode GE2B.

The gate electrode GE1A and the gate electrode GE1B are coupled to each other and form part of a gate wiring GH1. The gate electrode GE2A and the gate electrode GE2B are coupled to each other and form part of a gate wiring GH2.

Incidentally, a planar structure other than the above is similar to the planar structure shown in FIG. 28. Further, a sectional structure (not shown) which crosses the element forming areas EFA and EFB in the X direction is similar to the sectional structure shown in FIG. 29. Therefore, the same members are respectively given the same reference numerals, and their description will not be repeated unless otherwise required.

A manufacturing method of the semiconductor device according to the second example is the same as the manufacturing method of the semiconductor device shown in FIG. 28 and the like with the exception that the element forming areas EFA and EFB are respectively configured by the element forming area parts EFA1 to EFA4, and EFB1 to EFB4. The gate electrodes GE1A, GE1B, GE2A, and GE2B are formed by double patterning. For example, the gate electrode GE1A and the gate electrode GE2B are formed based on a pattern of one mask, and the gate electrodes GE2A and GE1B are formed on a pattern of another mask.

At this time, the gate electrodes (gate wirings) may be deviated in position due to a deviation in alignment of the first mask and a deviation in alignment of the second mask. Typical examples of alignment of the gate electrodes deviated in position are respectively shown in FIGS. 64, 65, 66, and 67, following FIGS. 41 to 44.

In the semiconductor device according to the second example, one of the series-coupled Fin type transistors is divided into the first transistor TR1A and the second transistor TR1B. The other thereof is divided into the first transistor TR2A and the second transistor TR2B.

Thus, even though, for example, the gate electrodes GE1A, GE1B, GE2A, and GE2B are formed with being deviated in position as shown in FIGS. 64 to 67 respectively, the source-drain diffusion capacitance, the contact-gate capacitance and the like can be estimated in the same manner as the case described in the first embodiment. Accordingly, in the semiconductor device equipped with the Fin type transistors, according to the second example, the source-drain diffusion capacitance, the gate-contact capacitance and the like can be suppressed as with the semiconductor device equipped with the Fin type transistors, according to the first example.

Further, even though the gate electrodes GE1A, GE1B, GE2A, and GE2B have caused positional deviations, variations in stress received by the first element forming area EFA and the second element forming area EFB can be suppressed by the element isolation insulating film EL and the stress liner film LN. Thus, it is possible to make uniform the driving capabilities of the first transistor TR1A, the second transistor TR1B, the first transistor TR2A, and the second transistor TR2B.

Figure 68:
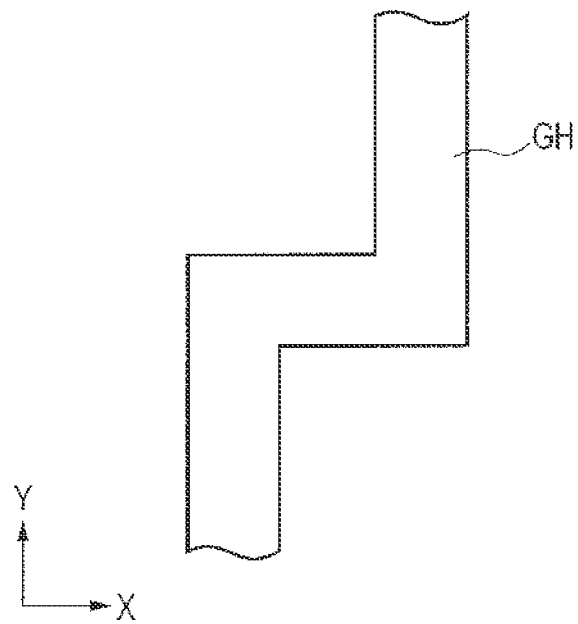
FIG. 68 is a first partially plan diagram for describing a coupling portion of gate wirings in each embodiment.

Incidentally, in each of the embodiments described above, for convenience of explanation, there is shown a structure in which as shown in FIG. 68, a gate wiring GH extending in an X direction, which is formed based on a first mask, and a gate wiring GH extending in the X direction, which is formed based on a second mask, are coupled to each other by a part which extends in a Y direction.

Figure 69:
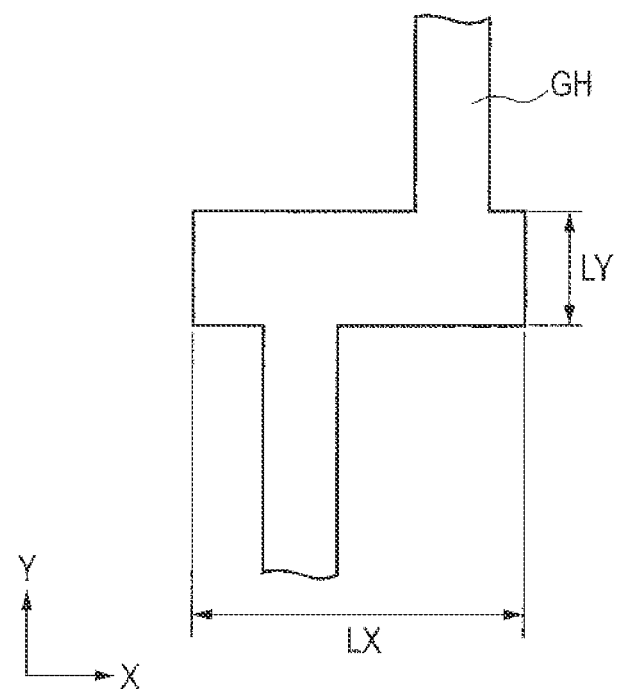
FIG. 69 is a second partially plan diagram for describing a coupling portion of gate wirings in each embodiment.

Considering the relative X-direction and Y-direction deviations in the first and second masks, a pattern (refer to FIG. 69) having a size LX in an X direction and a size LY in a Y direction may be formed in the first mask or the second mask, based on the amounts of the relative deviations thereof. By doing so, the gate wiring GH formed based on the first mask, and the gate wiring GH formed based on the second mask can reliably be coupled to each other as shown in FIG. 69.

Further, the configurations descried in the respective embodiments can be combined appropriately as needed.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device, comprising:
   a semiconductor substrate;
   an element forming area including a first element forming area and a second element forming area respectively defined in the surface of the semiconductor substrate; and
   a transistor formed in the element forming area, the transistor including a first transistor formed in the first element forming area and a second transistor formed in the second element forming area,
   the first transistor including a first gate electrode, a first source area, and a first drain area,
   the second transistor including a second gate electrode, a second source area, and a second drain area,
   the first gate electrode and the second gate electrode being electrically coupled to each other and respectively formed along a first direction, based on a minimum pitch,
   the first source area and the second source area being electrically coupled to each other,
   the first drain area and the second drain area being electrically coupled to each other,
   the first element forming area and the second element forming area being respectively set to the same size,
   the first element forming area and the second element forming area being arranged deviated from each other with a distance substantially the same as the minimum pitch in a second direction orthogonal to the first direction, and
   the first element forming area and the second element forming area are separated from each other in the first direction.

2. The semiconductor device according to claim 1,
   wherein the transistor includes a third transistor formed in the first element forming area and a fourth transistor formed in the second element forming area,
   wherein the first transistor and the third transistor are coupled in series,
   wherein the second transistor and the fourth transistor are coupled in series, and
   wherein a third gate electrode of the third transistor and a fourth gate electrode of the fourth transistor are electrically connected to each other and respectively formed along the first direction, based on the minimum pitch.

3. The semiconductor device according to claim 1,
   wherein the element forming area includes a third element forming area and a fourth element forming area,
   wherein the transistor includes a third transistor formed in the third element forming area and a fourth transistor formed in the fourth element forming area,
   wherein the third transistor includes a third gate electrode, a third source area, and a third drain area,
   wherein the fourth transistor includes a fourth gate electrode, a fourth source area, and a fourth drain area,
   wherein the third element forming area and the fourth element forming area are respectively set to the same size,
   wherein the third gate electrode and the fourth gate electrode are electrically coupled to the first gate electrode and the second gate electrode and respectively formed along the first direction, based on the minimum pitch,
   wherein the third element forming area and the fourth element forming area are arranged deviated from each other in the second direction with a distance corresponding to the minimum pitch,
   wherein the first transistor and the second transistor respectively have a first conductivity type channel,
   wherein the third transistor and the fourth transistor respectively have a second conductivity channel,
   wherein the third source area and the fourth source area are electrically coupled to each other, and
   wherein the third drain area and the fourth drain area are electrically coupled to each other.

4. The semiconductor device according to claim 3,
   wherein the first source area is formed in the second direction with respect to the first gate electrode,
   wherein the second source area is formed in a direction opposite to the second direction with respect to the second gate electrode, wherein the third source area is formed in a direction opposite to the second direction with respect to the third gate electrode, and wherein the fourth source area is formed in the second direction with respect to the fourth gate electrode.

5. The semiconductor device according to claim 3, wherein the first source area is formed in the second direction with respect to the first gate electrode, wherein the second source area is formed in the second direction with respect to the second gate electrode, wherein the third source area is formed in the second direction with respect to the third gate electrode, and wherein the fourth source area is formed in the second direction with respect to the fourth gate electrode.

6. The semiconductor device according to claim 1, wherein the first element forming area is formed by a plurality of first fins which respectively extend in the second direction and are arranged spaced from each other in the first direction, and wherein the second element forming area is formed by a plurality of second fins which respectively extend in the second direction and are arranged spaced from each other in the first direction.

7. The semiconductor device according to claim 1, wherein the minimum pitch is a minimum distance between two adjacent gate electrodes among a plurality of gate electrodes in the second direction.

8. The semiconductor device according to claim 1, wherein a deviation of the first element forming area and the second element forming area is a separation between a center of the first element forming area and a center of the second element forming area.

9. The semiconductor device according to claim 1, the first element forming area and the second element forming area do not overlap each other in the second direction.

10. A method for manufacturing a semiconductor device, comprising the steps of:

defining an element forming area including a first element forming area and a second element forming area in the surface of a semiconductor substrate; and forming a transistor in the element forming area, the transistor forming step including a step of forming a first transistor in the first element forming area and forming a second transistor in the second element forming area, the transistor forming step having a gate electrode forming step including a step of forming based on a minimum pitch by double patterning, a first gate electrode arranged in the first element forming area and extending along a first direction, and a second gate electrode arranged in the second element forming area and extending in the first direction, the step of defining the first element forming area and the second element forming area having a step of setting the first element forming area and the second element forming area to the same size and defining the first element forming area and the second element forming area so as to be deviated from each other with a distance substantially the same as the minimum pitch in a second direction orthogonal to the first direction, and the first element forming area and the second element forming area are separated from each other in the first direction.

11. The method according to claim 10, wherein the transistor forming step includes a step of forming a third transistor coupled in series with the first transistor in the first element forming area and forming a fourth transistor coupled in series with the second transistor in the second element forming area, and wherein the gate electrode forming step includes a step of forming based on the minimum pitch by the double patterning, a third gate electrode arranged in the first element forming area and extending along the first direction, and a fourth gate electrode arranged in the second element forming area and extending along the first direction.

12. The method according to claim 10, wherein the element forming area defining step includes a step of defining a third element forming area and a fourth element forming area, wherein the transistor forming step includes a step of forming a third transistor in the third element forming area and forming a fourth transistor in the fourth element forming area, wherein the gate electrode forming step includes a step of forming based on the minimum pitch by the double patterning, a third gate electrode arranged in the third element forming area and extending along the first direction, and a fourth gate electrode arranged in the fourth element forming area and extending along the first direction, wherein the step of defining the third element forming area and the fourth element forming area includes a step of setting the third element forming area and the fourth element forming area to the same size and defining the third element forming area and the fourth element forming area so as to be deviated from each other in the second direction with a distance corresponding to the minimum pitch, wherein the step of forming the first transistor and the second transistor includes a step of configuring each of the first and second transistors as a first conductivity type channel, and wherein the step of forming the third transistor and the fourth transistor includes a step of configuring each of the third transistor and the fourth transistor as a second conductivity type channel.

13. The method according to claim 10, wherein the first element forming area defining step includes a step of defining a plurality of first fins respectively extending in the second direction and being arranged spaced from each other in the first direction, and wherein the second element forming area defining step includes a step of defining a plurality of second fins respectively extending in the second direction and being arranged spaced from each other in the first direction.

* * * * *